United States Patent
Hasegawa et al.

(10) Patent No.: US 6,846,598 B2
(45) Date of Patent: Jan. 25, 2005

(54) MANUFACTURING METHOD OF PHOTOMASK AND PHOTOMASK

(75) Inventors: Norio Hasegawa, Nishitama (JP); Toshihiko Tanaka, Toyko (JP); Joji Okada, Nishitama (JP); Kazutaka Mori, Kokubunji (JP); Ko Miyazaki, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/686,723

(22) Filed: Oct. 17, 2003

(65) Prior Publication Data

US 2004/0086789 A1 May 6, 2004

Related U.S. Application Data

(62) Division of application No. 09/881,701, filed on Jun. 18, 2001, now Pat. No. 6,656,644.

(30) Foreign Application Priority Data

Jul. 7, 2000  (JP) ........................................ 2000-206729

(51) Int. Cl.[7] ................................................ G03F 9/00
(52) U.S. Cl. .......................... 430/5; 430/30; 430/296; 430/321; 356/393; 356/394
(58) Field of Search ................ 430/5, 11, 30, 430/296, 942, 321–323; 356/393, 394

(56) References Cited

U.S. PATENT DOCUMENTS

| 4,301,997 A | 11/1981 | Berry et al. |
| 4,684,971 A | 8/1987 | Payne |
| 5,019,485 A * | 5/1991 | Nakamura et al. .......... 430/296 |
| 5,376,483 A | 12/1994 | Rolfson |
| 5,378,585 A | 1/1995 | Watanabe |
| 5,389,474 A | 2/1995 | Iguchi et al. |
| 5,418,092 A | 5/1995 | Okamoto |
| 5,556,724 A | 9/1996 | Tarumoto et al. |
| 5,741,613 A | 4/1998 | Moon et al. |
| 5,871,869 A | 2/1999 | Park et al. |
| 5,948,572 A | 9/1999 | Liu et al. |
| 5,989,760 A | 11/1999 | Mangat et al. |

FOREIGN PATENT DOCUMENTS

| JP | 54-83377 | | 7/1979 |
| JP | 55-22864 | | 2/1980 |
| JP | 56-30129 | | 3/1981 |
| JP | 56-030129 | * | 3/1981 |
| JP | 59-22050 | | 2/1984 |
| JP | 59-022050 | * | 2/1984 |
| JP | 60-85525 | | 5/1985 |
| JP | 4-136854 | | 5/1992 |
| JP | 05-289307 | * | 11/1993 |
| JP | 5-289307 | | 11/1993 |
| JP | 52-289307 | | 11/1993 |

* cited by examiner

*Primary Examiner*—Mark F. Huff
*Assistant Examiner*—Kripa Sagar
(74) *Attorney, Agent, or Firm*—Antonelli, Terry, Stout & Kraus, LLP

(57) ABSTRACT

In order to shorten the time required to change or correct a mask pattern over a mask, light-shielding patterns formed of a resist film for integrated circuit pattern transfer are partly provided over a mask substrate constituting a photomask in addition to light-shielding patterns formed of a metal for the integrated circuit pattern transfer.

1 Claim, 73 Drawing Sheets

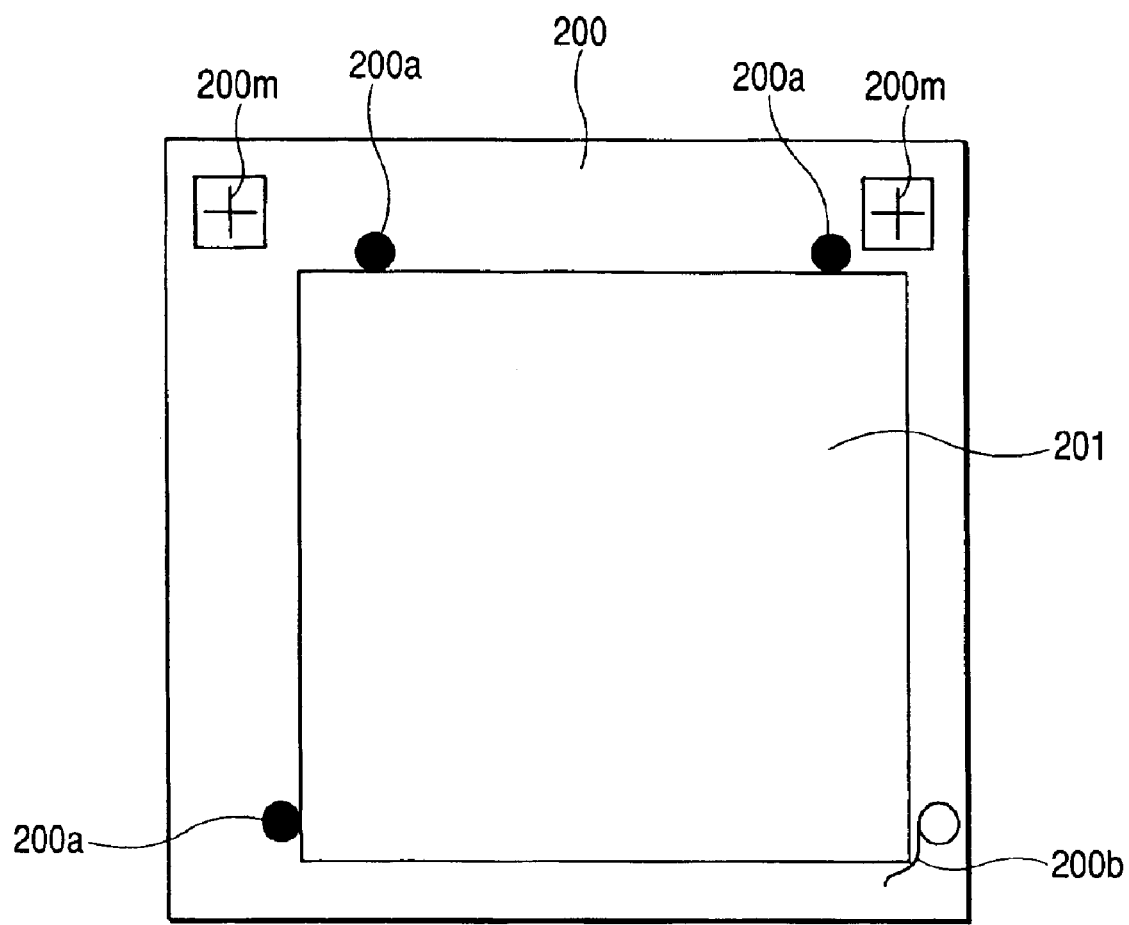

FIG. 62(a)    FIG. 62(b)    FIG. 62(c)
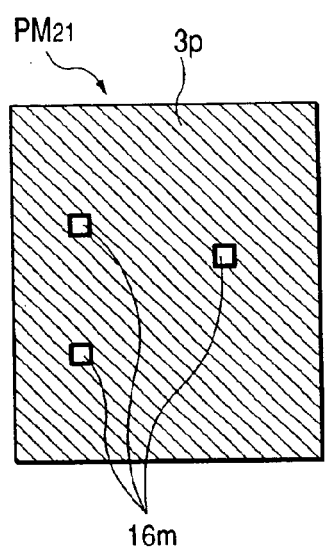
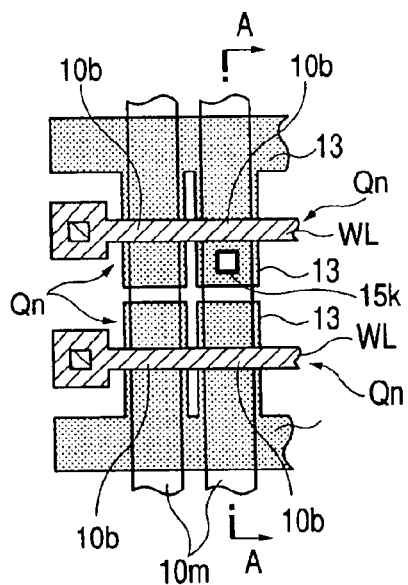
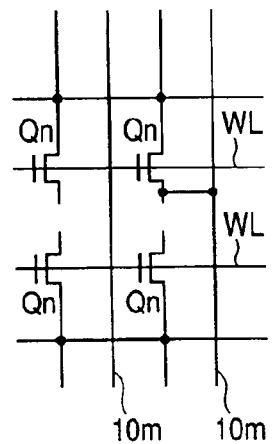
FIG. 62(d)
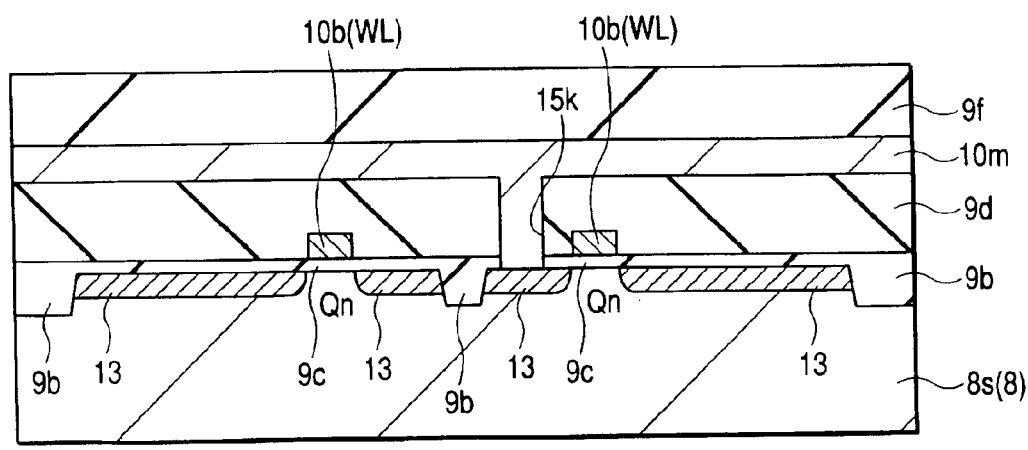

FIG. 64(a) FIG. 64(b) FIG. 64(c)
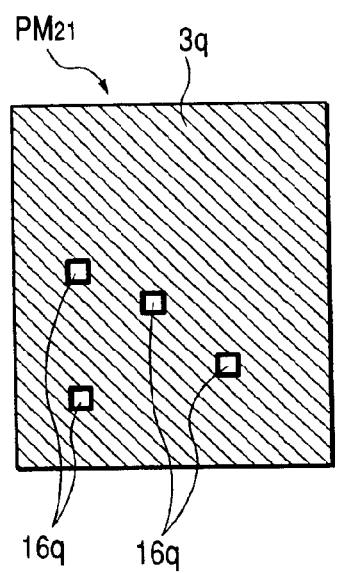
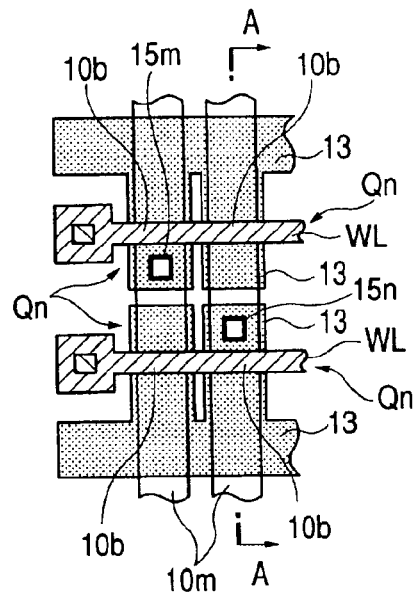
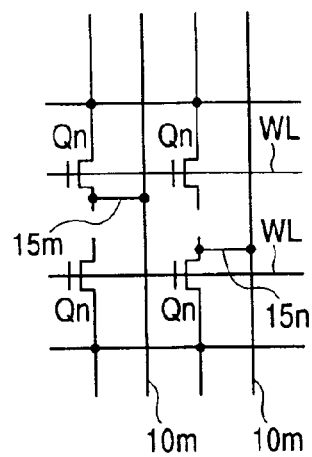
FIG. 64(d)
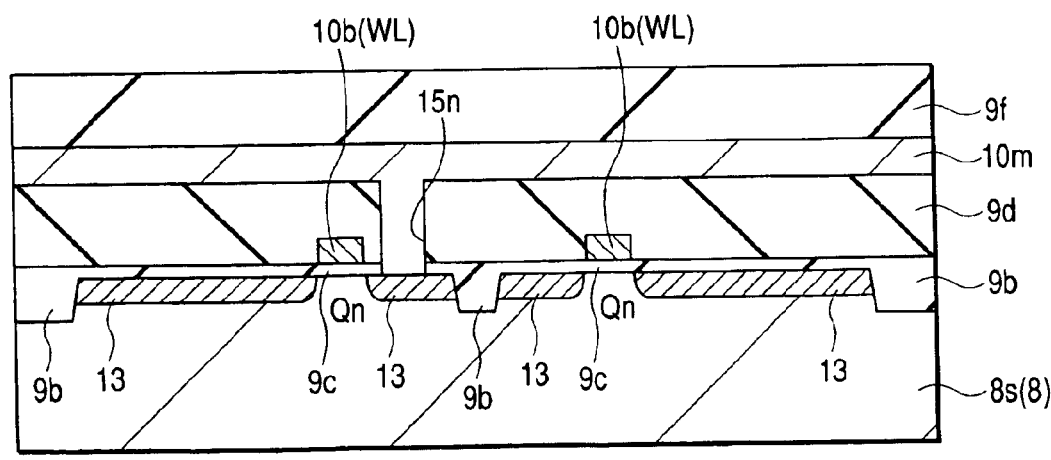

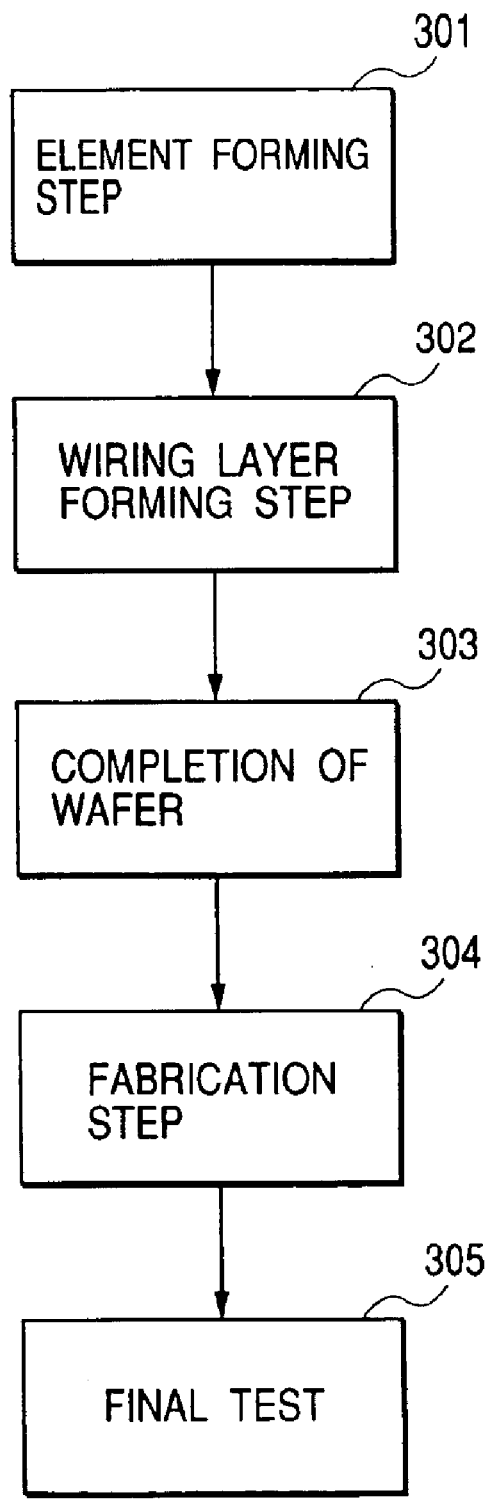

MANUFACTURING METHOD OF PHOTOMASK AND PHOTOMASK

This application is a Divisional application of Application Ser. No. 09/881,701, filed Jun. 18, 2001 now U.S. Pat. No. 6,656,644, the contents of which are incorporated herein by reference in their entirety.

BACKGROUND OF THE INVENTION

The present invention relates to a method of manufacturing a photomask and a photomask technology, and particularly to a technology effective for application to a lithography technology.

A lithography technology is used as a method of transferring minute or micro patterns onto a semiconductor wafer upon manufacture of a semiconductor integrated circuit device, for example. In the lithography technology, a projection exposure apparatus or system is principally used and patterns for a photomask (hereinafter called simply a "mask") mounted to the projection exposure system are transferred onto a semiconductor wafer (hereinafter called simply a "wafer") to form device patterns.

A mask pattern placed over a normal mask discussed by the present inventors is formed by pattern-processing a light-shielding film such as chromium (Cr) or the like, which is formed over a transparent quartz substrate. The pattern-processing of the light-shielding film is as follows, for example. An electron-beam sensitive resist is applied onto the light-shielding film, and desired patterns are drawn over the electron-beam sensitive resist by an electron beam drawing apparatus, followed by formation of resist patterns each having a desired shape by development. Subsequently, the light-shielding film is pattern-processed by dry etching or wet etching with each of the resist patterns as an etching mask. Thereafter, the removal and cleaning or the like of the resist patterns are carried out in order and light-shielding patterns each having a desired shape are formed over their corresponding transparent quartz substrate.

With the objective of improving resolution of recent lithography, various mask structures have been proposed. For instance, Unexamined Patent Publication No. Hei 4(1992)-136854 discloses a technology using a halftone type phase shift mask as means for improving the resolution of a single transparent pattern. According to the technology, the periphery of the single transparent pattern is rendered semi-transparent. In other words, in a state in which a light-shielding portion of a mask is rendered semitransparent, slight light having sensitivity less than or equal to that of a photoresist, which passes through its semitransparent portion, and light transmitted through the transparent pattern are inverted in phase. Since the light transmitted through the semitransparent film is inverted in phase with respect to the light having passed through the transparent pattern used a main pattern, the phase is inverted at a boundary portion therebetween and a light intensity at the boundary portion approaches zero (0). Thus, the ratio between the intensity of the light transmitted through the transparent pattern and the intensity of the light at the pattern boundary portion relatively increases, and hence a light intensity distribution high in contrast as compared with a technology free of the use of the semitransparent film is obtained. The halftone type phase shift mask is one obtained by changing the light-shielding film of the normal mask to a halftone phase shift film, which in turn is manufactured substantially in the same process as the manufacturing process of the normal mask.

For example, Unexamined Patent Publication No. Hei 5(1993)-289307 discloses a technology wherein a light-shielding film is formed of a resist film with the objective of simplifying a mask manufacturing process and providing high accuracy. The present method is one using the property that a normal electron-beam sensitive resist or light-sensitive resist shields a vacuum ultraviolet light having a wavelength of about 200 nm or less. According to the method, it is not necessary to use a light-shielding film etching process step and a resist removing process step. It is therefore possible to reduce the cost of the mask, improve the accuracy of its size, and decrease defects.

For example, Unexamined Patent Publication No. Sho 55(1980)-22864 describes a mask technology for lithography, which provides patterns formed by stacking a metal film and an organic substance layer on each other. A technology has been disclosed which applies an argon ion to a photoresist pattern for pattern-processing a chrome layer lying over a main surface of a glass substrate and fixedly securing the photoresist pattern to a chrome layer pattern to thereby improve the effect of shielding each exposure light.

For example, Unexamined Patent Publication No. Sho 60(1985)-85525 discloses a technology wherein a photoresist is applied onto a mask having a defect to be recovered, and thereafter a focusing charged particle beam is applied to a small region in which the mask is to be recovered on the photoresist, thereby bringing it to carbon coating to provide its opaque state.

For example, Unexamined Patent Publication Sho 54(1979)-83377 discloses a technology wherein opaque emulsion is embedded in a local defective portion of a photomask to thereby correct each pattern.

SUMMARY OF THE INVENTION

However, it has been found out by the present inventors that the mask technologies have the following problems.

Namely, the mask technologies are respectively accompanied by a problem that they cannot cope with a change or correction of a mask pattern placed over a mask quickly. There may be cases in which in a manufacturing process of a semiconductor integrated circuit device, circuit patterns are changed or corrected to implement a semiconductor chip configuration appropriate to specifications required from customers, meet customer's requests upon product development and manufacture, rewrite information stored in each memory, make characteristic adjustments or relieve a defective circuit. For example, Unexamined Patent Publication No. Sho 63(1988)-274156 describes that it is necessary to frequently change wirings for the purpose of writing information into a ROM upon manufacture of a semiconductor integrated circuit device with the ROM (Read Only Memory) built therein. However, since a mask substrate must be prepared for each change in design of a normal mask or for each its correction in the case of the normal mask, and a chrome film must be deposited and subjected to pattern processing, it takes time to manufacture the mask. Therefore, much time and labor are required to develop or manufacture a semiconductor integrated circuit device appropriate to specifications required from customers.

The above-described technologies, each of which forms the light-shielding patterns placed over the mask with the resist film, do not disclose a problem developed when the mask is actually used in the manufacturing process of the semiconductor integrated circuit device, a problem about the manufacture of the mask, and countermeasures thereagainst. They involve the following problems, for example.

The first is a problem that it is difficult to detect predetermined patterns used in various information detection or the like, like alignment marks, pattern measurement marks or product determination marks, etc. over a mask. A mask defect inspection apparatus or exposure apparatus or system or the like being in use at present, for example, makes principal use of a halogen lamp or the like for mask alignment. Thus, when each detection mark over the mask is formed of a resist film pattern where the mask is mounted to the defect inspection apparatus or exposure system or the like, the resist film is high in optical transmittance and high contrast cannot be obtained. It is therefore difficult to detect each pattern. Therefore, a problem arises in that it is difficult to bring the mask and the defect inspection apparatus or exposure system or the like into alignment and hence satisfactory detection and exposure cannot be carried out.

The second is a problem that foreign materials are produced when the mask is mounted to the defect inspection apparatus or exposure system or the like. In the above-described technologies, the resist film over the mask is brought into direct contact with mask fixing members such as the defect inspection apparatus or exposure system or the like (fixed under vacuum, for example) where the mask is mounted to the defect inspection apparatus or exposure system or the like. Therefore, the resist film is chipped off and scraped off to thereby produce foreign materials. A problem arises in that due to the fact that the foreign materials adhere to the surface of a lens of an inspection apparatus or exposure apparatus, for example, contaminates the inside of a chamber and adhere to the surface of a semiconductor wafer, the accuracy of detection of each pattern and the accuracy of transfer thereof are brought into degradation, and failures such as a short-circuit failure in pattern and an open failure in pattern, etc. take place, thereby reducing the reliability and yields of a semiconductor integrated circuit device.

The third is a problem that when a resist film exists in a pellicle attachment portion where the pellicle is attached over a mask, the pellicle is not well attached thereto, the pellicle is apt to peel off, and foreign materials are produced upon peeling off of the pellicle.

An object of the present invention is to provide a technology capable of shortening the time required to change or correct a mask pattern placed over a mask.

Another object of the present invention is to provide a technology capable of enhancing information detection capability in a mask for causing a resist film to function as a light-shielding film.

A further object of the present invention is to provide a technology capable of restraining or preventing the occurrence of foreign materials upon an exposure process using a mask for causing a resist film to function as a light-shielding film.

The above, other objects, and novel features of the present invention will become apparent from the description of the present specification and the accompanying drawings.

Summaries of typical ones of the inventions disclosed in the present application will be described in brief as follows:

The present invention has a step of forming light-shielding patterns formed of a resist film for integrated circuit pattern transfer over part of a mask substrate.

The present invention also has steps of forming light-shielding patterns formed of a metal for integrated circuit pattern transfer over a mask substrate, and forming light-shielding patterns formed of a resist film for the integrated circuit pattern transfer over the mask substrate.

Further, the present invention is one wherein light-shielding patterns formed of a metal are formed over a peripheral portion of a main surface of the mask substrate upon forming the light-shielding patterns formed of the metal for the integrated circuit pattern transfer.

Furthermore, the present invention is one wherein a pellicle is fixed to the light-shielding patterns formed of the metal at the peripheral portion of the main surface of the mask substrate in contact therewith.

Still further, the present invention is one wherein openings are defined in the light-shielding patterns formed of the metal at the peripheral portion of the main surface of the mask substrate.

Still further, the present invention has the steps of forming light-shielding patterns formed of a metal for integrated circuit pattern transfer over a mask substrate, and forming light-shielding patterns formed of a resist film for integrated circuit pattern transfer over the mask substrate.

Still further, the present invention has light-shielding patterns formed of a metal for integrated circuit pattern transfer and light-shielding patterns formed of a resist film for the integrated circuit pattern transfer, both of which are provided over a mask substrate.

BRIEF DESCRIPTION OF THE DRAWINGS

FIG. 2 is an explanatory view typically showing means for holding a photomask when predetermined patterns are drawn over a photomask;

FIGS. 7(a) and 7(b) show a process for manufacturing a semiconductor integrated circuit device using the photomask shown in FIG. 1, wherein FIG. 7(a) is a fragmentary plan view of a semiconductor wafer and FIG. 7(b) is a cross-sectional view taken along line A—A line of FIG. 7(a);

FIGS. 8(a) and 8(b) show a process following FIG. 7, wherein FIG. 8(a) is a fragmentary plan view of the semiconductor wafer, and FIG. 8(b) is a cross-sectional view taken along line A—A of FIG. 8(a);

FIGS. 9(a) and 9(b) show a process following FIG. 8, wherein FIG. 9(a) is a fragmentary plan view of the semiconductor wafer, and FIG. 9(b) is a cross-sectional view taken along line A—A of FIG. 9(a);

FIGS. 16(a) and 16(b) show a process following FIG. 15, wherein FIG. 16(a) is a plan view of the photomask shown in FIG. 1 in a correcting and changing process of light-shielding patterns formed of a resist film, and FIG. 16(b) is a cross-sectional view taken along line A—A of FIG. 16(a);

FIG. 62(a) is a fragmentary plan view of a photomask which shows a still further embodiment of the present invention and is used when a contact hole pattern for writing data into the mask ROM shown in FIG. 61 is transferred onto a semiconductor wafer, FIG. 62(b) is a fragmentary plan view of the semiconductor wafer, which shows the position of the pattern transferred by the photomask shown in FIG. 62(a), FIG. 62(c) is a circuit diagram of FIG. 62(b), and FIG. 62(d) is a cross-sectional view taken along line A—A of FIG. 62(b);

FIG. 64(a) is a fragmentary plan view of a photomask which shows a still further embodiment of the present invention and is used when contact hole patterns for writing data into the mask ROM shown in FIG. 61 are transferred onto a semiconductor wafer, FIG. 64(b) is a fragmentary plan view of the semiconductor wafer, which shows the positions of the patterns transferred by the photomask shown in FIG. 64(a), FIG. 64(c) is a circuit diagram of FIG. 64(b), and FIG. 64(d) is a cross-sectional view taken along line A—A of FIG. 64(b);

FIG. 77 is a view for describing a manufacturing process of a semiconductor integrated circuit device showing a still further embodiment of the present invention;

DETAILED DESCRIPTION OF THE INVENTION

Figure 1A:
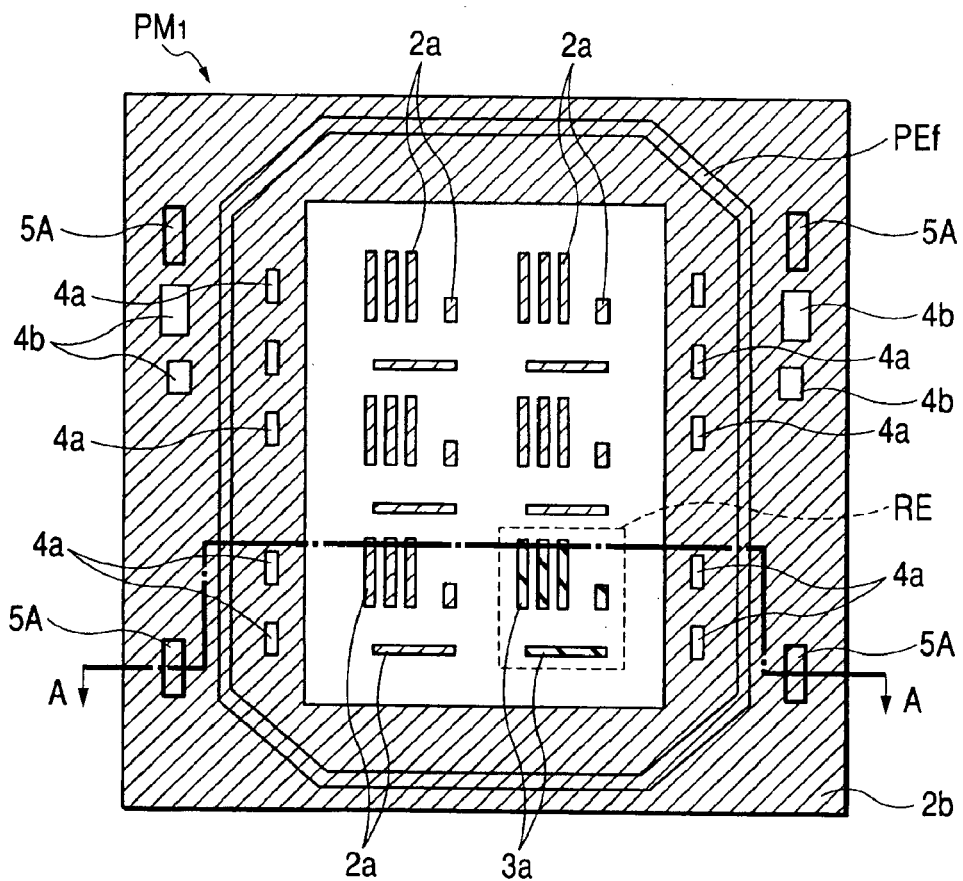
FIG. 1(a) is a plan view of a photomask showing one embodiment of the present invention.

Prior to the detailed description of the invention of the present application, the meaning of terms employed in the present application will be explained as follows:

1. Mask (Optical Mask): A mask is one in which patterns for shielding light and patterns for changing the phase thereof are formed over a substrate. It includes a reticle in which patterns each having a few times the actual size are formed. The term "over the substrate" includes a substrate's upper surface, and an inner region or upper region close to the substrate's upper surface (it may be disposed over another substrate close to the upper surface). A first principal or main surface of the mask means a surface over which the patterns for shielding the light and the patterns for changing the phase thereof are formed. A second main surface thereof means a surface located on the opposite side of the first main surface. A normal mask (binary mask) means a common mask in which mask patterns are formed over a substrate by using patterns for shielding light and patterns for causing light to pass therethrough.

2. A pattern surface of the mask is classified into the following areas or regions. They are a region "integrated circuit pattern region" in which each integrated circuit pattern to be transferred is laid out, a region "pellicle cover region" covered with a pellicle, a pellicle cover region "integrated circuit pattern peripheral region" other than the integrated circuit pattern, an external or outer region "peripheral region" uncovered with the pellicle, an inside region "peripheral internal or inner region" in which optical patterns are formed, of the peripheral region, and a portion "peripheral outer region" used for vacuum absorption or the like in other peripheral regions.

3. The term "metal" used for a mask light-shielding material indicates chrome, chromium oxide, another metal and a metal compound or the like. It generally includes those having light-shielding action, such as a simple substance containing a metal element, a compound, a complex, etc.

4. The terms "light-shielding region", "light-shielding film", and "light-shielding pattern" described herein indicate that they have optical characteristics for causing ones of 40% or less, of exposure lights applied to their regions to pass therethrough. In general, ones of from a few % to 30% or less are used. On the other hand, the terms "transparent", "transparent film", "light transmissive region" and "light transmissive pattern" described herein indicate that they include optical characteristics for causing ones of 60% or more, of exposure lights applied to their regions to pass therethrough. In general ones of 90% or more are used. The dominant conception of each of the light-shielding region, light-shielding film and light-shielding patterns formed of a metal or a resist film will be referred to as a "light-shielding portion".

5. Halftone Mask: It is a kind of phase shift mask and includes a halftone shifter in which the transmittance of a halftone film doubling as a shifter and a light-shielding film ranges from above 1% to 40% or less, and the amount of a phase shift obtained when compared with a portion free of it inverts the phase of light.

6. Levenson type phase shift mask: It is a kind of phase shift mask intended to mutually invert the phases of adjacent openings separated by light-shielding regions and thereby obtain a distinct image by interferential action thereof.

7. Normal illumination: It is non-transformational illumination and means illumination relatively uniform in light intensity distribution.

8. Transformational illumination: It is illumination lowered in illumination intensity of a central portion and includes multiple-polarity illumination such as oblique illumination, orbicular-zone illumination, quadruple-polarity illumination, quintuple-polarity illumination, or a ultra-resolution technique using a pupil filter equivalent to it.

9. Resolution: A pattern size can be standardized and represented by a Numerical Aperture NA of a projection lens and an exposure wavelength λ. Since resolution R is expressed in R=K1·λ/NA when different wavelengths and different lenses NA are used, it may be used in converted form. Since, however, a focal depth D is also represented in the form of D=K2·λ/(NA)², it differs.

10. In a semiconductor field, ultraviolet rays are classified as follows: One whose wavelength is less than about 400 nm and greater than about 50 nm, is called an ultraviolet ray, one whose wavelength is 300 nm or more, is called a near ultraviolet ray, one whose wavelength is less than 300 nm and greater than 200 nm, is called a far ultraviolet ray, and one whose wavelength is less than 200 nm, is called a vacuum ultraviolet ray. Incidentally, it is needless to say that while the principal embodiments of the present application have been described with the vacuum ultraviolet range of 200 nm or less as the center, a far ultraviolet range based on KrF excimer laser whose wavelength is less than 250 nm and greater than 200 nm, is also allowed if such changes as described in the following embodiments are made. Even in the case of a short wavelength end range of an ultraviolet ray whose wavelength is less than 100 nm and greater than 50 nm, the principle of the present invention can similarly be applied.

11. Scanning exposure: It is an exposing method of relatively continuously moving (scanning) a thin slit-like exposure zone or band in a direction orthogonal to the longitudinal direction of the slit (it may be shifted obliquely) with respect to a semiconductor wafer and a photomask (or reticle, and when the photomask is described in the present application, it indicates a wide concept including the reticle) to thereby transfer circuit patterns placed over the photomask to desired portions over the semiconductor wafer.

12. Step and scan exposure: It is a method of utilizing the scanning exposure and a stepping exposure in combination to thereby expose a portion to be exposed over a wafer over its entirety. This corresponds to the subordinate concept of the scanning exposure.

13. A semiconductor integrated circuit wafer (semiconductor integrated circuit substrate) or wafer (semiconductor substrate) indicates a silicon monocrystal substrate (which is commonly substantially plane circular), a sapphire substrate, a glass substrate, another insulating, semi-insulating or semiconductor substrate, and a combined substrate thereof.

14. A device surface is a main surface of a wafer and indicates a surface over which device patterns corresponding to a plurality of chip regions are formed by photolithography.

15. Masking layer: It is commonly called a resist film but includes an inorganic mask, a non-photosensitive organic mask, etc.

16. Transfer pattern: It is a pattern transferred onto a wafer by a mask. Described specifically, it is called a pattern placed over the wafer, which is actually formed with the above photoresist pattern and a photoresist pattern as masks.

17. Resist pattern: It is called a film pattern obtained by patterning a photosensitive organic film by a photolithography method. Incidentally, this pattern includes a mere resist film perfectly free of openings with respect to the corresponding portion.

18. Hole pattern: It is a minute or micro pattern for a contact hole, a through hole or the like having a two-dimensional size nearly equal or not greater than an exposure wavelength on a wafer. In general, it is shaped in the form of a square, a rectangle close to it, or an octagon or the like on the wafer, but often approximates a circle on the wafer.

19. Line pattern: It corresponds to a band-like pattern extending in a predetermined direction.

20. Custom circuit pattern: It corresponds to a pattern which constitutes a circuit designed and changed according to customer's requests, like a custom I/O circuit, a custom logic circuit or the like, for example.

21. Redundant circuit pattern: It corresponds to a pattern which constitutes circuits for replacing a defective or faulty circuit with a spare circuit formed in an integrated circuit.

Whenever circumstances require it for convenience in the following embodiments, they will be described by being divided into a plurality of sections or embodiments. However, unless otherwise specified in particular, they are not irrelevant to one another. One thereof has to do with modifications., details and supplementary explanations of some or all of the other.

When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is needless to say that components (including element or factor steps, etc.) employed in the following embodiments are not always essential unless otherwise specified in particular and considered to be definitely essential in principle.

Similarly, when reference is made to the shapes, positional relation and the like of the components or the like in the following embodiments, they will include ones substantially analogous or similar to their shapes or the like unless otherwise specified in particular and considered not to be definitely so in principle. This is similarly applied to the above-described numerical values and range.

As semiconductor integrated circuit devices used in the present application, ones or the like formed over other insulating substrates such as glass like TFT (Thin-Film-Transistor) and STN (Super-Twisted Nematic) liquid crystals or the like except for a case specified as being not so in particular will be included as well as over a semiconductor or an insulator substrate such as a silicon wafer, a sapphire substrate or the like.

Those each having the same function in all the drawings for describing the embodiments are respectively identified by the same reference numerals and their repetitive description will therefore be omitted.

In the drawings employed in the present embodiments, hatching might be applied to light-shielding patterns and phase-shift patterns to make it easier to see the drawings even if they are plan views.

In the present embodiments, MIS•FET (Metal Insulator Semiconductor Field Effect Transistor) typical of a field effect transistor is abbreviated as MIS, a p channel type MIS•FET is abbreviated as pMIS, and an n channel type MIS•FET is abbreviated as nMIS, respectively.

Preferred embodiments of the present invention will hereinafter be described in details with reference to the accompanying drawings.

(Embodiment 1)

Figure 1B:
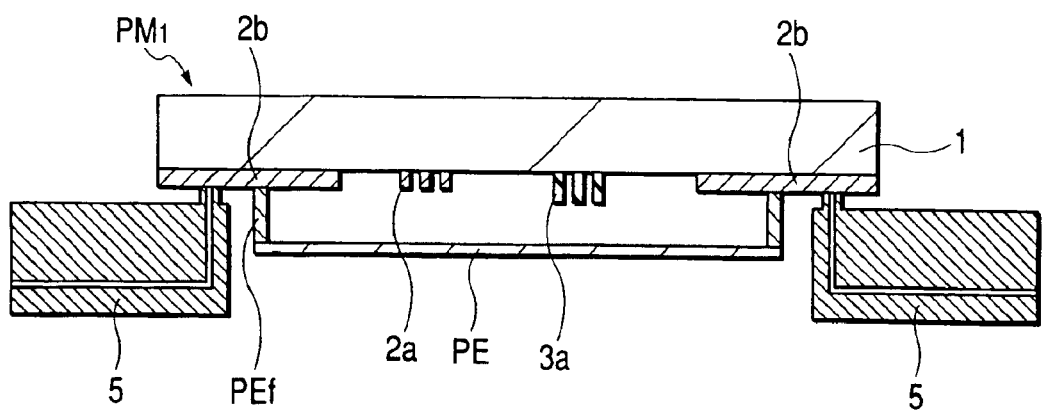
FIG. 1(b) is a cross-sectional view taken along line A—A of FIG. 1(a)

FIG. 1(a) is a plan view showing a photomask according to one embodiment of the present invention, and FIG. 1(b) is a cross-sectional view taken along line A—A of FIG. 1(a) at the time that the photomask is mounted to a predetermined apparatus.

A mask PM1 according to the present embodiment 1 is a reticle for focusing or image-forming an original of an integrated circuit pattern having a size equal to one to ten times the actual or exact size, fore example onto a wafer through a reduction projection optical system or the like. The present drawing illustrates a mask in which the periphery of a semiconductor chip serves as a light-shielding portion and line patterns are formed over the wafer by use of a positive type resist film.

A mask substrate 1 of the mask PM1 is formed of transparent composite quartz glass or the like having a thickness of 6 mm, which is shaped in the form of a plane quadrangle, for example. An optical transmissive opening region shaped in the form of a plane rectangle is formed in the center of a main surface of the mask substrate 1 and hence the main surface thereof is exposed. The present optical transmissive opening region forms the integrated circuit pattern region. In the integrated circuit pattern region, light-shielding patterns 2a and 3a for transferring the integrated circuit pattern onto the wafer are laid out over the main surface of the mask substrate 1. The present embodiment illustrates as an example the case in which the light-shielding patterns 2a and 3a are transferred onto the wafer as line patterns.

In the present embodiment, the light-shielding patterns 2a are made of a metal in a manner similar to the normal masks. However, the light-shielding patterns 3a lying within a partial region RE (corresponding to a region indicated by a broken line) in the integrated circuit pattern region are formed of a resist film. Accordingly, the light-shielding patterns 3a lying in the region RE can be removed with relative ease as will be described later. It is possible to form new or additional light-shielding patterns 3a easily and in a short time. The resist film for forming the light-shielding patterns 3a has the property of absorbing exposure light such as a KrF excimer laser light (wavelength: 248 nm), an ArF excimer laser light (wavelength: 193 nm) or an $F^2$ laser light (wavelength: 157 nm), etc. Further, the resist film has a light-shielding function approximately similar to the light-shielding patterns 2a formed of the metal. A structure of a material or the like for the resist film will be described later. Incidentally, the technology of forming the light-shielding patterns by the resist film has been described in Unexamined Patent Publication No. Hei 11(1999)-185221 (filed in Jul., 30, 1999) filed by the inventors of the present application.

In the main surface of the mask substrate 1, the outer periphery of the integrated circuit pattern region is covered with a light-shielding pattern 2b. The light-shielding pattern 2b is shaped in the form of a plane frame from the outer periphery of the integrated circuit pattern region to the outer periphery of the mask substrate 1. For example, the light-shielding pattern 2b is formed of the same metal in the same pattern processing process. The light-shielding patterns 2a and 2b are formed by depositing, for example, chromium or depositing oxide chromium over the chromium. However, the material for the light-shielding patterns 2a and 2b is not limited to it and may be changed in various ways. As the material, may be used, for example, a refractory metal like tungsten, molybdenum, tantalum or titanium or the like, nitride like tungsten nitride, high melting point silicide (compound) like tungsten silicide (WSix), molybdenum silicide (MoSix) or the like, or a film formed by stacking these on one another. In the case of the mask PM1 according to the present embodiment, since the mask substrate 1 might be cleaned and used again after the light-shielding patterns 3a formed of the resist film have been removed, a material excellent or rich in peeling resistance and abrasion resistance may preferably be used for the light-shielding patterns 2a and 2b. Since the refractory metal such as tungsten or the like is rich in oxidation resistance, abrasion resistance and peeling resistance, it is preferable as the material for the light-shielding patterns 2a and 2b.

A substantially-octagonal in-frame region indicates the pellicle cover region on the light-shielding pattern 2b. Namely, the present embodiment illustrates, as an example, a case in which a pellicle PE is bonded to the main surface of the mask substrate 1 of the mask PM1 with a pellicle attachment or stick-on frame PEf interposed therebetween. The pellicle PE is a constituent body having a transparent protection film and is provided at a predetermined distance away from the main surface of the mask substrate 1, or the main surface or back thereof in order to avoid a foreign material from adhering to the mask PM1. The predetermined distance is designed in consideration of the foreign material attached onto the surface of the protection film and the transfer of the foreign material to the wafer.

A base of the pellicle stick-on frame PEf is bonded and fixed to the light-shielding pattern 2b of the mask PM1 in a directly contact state. It is thus possible to prevent the peeling of the pellicle stick-on frame PEf. When a resist film is formed at a position where the pellicle stick-on frame PEf is attached, the resist film is peeled off when the pellicle PE is detached, this could lead to the occurrence of the foreign material. Bonding the pellicle stick-on frame PEf to the light-shielding pattern 2b in the directly contact state allows the prevention of the occurrence of such a foreign material.

In the pellicle cover region, a region excluding the integrated circuit pattern region indicates an integrated circuit pattern peripheral region. Information detecting mark patterns 4a of the mask PM1 are formed in the integrated circuit pattern peripheral region. The mark patterns 4a are patterns for detecting position information of the mask PM1 directly from the mask PM1 when predetermined patterns are drawn over the mask PM1 through the use of an electron beam drawing apparatus. Namely, when predetermined integrated circuit patters are drawn in the integrated circuit pattern region of the mask PM1 through the use of the electron beam drawing apparatus, the mark patterns 4a of the mask PM1 are read at the rate of once per several seconds and pattern drawing is done while the position to apply each electron beam for the pattern drawing is being corrected (adjusted). Thus, the accuracy of drawing position of each pattern by the electron beam drawing apparatus can be enhanced. Such mark patterns 4a are provided due to the following reasons, for example.

Namely, a drawing process for the mask is carried out in vacuum by the normal electron beam drawing apparatus. As typically shown in FIG. 2, a mask PM1 is pressed against three-point pins 200a of a mask holding portion 200 on a movable stage of the electron beam drawing apparatus, or a cassette 201 to which the mask PM1 is mounted, is pressed thereagainst and mechanically fixed by a pressure pin 200b to thereby hold the mask being in vacuum. In the normal electron beam drawing apparatus, position detecting mark patterns 200m mounted to the mask holding portion 200 with a view toward preventing shifts in pattern drawing position due to position drifts of electron beams during drawing are detected plural times during the drawing to thereby correct the position shifts. Since the mask PM1 of the mask holding portion 200 (stage) is mechanically fixed as described above, the relative relationship of position between the mark patterns 200m of the mask holding portion 200 and the mask PM1 is to be kept constant. However, there may be cases where a slight shift in position actually takes place between each mark pattern 200m and the mask PM1 due to shock of the stage moved at high speed. Therefore, even though the position of the mask PM1 is read from the mark patterns 200m during an electron beam drawing process, a position shift in each drawing pattern would occur. Consequently, position correcting mark patterns 4a are placed over the mask PM1 per se to thereby directly detect the position thereof from the mask PM1 per se. Thus, since the above correction can be carried out inclusive of the retention shift in the mask PM1, an error in the arrangement of patterns can be reduced. Such mark patterns 4a are configured according to whether, for example, the corresponding pattern positions take light transmissive regions or light-shielding regions. The detection of information is performed according to the state of reflection of a position detecting beam or detection light applied thereto. As position detecting means, may be used, one using electron beams of the electron beam drawing apparatus, one using laser light produced by a laser writer, or another system. It is desirable to apply a device high in position accuracy in particular. The mark patterns 4a can be formed upon a process for forming common light-shielding patterns in the mask manufacture and are effective even in forming upon a process for manufacturing mask blanks.

The outside of the pellicle cover region shown in FIG. 1 indicates a peripheral region. Mark patterns 4b for detecting the information of the mask PM1 are formed in the peripheral region. The mark patterns 4b are used as marks for alignment, correcting marks used for mask manufacture, etc., for example. The marks for alignment are marks used to detect the position of the mask PM1 when the photomask PM1 is mounted to a predetermined apparatus such as an inspection apparatus, an exposure apparatus or the like, to thereby perform an alignment between the mask PM1 and the inspection apparatus or exposure apparatus or the like. Further, the correcting marks are marks used upon measuring a pattern misalignment, the state of the form of each pattern or the transfer accuracy of each pattern.

The mark patterns 4b are formed by light transmissive patterns. Namely, the mark patterns 4b are formed by removing some of the light-shielding pattern 2b and exposing some of the transparent mask substrate 1 provided therebelow. Therefore, even when an aligner or exposure apparatus using a normal halogen lamp or the like is used to detect the position of the mask PM1, the contrast of light transmitted through each mark pattern 4b can sufficiently be obtained. It is therefore possible to enhance the capability of recognition by the mark pattern 4b. Thus, the relative alignment between the mask PM1 and the exposure apparatus can be performed easily and with high accuracy. According to the result of discussions by the present inventors, the alignment similar to the normal mask could be carried out. Incidentally, the mark patterns 4a and 4b are not transferred onto the wafer.

In the present embodiment, the pattern forming resist film is not formed in the peripheral region. When the resist film is formed in the peripheral region, the resist film is peeled off or scraped due to mechanical shock or the like developed when the mask PM1 is mounted to the inspection apparatus or the exposure apparatus or the like, thereby causing foreign materials. According to the present embodiment, however, since no resist film exists in the peripheral region, it is possible to prevent the peeling off and scraping or the like of the resist film and prevent a problem or the like about the occurrence of the foreign materials caused by the peeling or the like of the resist film.

Further, the mask PM1 is to be installed on the inspection apparatus or the exposure system or the like in a state in which a mounting portion 5 of the inspection apparatus or the exposure apparatus or the like is brought into direct contact with the light-shielding pattern 2b of the mask PM1. Regions 5A indicated by thick frames of FIG. 1(a) respectively indicate regions in which the mounting portions make contact therewith. Since no resist film is formed over the light-shielding pattern 2b even if the mask PM1 is mounted to the inspection apparatus or the exposure apparatus or the like, the foreign materials due to the peeling or scraping of the resist film are not produced. Since the metal that constitutes the light-shielding pattern 2b, is hard, there is no occurrence of a foreign material due to the peeling and scraping of the metal. Incidentally, one having a vacuum absorption mechanism is shown as the mounting portion 5 by way of example.

One example of a method of manufacturing the mask PM1 shown in FIG. 1 will next be explained with reference to FIGS. 3 and 4.

Figure 3A:
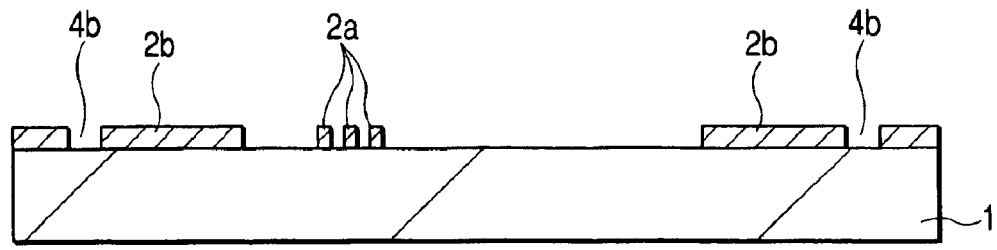
FIGS. 3(a) through 3(c) are respectively cross-sectional views of the photomask shown in FIG. 1 placed during its manufacturing process.

As shown in FIG. 3(a), a mask substrate 1 comprised of a transparent composite quartz substrate having a thickness of about 6 mm, for example, is first prepared. In this stage, light-shielding patterns 2a and 2b are already formed over a principal or main surface of the mask substrate 1 according to the same method as the normal mask. Namely, the light-shielding patterns 2a and 2b are formed by depositing a metal film high in light-blocking effect over the main surface of the mask substrate 1 by a sputtering method or the like and thereafter patterning it by photolithography technology and etching technology. As a resist film used as an etching mask upon formation of the light-shielding patterns 2a and 2b, a positive type resist film is used. This is because the area for drawing by electron beams or the like can be reduced, and a drawing time can be shortened. After the light-shielding patterns 2a and 2b have been pattern-processed, the positive type resist film is removed.

Figure 3B:
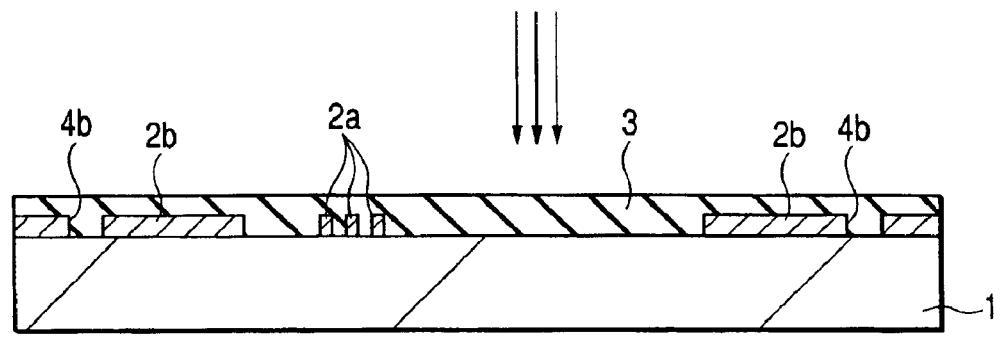

Subsequently, as shown in FIG. 3(b), a resist film 3 having the property of absorbing exposure light like a KrF excimer laser light, an ArF excimer laser light or an $F^2$ laser light or the like is applied to the entire main surface of the mask substrate 1 by a spin coating method or the like. The resist film 3 is a resist film sensitive to the electron beams. In the present example, a novolak resist film was formed with a thickness of 150 nm, for example.

Figure 3C:
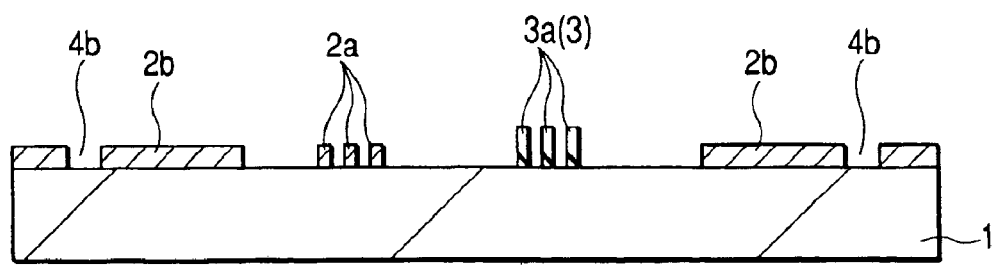

Subsequently, alignment marks are used to carry out alignment. Thereafter, as shown in FIG. 3(c), light-shielding patterns 3a comprised of the resist film 3 are formed using the same electron beam drawing method as the desired pattern forming method in the normal mask manufacturing process. Here, countermeasures against the charging of the electron beams, which will be described later, were taken. Since a peripheral portion of the mask PM1 serves as a portion brought into contact with a projection exposure apparatus or system, the resist film 3 is removed to thereby prevent the occurrence of foreign materials due to the peeling and scraping or the like of the resist film 3 by mechanical shock.

As the resist film 3, were used, for example, one with copolymer of α-methylstyrene, and α-chloroacrylic acid, a novolak resin and quinone diazide, a novolak resin and polymethylpenten-1-sulfone, chloromethylated polystyrene, etc. as principal components. A so-called chemical-amplification type resist or the like obtained by mixing a phenol resin like a polyvinyl phenol resin or the like or a novolak resin with inhibitor and an acidogenic agent can be used. The material for the resist film 3 used herein needs to have a light-shielding characteristic with respect to a light source of the projection exposure system and a characteristic having sensitivity to a light source of a pattern drawing apparatus, e.g., electron rays or beams or light having wavelength of 230 nm or more. No limitation is imposed on the material and the material can be changed in various ways. The thickness of the material is not limited to 150 nm and a thickness which satisfies the above conditions, may be used.

Figure 4:
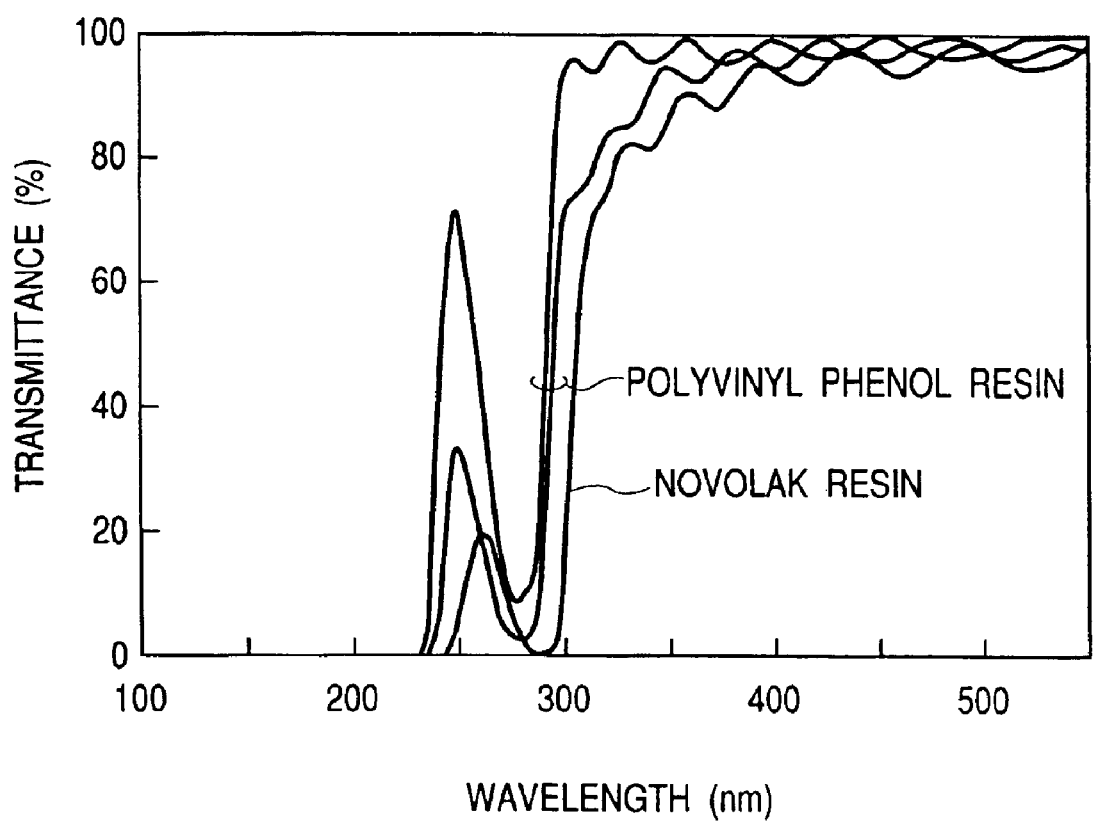
FIG. 4 is a graph illustrating spectral transmittance of a typical electron-beam resist film.

Spectral transmittance of a typical electron-beam resist film is shown in FIG. 4. When a polyphenol and novolak resin is formed with a thickness of about 100 nm, the transmittance thereof is substantially zero at wavelengths ranging from about 150 nm to about 230 nm, for example, and it has a sufficient mask effect with respect to an ArF excimer laser light having a wavelength of 193 nm, an $F^2$ laser having a wavelength of 157 nm, etc., for example. Although the present example is intended for the vacuum ultraviolet light having the wavelength of 200 nm or less, it is not limited to it. A mask material like a KrF excimer laser light having a wavelength of 248 nm, or the like needs to make use of another material or add an light absorbing material or a light-shielding material to a resist film. After the formation of the light-shielding patterns 3a formed of the resist film, the addition of a heat-treatment process and the execution of a so-called resist film hardening process for powerfully applying ultraviolet light in advance with a view toward improving resistance to the irradiation of exposure light are also effective.

Further, the resist film 3 was formed as a negative type resist film, for example. This is because the mask PM1 can be fabricated in Q-TAT (Quick Turn Around Time). Namely, since the leaving of the resist film outside the integrated circuit pattern region could lead to the occurrence of the foreign materials as described above, it is necessary to remove the resist film lying thereoutside. Thus, when the resist film 3 is formed as a positive type resist film, the most part of the outer periphery of the integrated circuit pattern region must also be subjected to electron beam drawing, and hence time is required. However, if the negative type resist film is used, then a region relatively small in area may be drawn within the main surface of the mask substrate 1. It is thus possible to reduce a drawing area and shorten a drawing time.

Another example of a method of manufacturing the mask PM1 shown in FIG. 1 will be explained with reference to FIGS. 5 and 6. When the above normal mask is fabricated, a metal film for the formation of light-shielding patterns is earthed upon drawing resist patterns for the light-shielding pattern formation by the electron beam drawing apparatus or the like to thereby allow prevention of the charging of electrons produced upon electron beam drawing. It is therefore unnecessary to perform a charging preventing or antistatic process. However, when the mask PM1 according to the present embodiment is fabricated, the applied electrons are trapped and charged because a mask substrate 1 and a resist film 3 are also insulators, when light-shielding patterns are formed in the resist film 3 by the electron beam drawing apparatus. This might exert a bad influence on the formation of the resist patterns (i.e., light-shielding patterns 3a). Thus, the mask PM1 is manufactured in the following manner, for example.

Figure 5A:
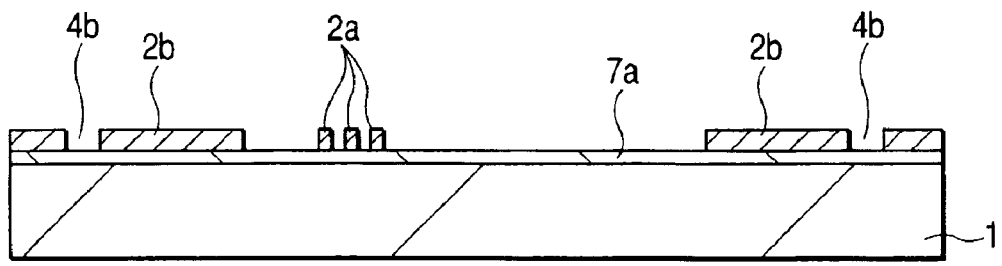
FIGS. 5(a) through 5(c) show a modification of a manufacturing process of the photomask shown in FIG. 1, and are respectively cross-sectional views of the modification placed during the manufacturing process thereof.
Figure 5B:
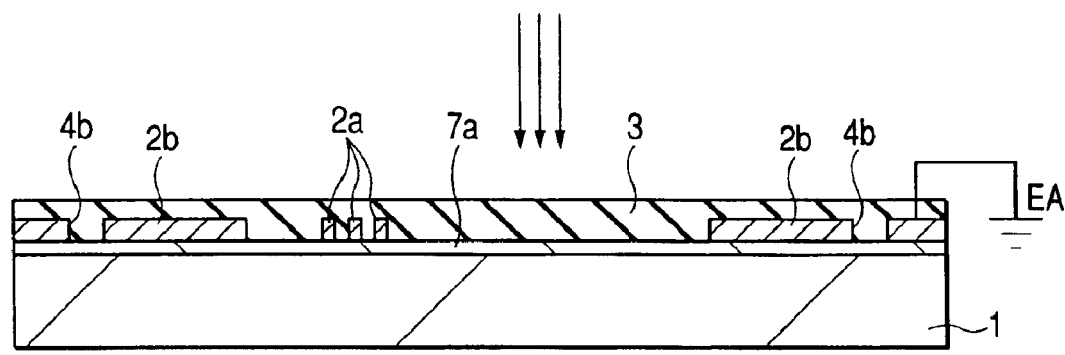
Figure 5C:
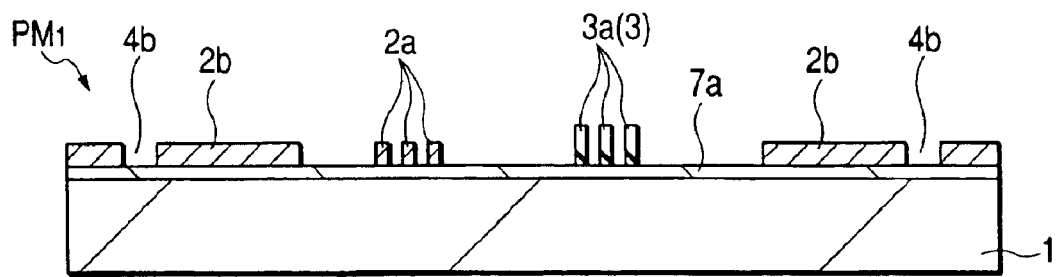

As shown in FIG. 5(a), a transparent conductive film 7a is first deposited over a main surface of a mask substrate 1. As the transparent conductive film 7a, may be used, for example, an ITO (Indium-Tin-Oxide) film. It is not necessary to process the transparent conductive film 7a. Subsequently, light-shielding patterns 2a and 2b are formed over the transparent conductive film 7a in a manner similar to the method of forming the light-shielding patterns for the normal mask as described above. Subsequently, as shown in FIG. 5(b), the resist film 3 is applied onto the transparent conductive film 7a in a manner similar to the embodiment 1. The transparent conductive film 7a is electrically connected to an earth EA. Afterwards, predetermined patterns (light-shielding patterns 3a) are drawn over the resist film 3 by means of the electron beam drawing apparatus in a manner similar to the above. Since, at this time, the electrons applied to the mask substrate 1 can be caused to escape from the earth EA through the transparent conductive film 7a, it is possible to restrain or prevent trouble such as deterioration of the shape of each resist pattern, a failure in displacement or position shift, etc. caused by the charging of the electrons. Afterwards, a mask PM1 shown in FIG. 5(c) is fabricated via development processing and cleaning processing.

Figure 6A:
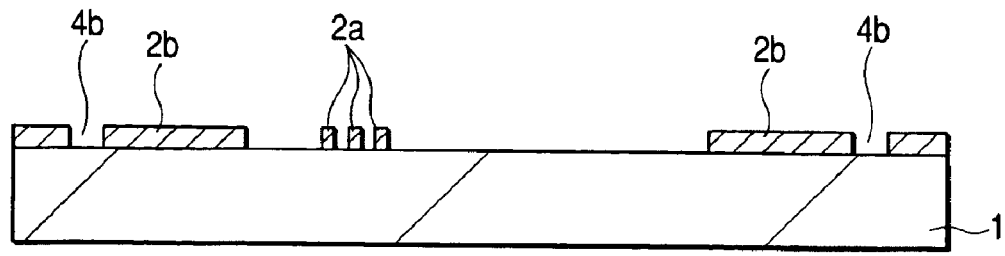
FIGS. 6(a) through 6(c) illustrate another modification of the manufacturing process of the photomask shown in FIG. 1, and are respectively cross-sectional views of the modification placed during the manufacturing process thereof.
Figure 6B:
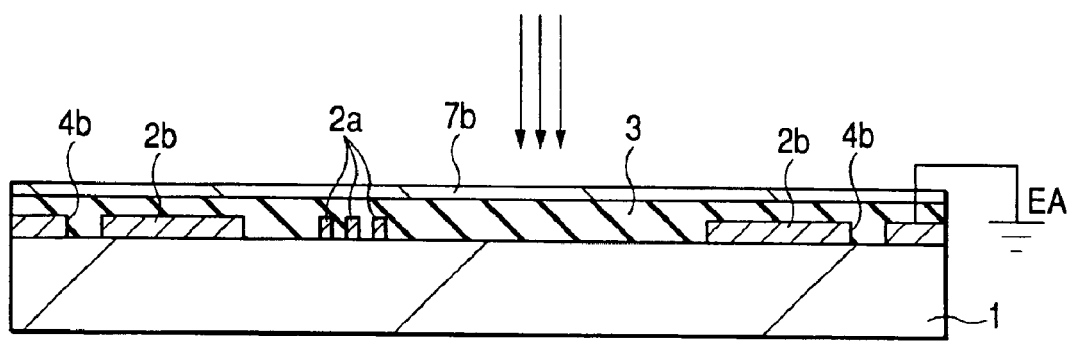
Figure 6C:
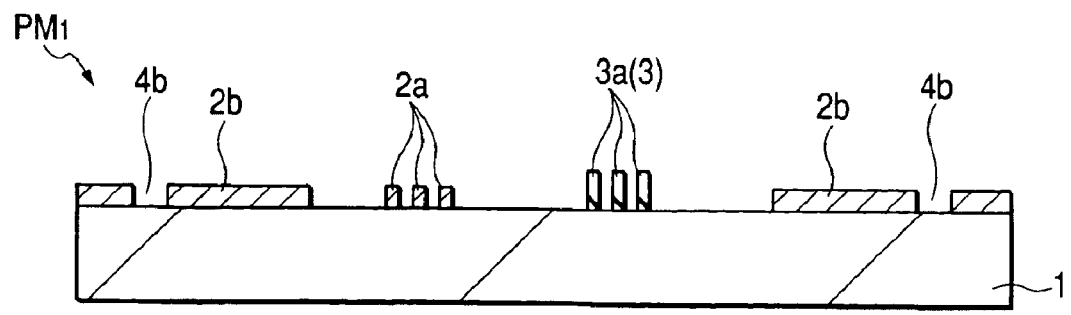

The following may be performed in terms of the same purpose as described above. As shown in FIG. 6(a), a mask substrate 1 over which light-shielding patterns 2a and 2b have already been formed, is first prepared. Thereafter, the resist film 3 is applied onto the main surface thereof as shown in FIG. 6(b). Subsequently, a water-soluble conductive organic film 7b is applied onto the resist film 3. As the water-soluble conductive organic film 7b, was used, for example, Espacer (manufactured by Showa Denko K.K.), Aquasave (manufactured by Mitsubishi Rayon Co., Ltd.) or the like. Afterwards, an electron beam drawing process for the pattern drawing was done in a state in which the water-soluble conductive organic film 7b and the earth EA are in an electrically-connected state. Thereafter, the water-soluble conductive organic film 7b was also removed upon development processing of the resist film 3. The above method makes it possible to prevent the charging of electron beams and trouble such as an abnormal condition of a pattern shape, a shift in pattern position, etc. A mask PM1 shown in FIG. 6(c) is fabricated in this way.

The holding of each pattern surface in an inert gas atmosphere of nitrogen ($N^2$) or the like is also effective for such a mask PM1 with the objective of preventing the oxidization of the light-shielding patterns 3a comprised of the resist film. The pattern drawing for the resist film used for forming the light-shielding patterns 3a is not limited to the above electron beam drawing method. For example, the drawing of each pattern, and the like may be performed through the use of an ultraviolet ray (e.g., i ray (whose wavelength: 365 nm)) of 230 nm or more, for example. Incidentally, the intent or spirit of the present invention aims to directly use the resist film as the mask (light-shielding pattern) and is to provide a structure of a practical mask. Accordingly, others may be used for the wavelengths to be light-shielded, the resist material and the mask substrate material.

Figure 7A:
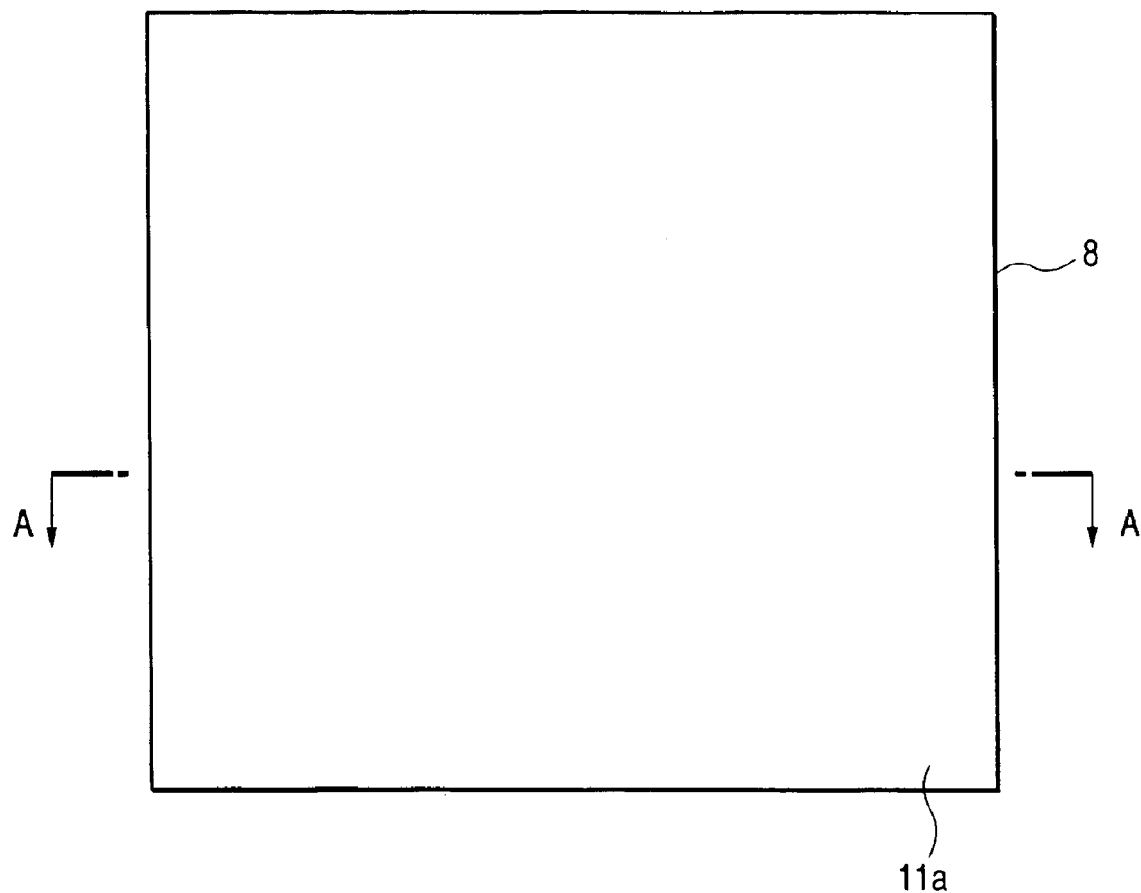
Figure 7B:
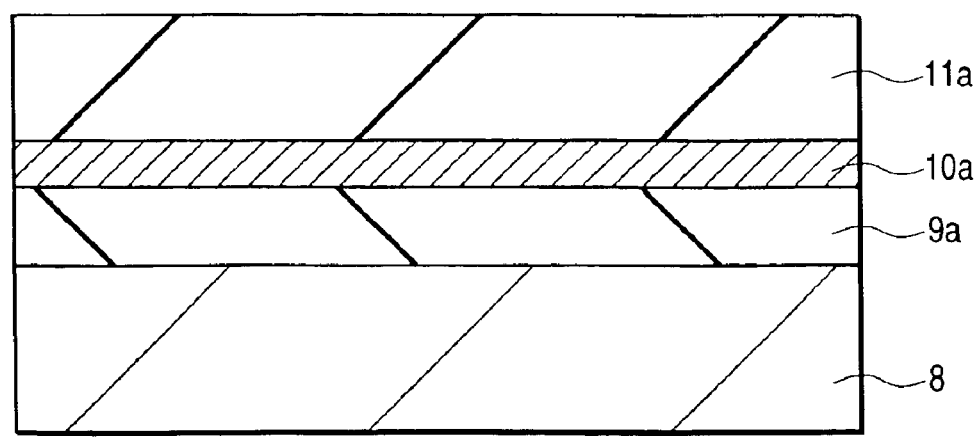

The patterns were transferred onto a wafer 8 shown in FIG. 7 by a reduction projection exposure apparatus or system using the mask PM1. FIG. 7(a) is a fragmentary plan view of the wafer 8, and FIG. 7(b) is a cross-sectional view taken along line A—A of FIG. 7(a), respectively. The wafer 8, which serves as a projected substrate, is comprised of, for example, silicon monocrystal. An insulating film 9a is deposited over its main surface. A conductive film 10a is deposited over the whole surface of the insulating film 9a. Further, a normal positive type resist film 11a photosensitive to ArF is deposited over the conductive film 10a with a thickness of about 300 nm, for example.

An ArF excimer laser light having a wavelength of 193 nm, for example was used as projection light of the reduction projection exposure system, for example, 0.68 was used as an numerical aperture NA of a projection lens, and for example, 0.7 was used as coherency σ of a light source. The alignment between the reduction projection exposure system and the mask PM1 was done by detecting the mark patterns 4b of the mask PM1. A helium-neon (HeNe) laser light having a wavelength of 633 nm, for example, was used for the alignment herein. Since, in this case, the contrast of light transmitted through each mark pattern 4b is sufficiently obtained, the relative alignment between the mask PM1 and the exposure system could be done with ease and high accuracy.

Figure 8A:
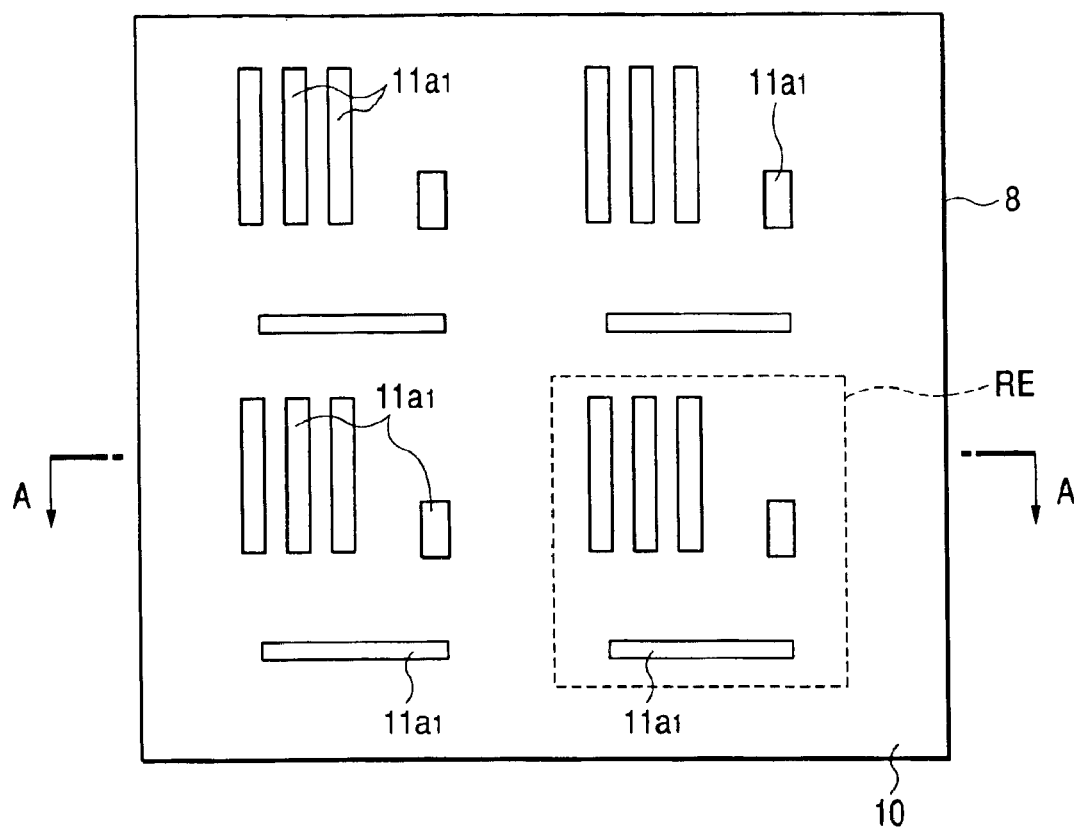
Figure 8B:
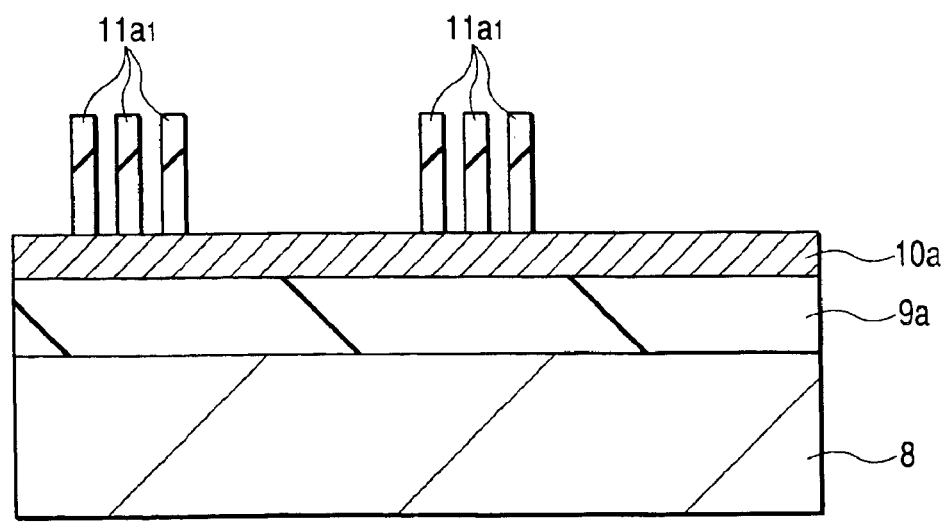
Figure 9A:
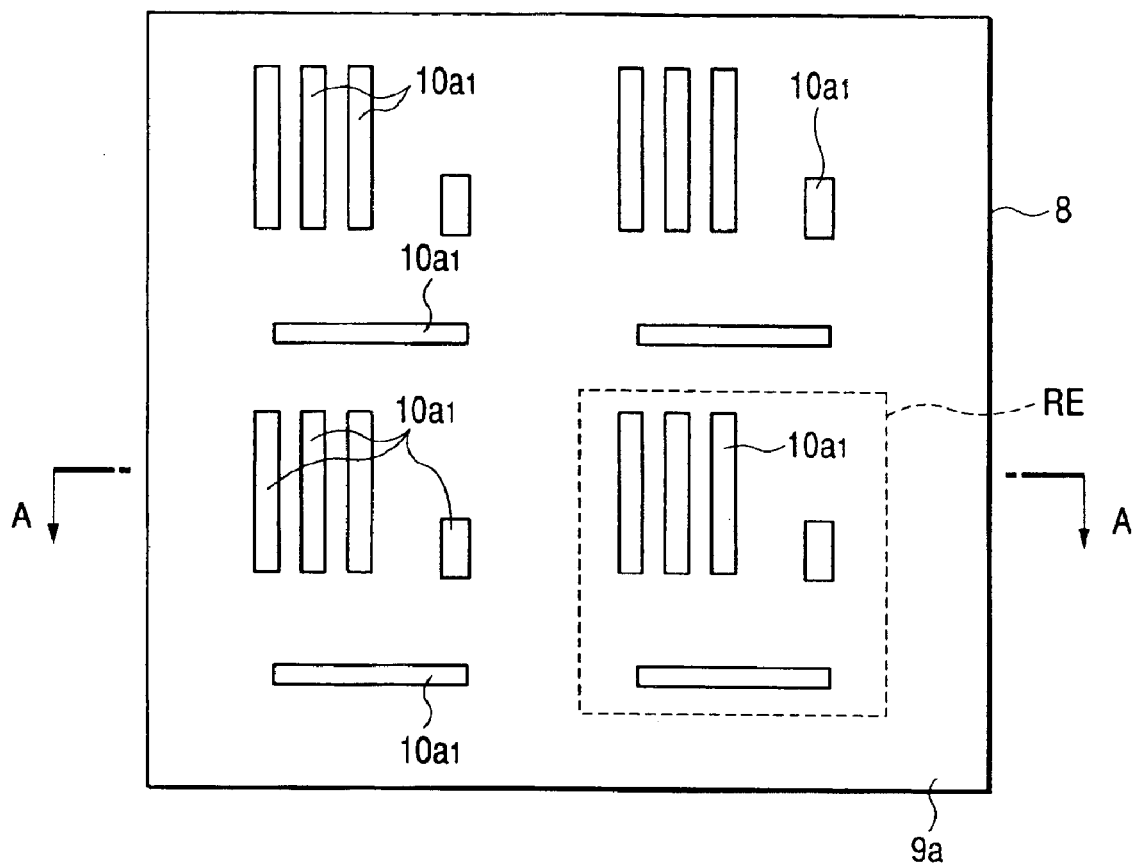
Figure 9B:
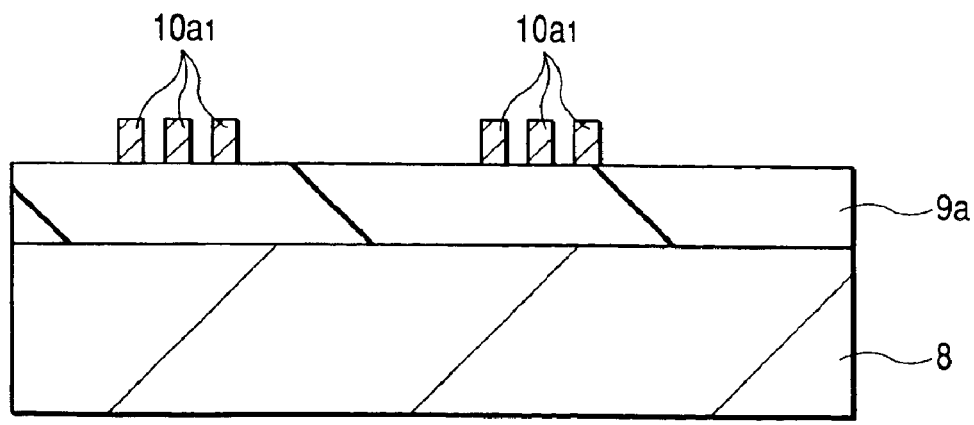

Thereafter, an integrated circuit pattern over the mask PM1 was projected onto the main surface of the wafer 8 by the normal exposing method. Further, resist patterns 11a1 shown in FIG. 8 were formed via the normal heat treatment and development process. FIG. 8(a) is a fragmentary plan view of the wafer 8, and FIG. 8(b) is a cross-sectional view taken along line A—A of FIG. 8(a). A region RE indicates a region to which light-shielding patterns 3a formed of a resist film are transferred. Afterwards, the conductive film 10a is subjected to an etching process with the resist patterns 11a1 as etching masks to thereby form conductive film patterns 10al as shown in FIG. 9. FIG. 9(a) is a fragmentary plan view of the wafer 8, and FIG. 9(b) is a cross-sectional view taken along line A—A of FIG. 9(a), respectively. As a result, a pattern transfer characteristic identical approximately to upon exposure using the normal mask was obtained. For example, a 0.19-μm line and space could be formed at a focal depth of 0.4 μm.

Figure 10:
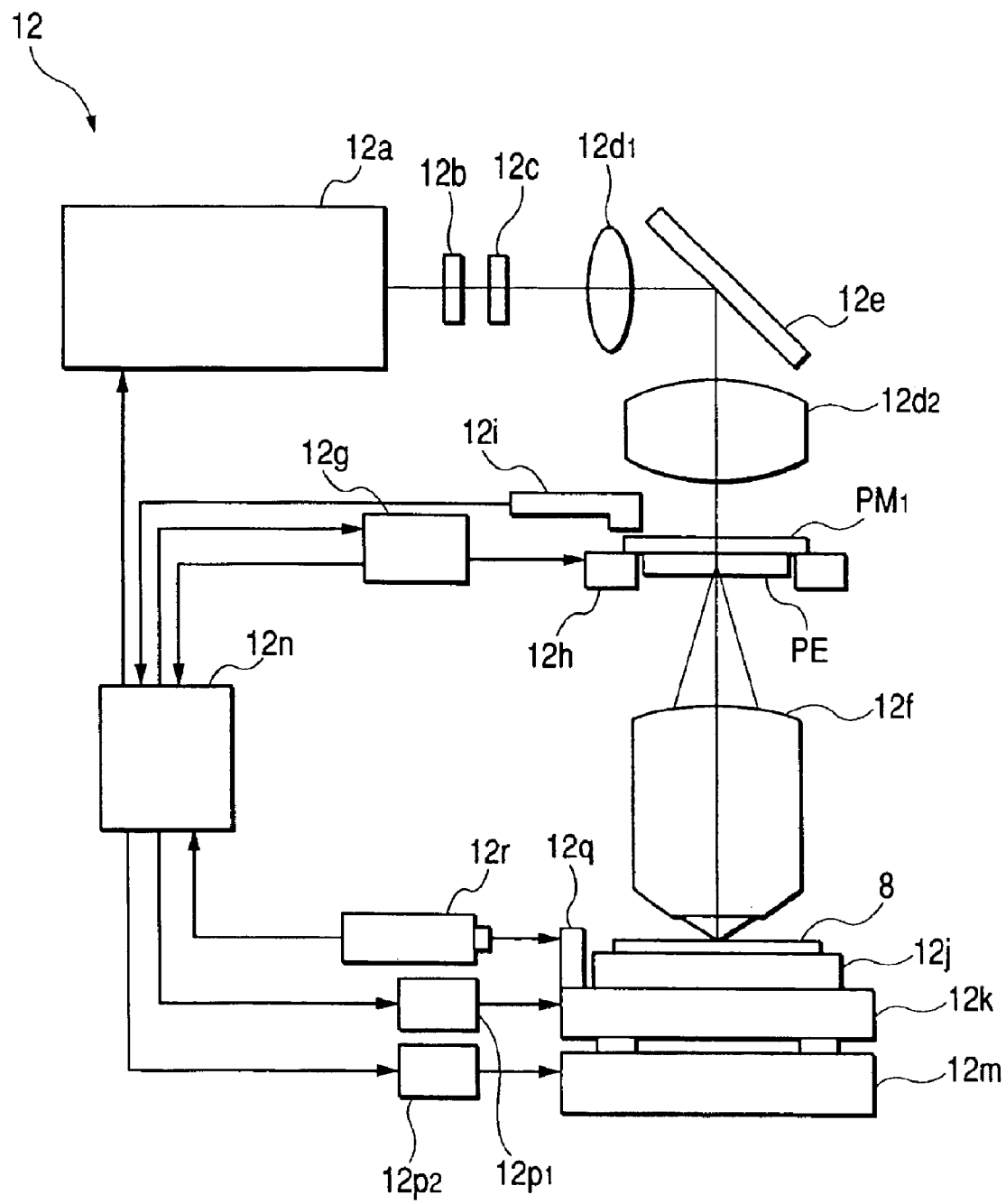
FIG. 10 is a view for describing one example of a reduction projection exposure system or apparatus employed in the present embodiment.

One example of the reduction projection exposure system used in this exposure processing is shown in FIG. 10. Exposure light emitted from a light source 12a of a reduction projection exposure system 12 is applied to a mask PM1 via a flyeye lens 12b, an illumination-shape adjustment aperture 12c, condenser lenses 12d1 and 12d2, and a mirror 12e. For example, the KrF or ArF excimer laser or the $F^2$ laser light or the like is used as an exposure light source as described above. The mask PM1 is placed over the reduction projection exposure system 12 in a state in which a main surface thereof over which light-shielding patterns 2a and 2b are formed, is directed downward (to the wafer 8 side). Accordingly, the exposure light is applied from the reverse side of the mask PM1. Thus, a mask pattern drawn over the mask PM1 is projected onto the wafer 8 corresponding to a sample substrate through a projection lens 12f. The pellicle PE is provided over the main surface of the mask PM1 as the case may be. Incidentally, the mask PM1 is vacuum-absorbed by the mounting portion 5 of a mask stage 12h controlled by mask position control means 12g and aligned with each other by position detecting means 12i. Thus, the alignment between it center and an optical axis of the projection lens 12f is done accurately.

The wafer 8 is absorbed onto a sample table 12j under vacuum. The sample table 12j is placed over a Z stage 12k movable in the direction of the optical axis of the projection lens 12f, i.e., in a Z-axis direction and further placed over an XY stage 12m. Since the Z stage 12k and the XY stage 12m are driven by their corresponding drive means 12p1 and 12p2 according to control commands delivered from a main control system 12n, they can be shifted to desired exposure positions. Their positions are accurately monitored by a laser length-measuring device 12r as positions for a mirror 12q fixed to the Z stage 12k. Further, for example, a normal halogen lamp is used as the position detecting means 12i. Namely, it is not necessary to use a specific light source for the position detecting means 12i (newly introduce a new technology and a difficult technology). The previously-known reduction projection exposure system can be used. Accordingly, the cost of a product does not increase even if such a novel mask PM1 as in the present embodiment is used. Further, the main control system 12n is electrically connected to a network apparatus and is capable of performing remote supervision or the like of the state of the reduction projection exposure system 12. As the exposing method, may be used, for example, either a step and repeat exposing method or a step and scanning exposing method.

A description will next be made of a case wherein the technical idea of the present invention is applied to a process for manufacturing a semiconductor integrated circuit device having a twin-well type CMIS (Complimentary MIS) circuit, for example, with reference to FIGS. 11 through 14.

Figure 11:
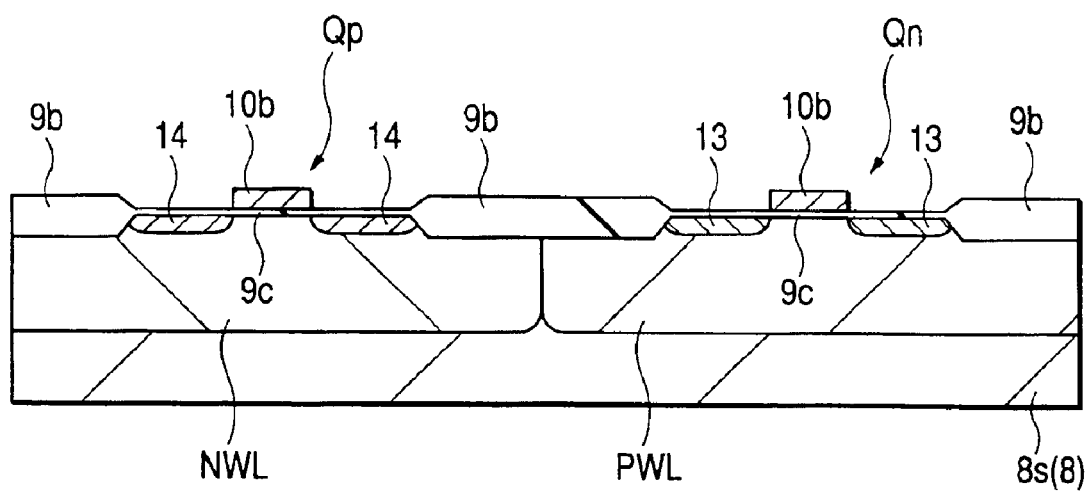
FIG. 11 is a fragmentary cross-sectional view of a specific semiconductor integrated circuit device using the photomask shown in FIG. 1, which is placed during its manufacturing process.

FIG. 11 is a fragmentary cross-sectional view of a wafer 8 during its manufacturing process. The wafer 8 comprises a plane and approximately-circular thin plate, for example. A semiconductor substrate 8s that constitutes the wafer 8, is comprised of, for example, an n-type Si monocrystal. For example, an n well NWL and a p well PWL are formed over the semiconductor substrate. For example, phosphor (P) or arsenic (As) is introduced into the n well NWL. Further, for example, boron is introduced into the p well PWL.

A field insulating film 9b for separation, which is comprised of a silicon oxide film, for example, is formed over a main surface of the semiconductor substrate 8s by a LOCOS (Local Oxidization of Silicon) method or the like. Incidentally, a separation portion may be a groove or trench type. Namely, the separation portion may be formed by embedding an insulating film in each trench dug in the direction of the thickness of the semiconductor substrate 8s. An nMISQn and a pMISQp are formed in an active region surrounded by the field insulating film 9b.

Gate insulating films 9c for the nMISQn and pMISQp are comprised of a silicon oxide film, for example, and formed by a thermal oxidation method or the like. Gate electrodes 10b of the nMISQn and pMISQp are formed by depositing a gate forming conductive film comprised of low-resistance polysilicon, for example, over the main surface of the wafer 8 by a CVD method or the like and thereafter pattern-processing the film by a photolithography technology using the reduction projection exposure system 12 and the photomask PM1 and a normal etching technology. Although not restricted in particular, a gate length is about 0.18 μm, for example.

Semiconductor regions 13 for forming the source or drain of the nMISQn are formed in self-alignment with the gate electrode 10b by introducing, for example, phosphor or arsenic into the semiconductor substrate 8s by ion implantation or the like with the gate electrode 10b as a mask. Further, semiconductor regions 14 for forming the source or drain of the pMISQp are formed in self-alignment with the gate electrode 10b by introducing, for example, boron into the semiconductor substrate 8s by ion implantation or the like with the gate electrode 10b as the mask.

However, the gate electrode 10b is not limited to being formed of the single film comprised of the low-resistance polysilicon, for example, and may be changed in various ways. It may be formed as a so-called polycide structure wherein a silicide layer like a tungsten silicide, a cobalt silicide or the like is provided over a low-resistance polysilicon film, for example. Alternatively, it may be formed as a so-called polymetal structure wherein a metal film like tungsten or the like is provided over a low-resistance polysilicon film with a barrier conductive film like titanium nitride, tungsten nitride or the like.

Figure 12:
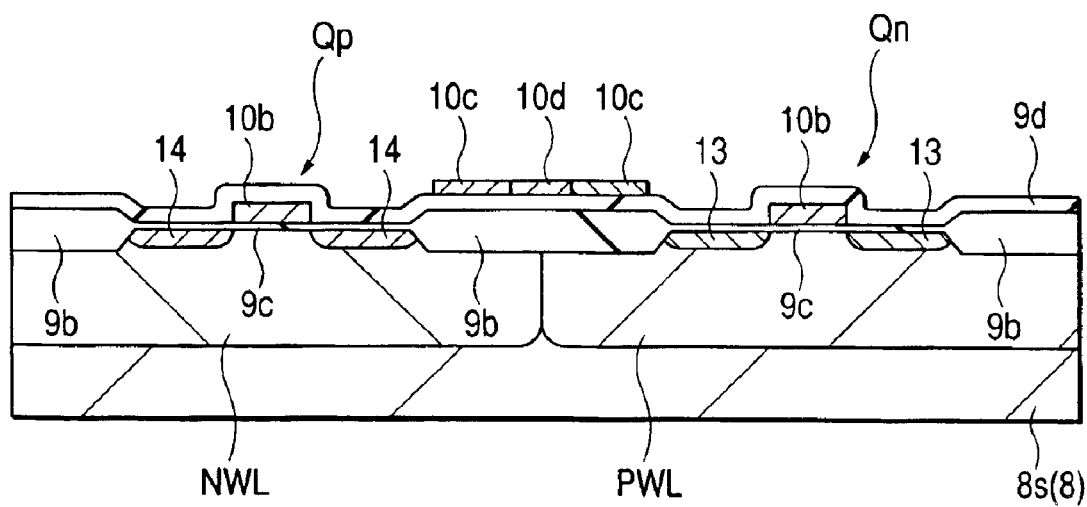
FIG. 12 is a fragmentary cross-sectional view of the specific semiconductor integrated circuit device using the photomask following FIG. 11, which is placed during its manufacturing process.

As shown in FIG. 12, an interlayer dielectric 9d comprised of, for example, a silicon oxide film is deposited over such a semiconductor substrate 8s by the CVD method or the like. Afterwards, a polysilicon film is deposited over the upper surface of the interlayer dielectric 9d by the CVD method or the like. Subsequently, the polysilicon film is patterned by the photolithography technology using the reduction projection exposure system 12 and the mask PM1, and the normal etching technology, followed by introduction of an impurity into predetermined regions of the patterned polysilicon film, whereby wirings 10c and a resistor 10d each comprised of the polysilicon film are formed.

Figure 13:
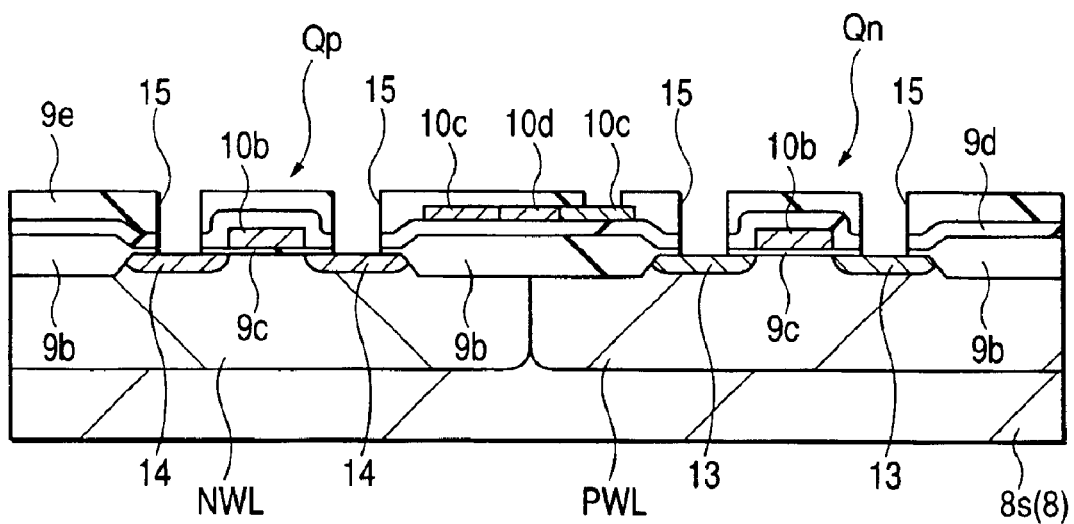
FIG. 13 is a fragmentary cross-sectional view of the specific semiconductor integrated circuit device using the photomask following FIG. 12, which is placed during its manufacturing process.
Figure 14:
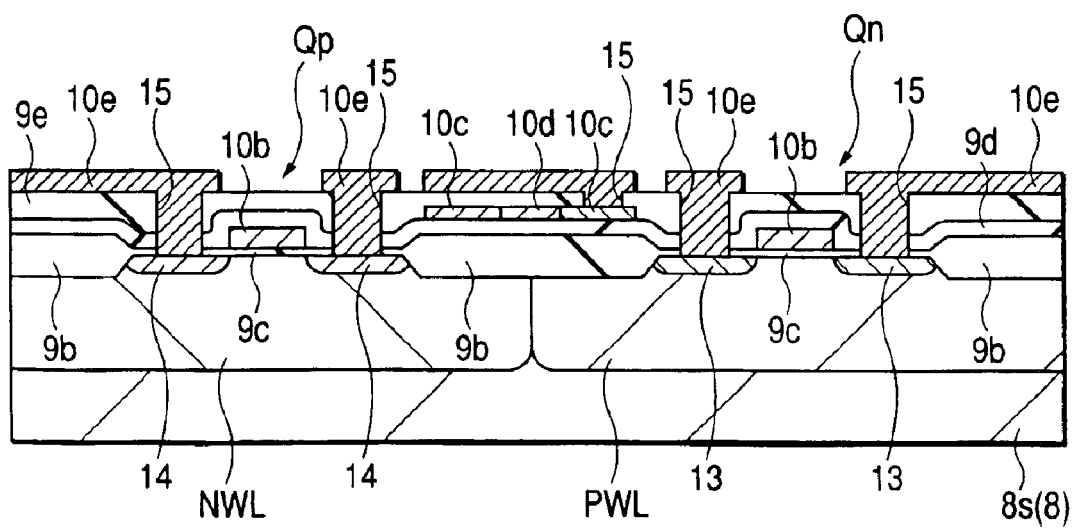
FIG. 14 is a fragmentary cross-sectional view of the specific semiconductor integrated circuit device using the photomask following FIG. 13, which is placed during its manufacturing process.

Thereafter, as shown in FIG. 13, an SOG (Spin On Glass) film 9e comprised of, for example, a silicon oxide film is deposited over the semiconductor substrate 8s by a coating or application method or the like. Thereafter, such contact holes 15 as to expose parts of the semiconductor regions 13 and 14 and the wiring 10c are defined in the interlayer dielectric 9d and the SOG film 9e by the photolithography technology using the reduction projection exposure system 12 and the mask PM1 and the normal etching technology. Further, a metal film comprised of, for example, aluminum (Al) or an Al alloy or the like is deposited over the semiconductor substrate 8s by a sputtering method or the like. Thereafter, the metal film is patterned by the photolithography technology using the reduction projection exposure system 12 and the mask PM1 and the normal etching technology, whereby a first layer wiring 10e is formed as shown in FIG. 14. Subsequently to it, a second layer wiring and later ones are formed in a manner similar to the first layer wiring 10e, whereby a semiconductor integrated circuit device is fabricated. In the present embodiment, the mask patterns (light-shielding patterns and light transmissive patterns) corresponding to patterns to be formed will be formed in the respective photolithography processes.

An application of the method of manufacturing the semiconductor integrated circuit device using the mask PM1 according to the present embodiment will next be explained. A description will be made here of how to cope with where the patterns of the semiconductor integrated circuit device are partly modified or changed.

Upon development and manufacture of the semiconductor integrated circuit device, there may be cases in which corrections and changes or the like are made to part of the integrated circuit pattern. In such a case, a new mask substrate is prepared in the normal mask, and a metal film is deposited thereon and pattern-processed. Therefore, its correcting and changing work results in trouble-taking and time-consuming cumbersome work. Further, if a defect or failure exists in each manufactured mask, then the mask cannot commonly be used even though depending on the degree of the failure. Consequently, the mask is inevitably discarded and the mask must be re-fabricated from the beginning in a state of readiness to use the new mask substrate. Therefore, wasteful and uneconomical work might be performed.

Figure 15A:
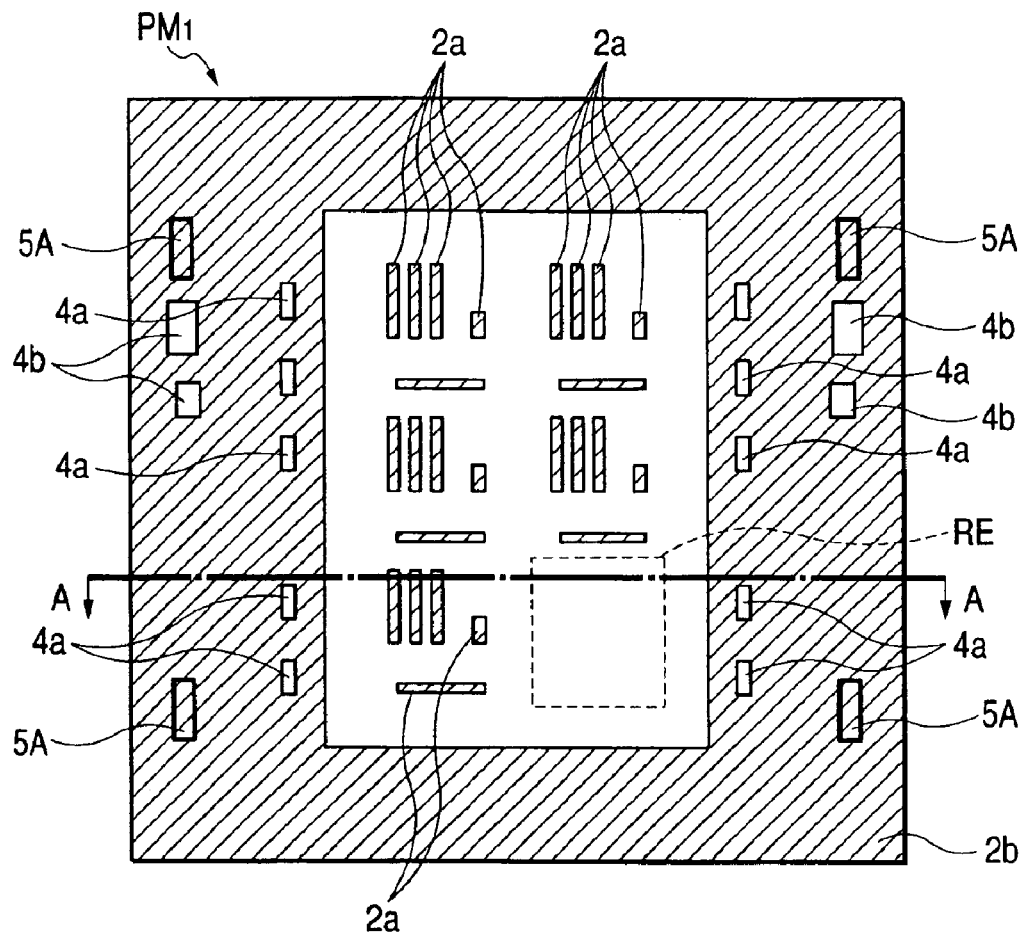
FIG. 15(a) is a plan view of the photomask shown in FIG. 1 in a correcting and changing process of light-shielding patterns each formed of a resist film.
Figure 15B:
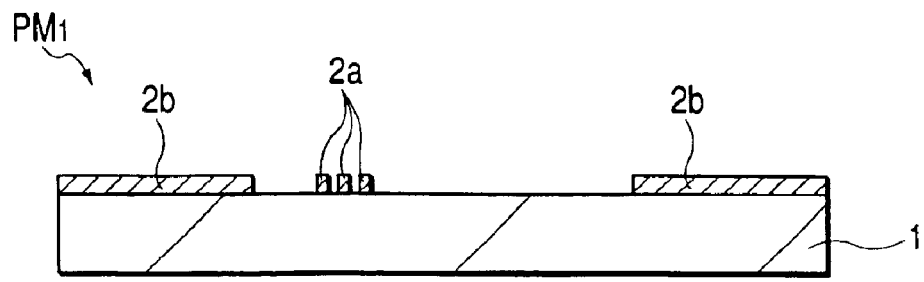
FIG. 15(b) is a cross-sectional view taken along line A—A of FIG. 15(a)

On the other hand, when the mask PM1 according to the present embodiment is used, it is possible to cope with the corrections and changes in the following manner. The light-shielding patterns 3a formed of the resist film placed over the mask PM1 shown in FIG. 1 are removed as shown in FIG. 15. FIG. 15(a) is a plan view of the mask PM1 from which the light-shielding patterns 3a are removed, and FIG. 15(b) is a cross-sectional view taken along line A—A of FIG. 15(a). While the light-shielding patterns 2a and 2b formed of the metal are left over the mask PM1, the light-shielding patterns 3a in the region RE are removed and the region RE serves as a light transmissive region.

The light-shielding patterns 3a formed of the resist film are peeled off by, for example, an n-methyl-2-pyrrolidone organic solvent. Alternatively, the light-shielding patterns 3a may be peeled off by a heated amine organic solvent or acetone. They can also be removed by a tetramethyl ammonium hydroxide (TMAH) solution, and a mixture of ozone sulphate or a hydrogen peroxide solution and strong sulfuric acid. The use of the TMAH solution is desirable because when the concentration thereof is set to about 5%, the resist film (light-shielding patterns 3a) can be peeled off without attacking the metal (light-shielding patterns 2a and 2b).

Another method of removing the resist film (light-shielding patterns 3a), an oxygen plasma ashing method may be used. This method is particularly effective in performing the hardening process of the resist film on the resist film (light-shielding patterns 3a) over the mask PM1. This is because the resist film (light-shielding patterns 3a) being subjected to the hardening process is already cured and the chemical removing method might not provide sufficient removal.

Further, the light-shielding patterns 3a may mechanically be separated by peeling. Namely, adhesive tapes are applied onto their corresponding forming surfaces of the light-shielding patterns 3a of the mask PM1, and thereafter the adhesive tapes are peeled away, whereby the light-shielding patterns 3a are peeled off. Since, in this case, the organic solvent is hardly used and there is no need to form a vacuum state, the light-shielding patterns 3a can be peeled off with relative ease and in a short time.

After the process of removing the resist film (light-shielding patterns 3a), a cleaning process is done to remove foreign materials over the surface of the mask PM1. A combination of, for example, an ozone sulphate cleaning process and a brush cleaning process has been used for the cleaning employed herein. However, if a method which is high in foreign-material removal capability and avoids attacking on the metal (light-shielding patterns 2a and 2b), no limitation is imposed on the method and various changes can be made.

Figure 16A:
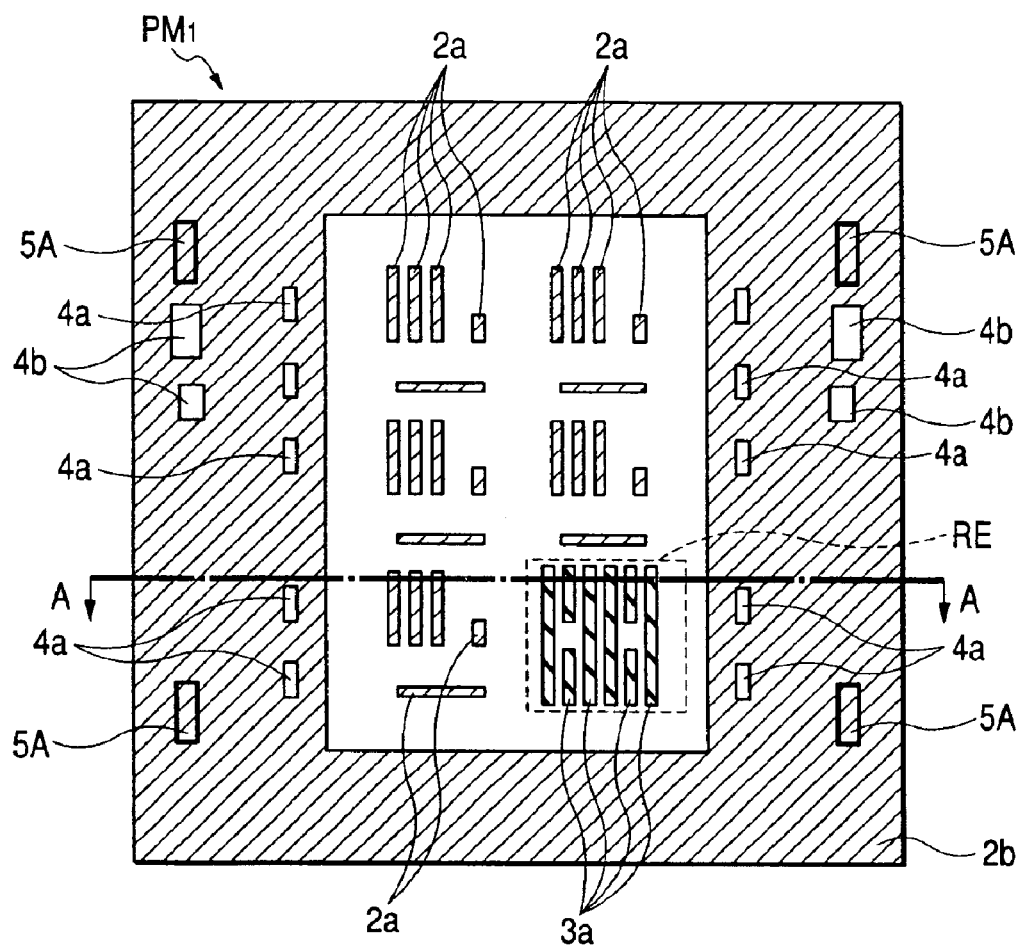
Figure 16B:
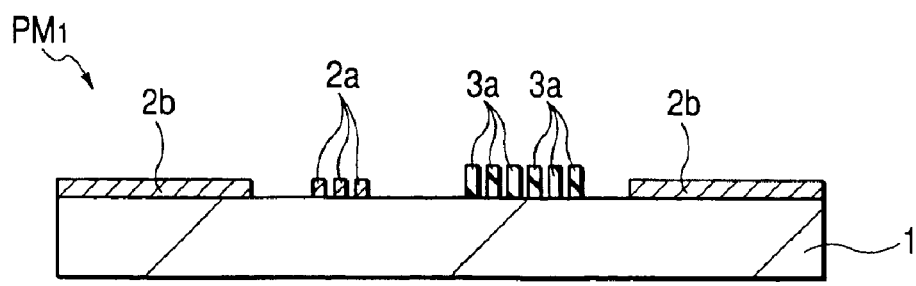
Figure 17A:
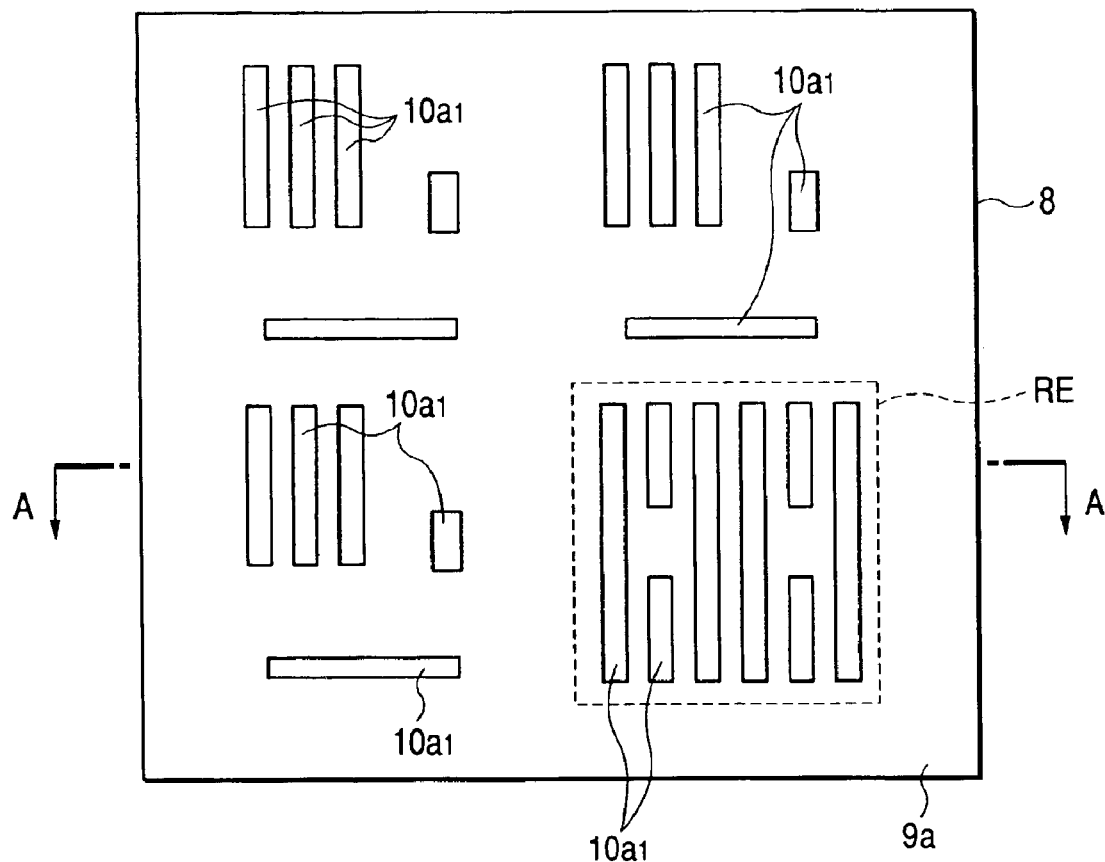
FIG. 17(a) is a plan view of a semiconductor wafer, showing patterns transferred by the photomask of FIG. 16.
Figure 17B:
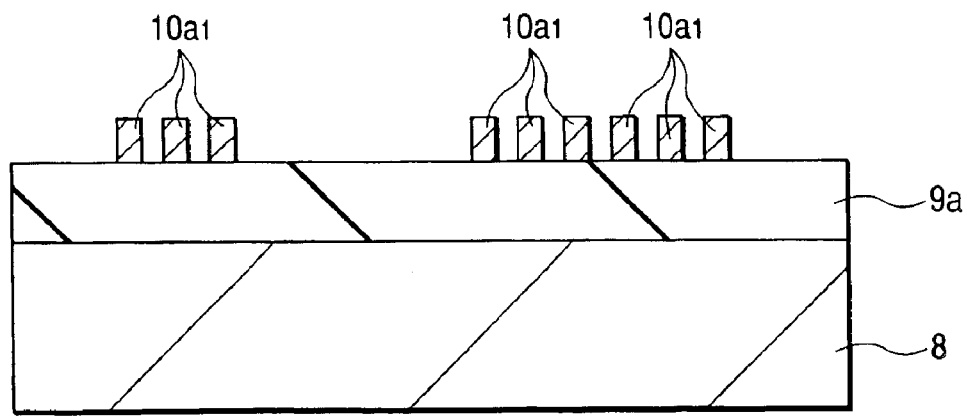
FIG. 17(b) is a cross-sectional view taken along line A—A of FIG. 17(a)

Thereafter, as shown in FIG. 16, a group of desired light-shielding patterns 3a different in shape from the group of the light-shielding patterns 3a shown in the region RE of FIG. 1 are formed in a region RE by a resist film. Since a method of forming the light-shielding patterns 3a is identical to the description of the manufacturing method of the mask PM1, the description thereof will therefore be omitted. The transfer of the patterns of the mask PM1 onto the wafer by the reduction projection exposure system 12 or the like (see FIG. 10) is illustrated in FIG. 17. FIG. 17(a) is a fragmentary plan view of the wafer 8, and FIG. 17(b) is a cross-sectional view taken along line A—A of FIG. 17(a), respectively. Thus, a group of conductive film patterns 10a1 different in shape from those shown in FIG. 9 can be formed in a region RE.

In the case of the mask PM1 according to the present embodiment as described above, the light-shielding patterns 3a may be removed and other light-shielding patterns 3a may be formed again in the same procedure as the photolithography that has commonly been performed in the manufacturing process of the semiconductor integrated circuit device where corrections and changes are made to the patterns in part (region RE) of the mask PM1 due to the formation of some light-shielding patterns 3a of the mask PM1 by the resist film. It is therefore possible to perform their corrections and changes with ease and in an extremely short time. Namely, the period required to manufacture the mask PM1 can greatly be shortened. Thus, the use of the mask PM1 in the development and manufacture of the semiconductor integrated circuit device makes it possible to greatly shorten the time required to develop and manufacture the semiconductor integrated circuit device.

Upon the corrections or changes made to the patterns of the mask PM1, there is no need to prepare the new or additional mask substrate 1 and re-fabricate it from the beginning. Further, if a failure or defect exists in each of the light-shielding patterns 3a of the fabricated mask, then the light-shielding patterns 3a are removed again and may be pattern-processed again.

Therefore, the number of steps for manufacturing the mask PM1 can greatly be reduced, and materials necessary for the manufacture of the mask PM1 can extremely be lessened.

It is therefore possible to greatly reduce the manufacturing cost of the mask PM1. Accordingly, the use of the mask PM1 in the development and manufacture of the semiconductor integrated circuit device allows a great reduction in the cost of the semiconductor integrated circuit device.

Figure 18:
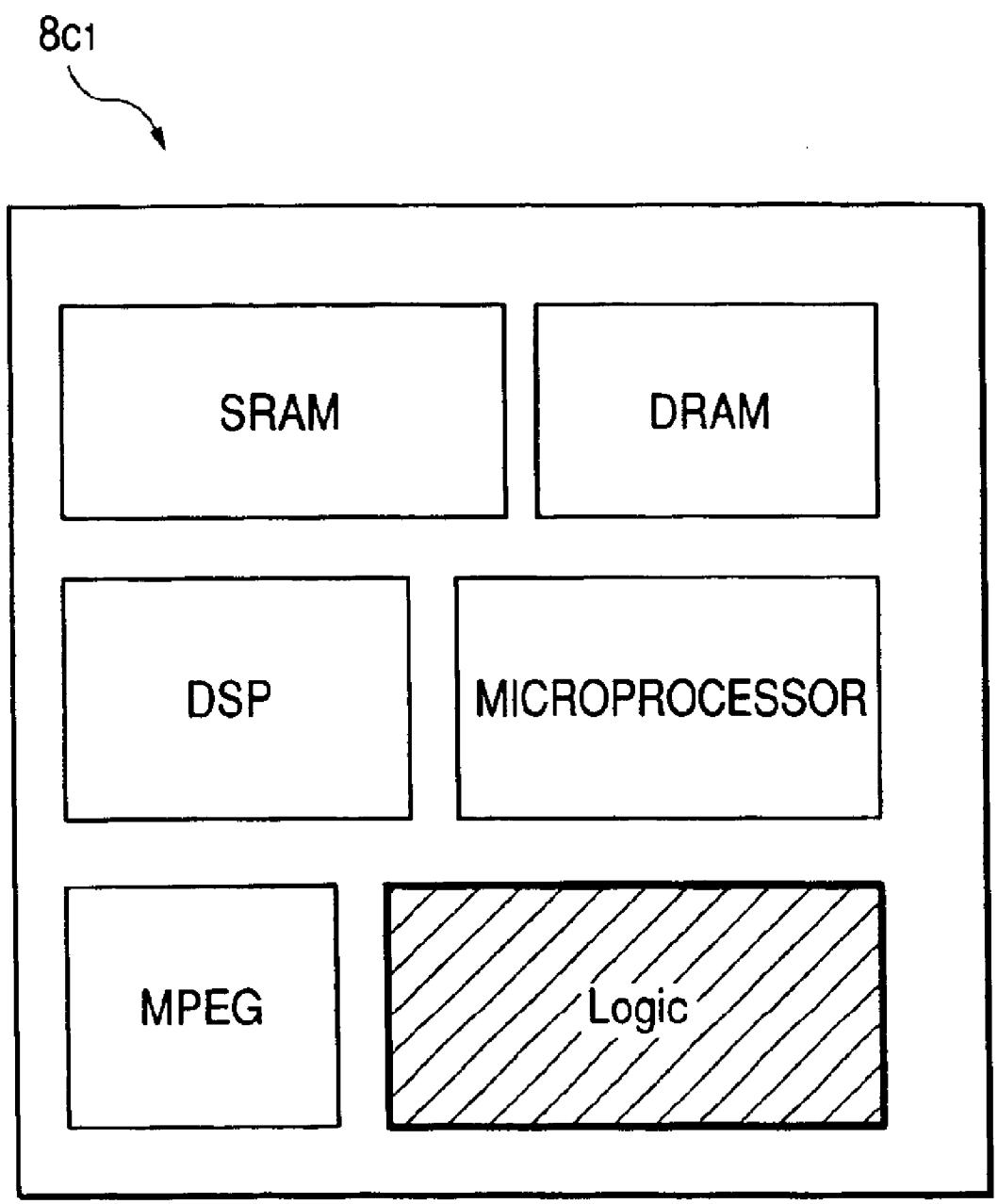
FIG. 18 is a plan view showing one example of a semiconductor chip effective for use in the development or manufacture of the photomask according to the present embodiment.
Figure 19:
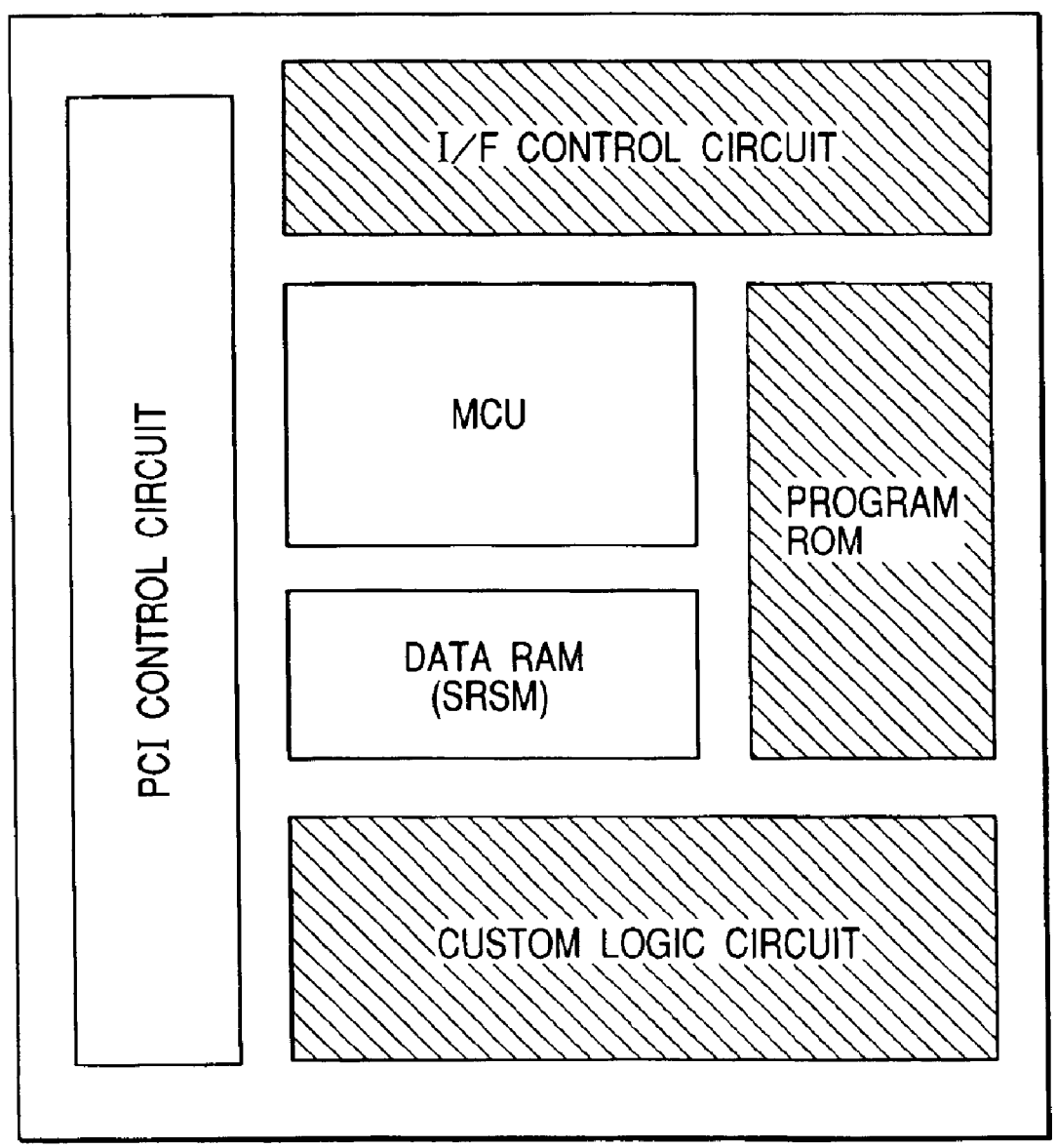
FIG. 19 is a plan view illustrating another example of a semiconductor chip effective for use in the development or manufacture of the photomask according to the present embodiment.
Figure 20:
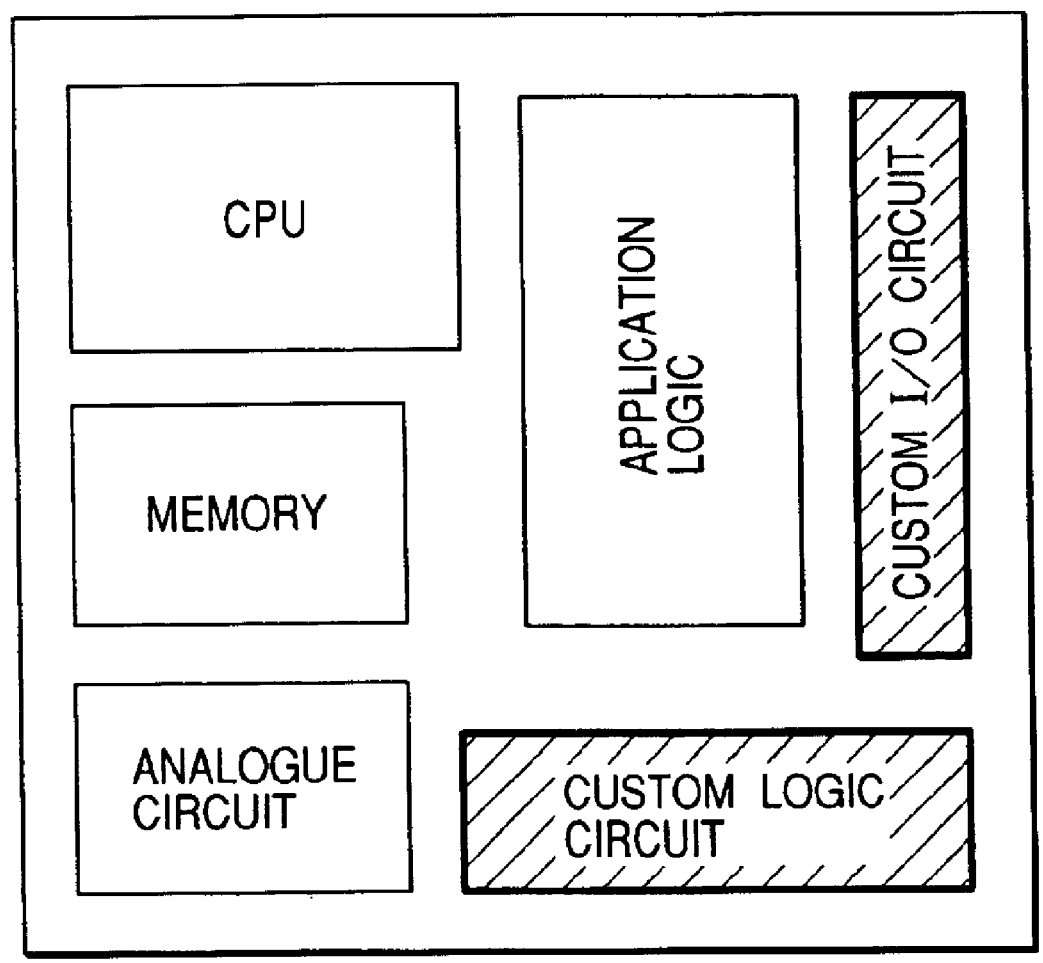
FIG. 20 is a plan view depicting a further example of a semiconductor chip effective for use in the development or manufacture of the photomask according to the present embodiment.

FIGS. 18 through 20 respectively show examples of semiconductor chips 8c1 through 8c3 of a semiconductor integrated circuit device effective for application of the technical idea of the present invention. The semiconductor chips are small pieces of plane quadrangular semiconductors cut out of a wafer 8. Incidentally, hatching is applied to each of regions over a mask, in which light-shielding patterns are formed of a resist film.

The layout of circuit regions for a SRAM (Static Random Access Memory), a DRAM (Dynamic Random Access Memory), a DSP (Digital Signal Processor), a microprocessor, an MPEG (Moving Picture Experts Group) and Logic, etc. within the semiconductor chip 8c1 of FIG. 18 is illustrated as an example. Since the Logic is apt to be changed due to customer's requests or the like, light-shielding patterns over a mask for forming a pattern for the circuit region of the Logic are formed of a resist film. Namely, a mask pattern for forming the pattern for the Logic's circuit region in a region RE of a mask PM1 is formed of the resist film (light-shielding patterns 3a). Light-shielding patters over the mask PM1 for forming patterns for the circuit regions other than the above circuit region are formed of a metal.

The layout of circuit regions for a PCI control circuit, an I/F control circuit, an MCU, a program ROM, a data RAM (SRAM or the like), and a custom logic circuit, etc. within the semiconductor chip 8c2 of FIG. 19 is illustrated by way of example. Light-shielding patterns over a mask for forming patterns for the I/F control circuit, the program ROM and the custom logic circuit of these are formed of a resist film. Namely, three regions RE over the mask PM1 are provided and mask patterns for forming the patterns for the I/F control circuit, the program ROM and the custom logic circuit are formed of a resist film (light-shielding patterns 3a) within the respective regions. Light-shielding patterns over the mask PM1 for forming the patterns for the circuit regions other than the above are formed of a metal. The I/F control circuit is configured as described above because pattern shapes are different from one another where interface standards differ from one another as in the case of, for example, IEEE (I Triple E) 1394, a USB (Universal Serial Bus), an SCSI (Small Computer System Interface), an AGP (Accelerated Graphics Port), an Either, a Fiber-channel, etc. Further, the program ROM is configured as described above because there is necessity to rewrite a program as will be described later. The present example can illustrate a case in which light-shielding patterns over a mask can be formed of a resist film with respect to each eye (memory cell) portion of ROM. Further, the custom logic circuit is configured as described because circuit patterns might be changed according to customer's requests as typified by a gate array or standard cell, for example.

The layout of a CPU (Central Processing Unit), a memory, an application logic circuit, a custom I/O (Input/output) circuit, an analog circuit and a custom logic circuit within the semiconductor chip 8c3 of FIG. 20 is illustrated by way of example. Light-shielding patterns over a mask for forming patterns for the custom I/O circuit and the custom logic circuit of these are formed of a resist film. Namely, two regions RE over the mask PM1 are provided and mask patterns for forming the patterns for the custom I/O circuit and the custom logic circuit are formed of a resist film (light-shielding patterns 3a). Light-shielding patterns over the mask PM1 for forming the patterns for the circuit regions other than the above are formed of a metal. The custom I/O circuit is provided for the reason similar to the I/F control circuit.

(Embodiment 2)

The present embodiment 2 will describe a modification of a mask. Portions other than it are the same as the embodiment 1.

Figure 21A:
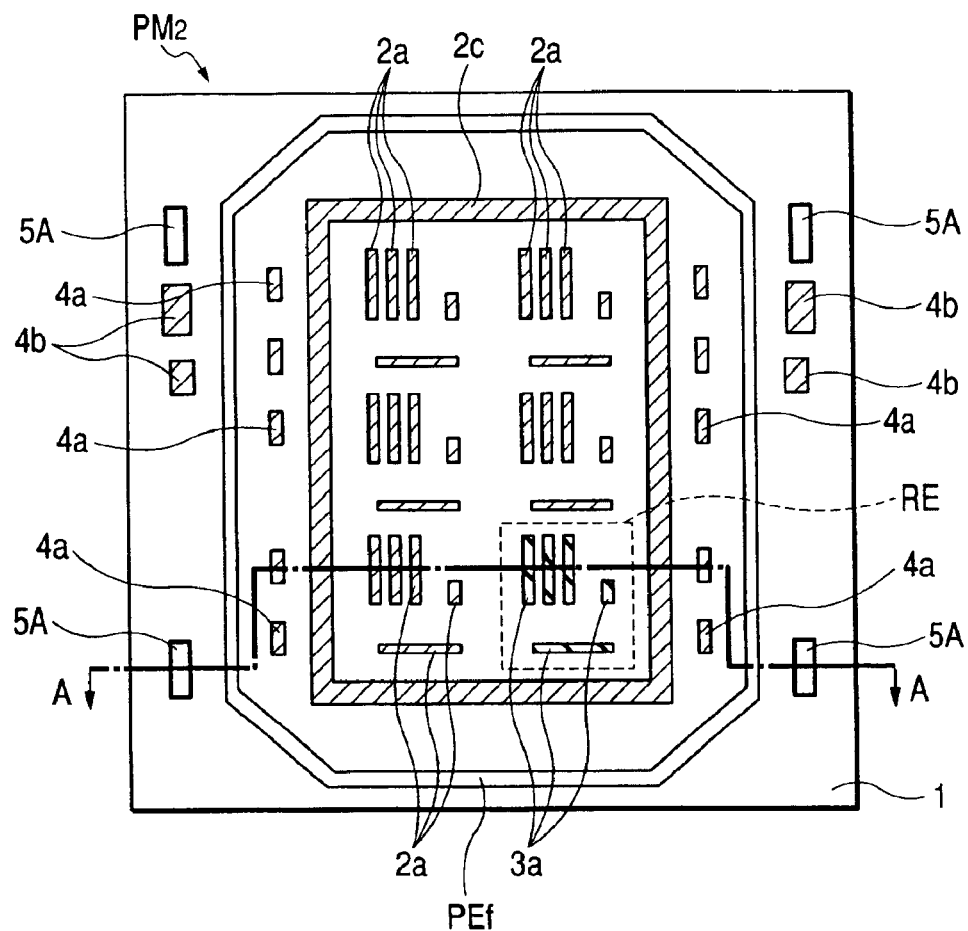
FIG. 21(a) is a plan view of a photomask showing another embodiment of the present invention.
Figure 21B:
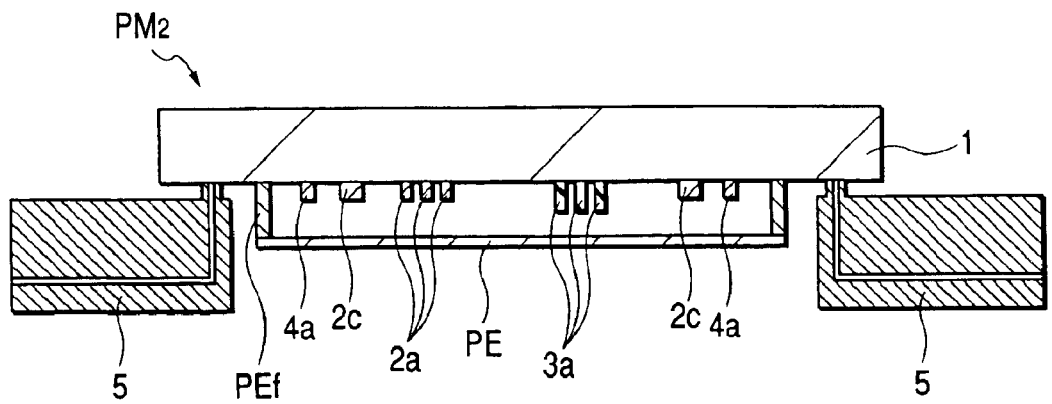
FIG. 21(b) is a cross-sectional view taken along line A—A of FIG. 21(a)

A mask PM2 shown in FIG. 21 is a mask wherein a peripheral outline of a semiconductor chip serves as a light-shielding portion. A mask wherein a positive type resist film is used over a wafer to form line patterns, is illustrated by way of example. Incidentally, FIG. 21(a) is a plan view of the mask PM2, and FIG. 21(b) is a cross-sectional view taken along line A—A of FIG. 21(a), respectively.

Light-shielding patterns 2a and 3a in an integrated circuit pattern region over the mask PM2 are identical to those employed in the embodiment 1. Patterns transferred onto the wafer through the use of the mask PM2 are identical to those shown in FIGS. 8 and 9 and the like. In the present embodiment, a band or strip light-shielding patterns 2c formed of a metal, for example, are formed over the outer periphery of the integrated circuit pattern region of the mask PM2 so as to surround it. The most part of the outside thereof is free of a light-shielding film and serves as a light transmissive region. Mask patterns 4a and 4b lying in the peripheral region of the mask PM2 are formed of light-shielding patterns comprised of a metal. Thus, since the contrast of detected light can sufficiently be obtained, the sensitivity of detection of each mark and the accuracy of detection thereof can be improved.

The light-shielding patterns 2a and 2b and the mark patterns 4a and 4b are formed of, for example, the same metal material upon the same pattern processing process.

Upon the formation of the light-shielding patterns 2a and 2c and the mark patterns 4a and 4b over a mask substrate 1, a negative type resist film is used as an etching mask. This is because the mask PM2 can be fabricated in Q-TAT. Namely, since the leaving of the resist film outside the integrated circuit pattern region could lead to the occurrence of foreign materials as described above, it is necessary to remove the resist film lying thereoutside. However, if the resist film is formed as a positive type resist film, then the inside of the integrated circuit pattern region and the most part of the outer periphery thereof must be subjected to electron beam drawing, and hence time is required. However, if the negative type resist film is used, then regions for the light-shielding patterns 2a and 2b and mark patterns 4a and 4b relatively small in area may be drawn within a main surface of the mask substrate 1. It is thus possible to reduce a drawing area and shorten a drawing time.

A base of a pellicle stick-on frame PEf of a pellicle PE is bonded to the mask substrate 1 in a directly contact state. It is thus possible to prevent the peeling of the pellicle stick-on frame PEf in a manner similar to the embodiment 1. A mounting portion 5 of an exposure apparatus is brought into a state of being in direct contact with the mask substrate 1. Thus, the occurrence of a foreign material due to resist peeling or the like can be restrained or prevented in a manner similar to the embodiment 1.

Figure 22A:
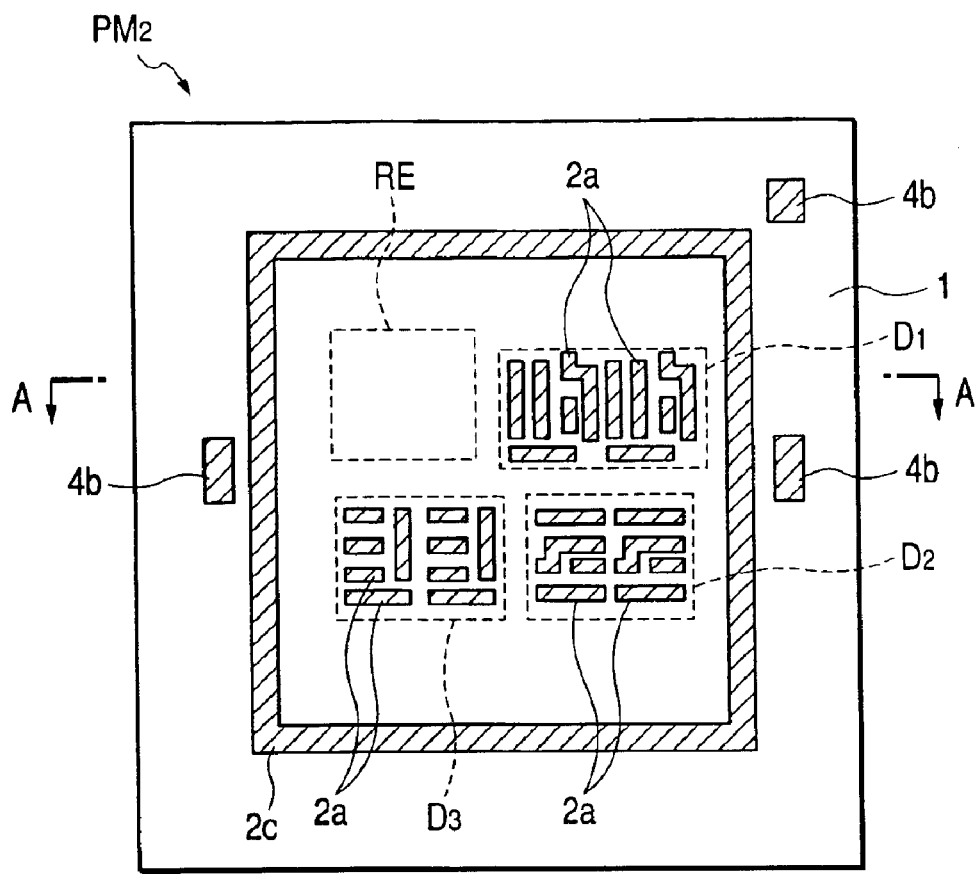
FIG. 22(a) is a plan view of the photomask shown in FIG. 21 in a correcting and changing process of light-shielding patterns each formed of a resist film.
Figure 22B:
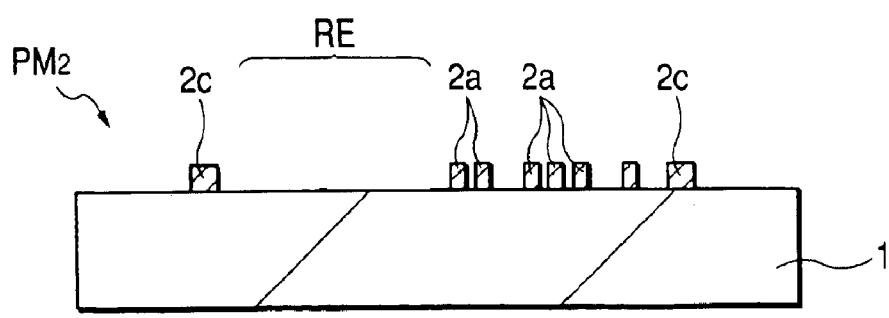
FIG. 22(b) is a cross-sectional view taken along line A—A of FIG. 22(a)
Figure 23A:
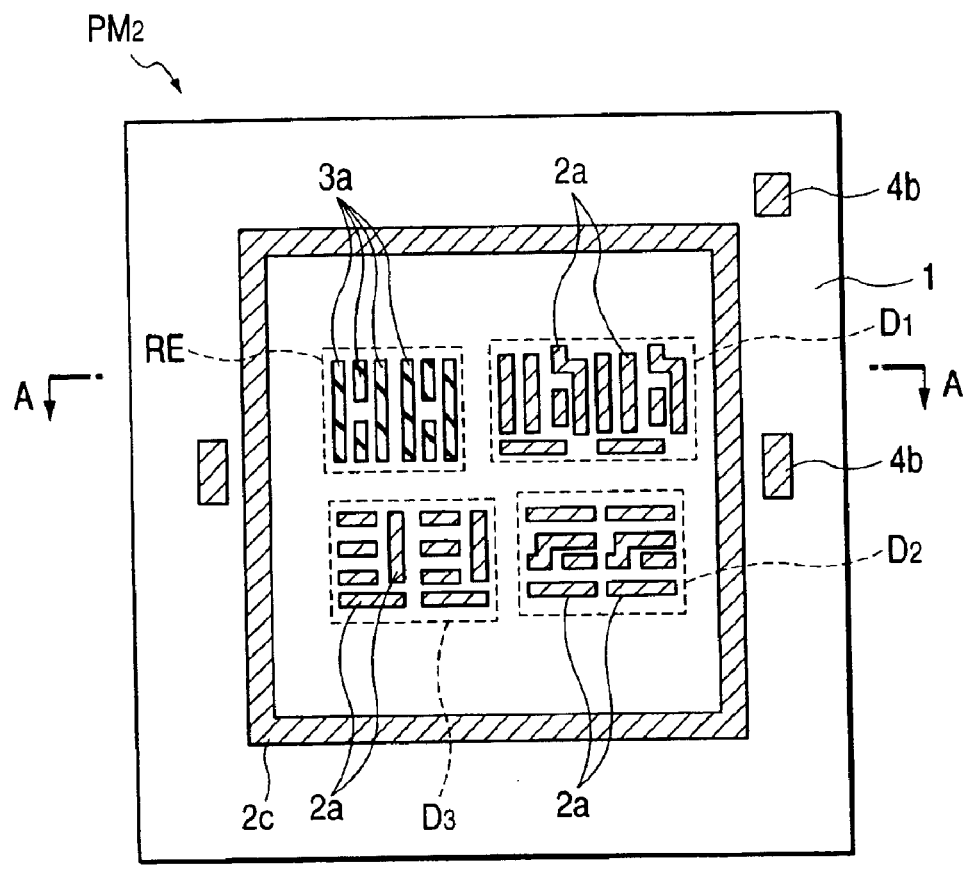
FIG. 23(a) is a plan view of the photomask shown in FIG. 21 in a correcting and changing process of light-shielding patterns each formed of a resist film.
Figure 23B:
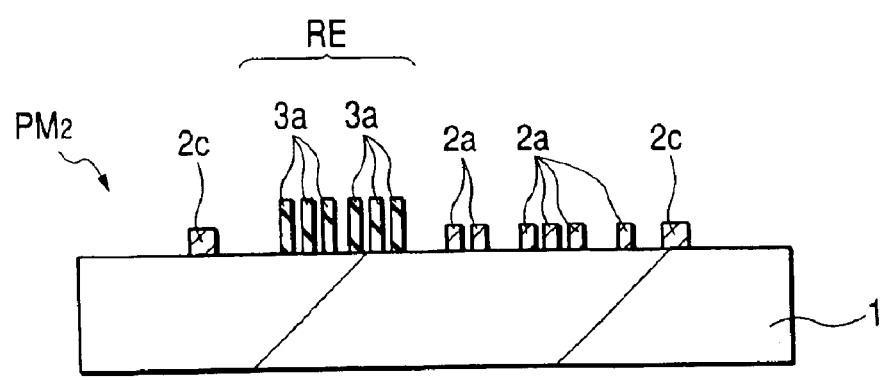
FIG. 23(b) is a cross-sectional view taken along line A—A of FIG. 23(a)

A method of changing the light-shielding patterns 3a of the mask PM2 is also identical to the embodiment 1. Using FIGS. 22 and 23, it will be explained in brief as follows. Incidentally, FIG. 22(a) and FIG. 23(a) are plan views of the mask PM2, and FIG. 22(b) and FIG. 23(b) are cross-sectional views taken along lines A—A of FIG. 22(a) and FIG. 23(a), respectively.

The light-shielding patterns 3a in the region RE of the mask PM2 shown in FIG. 21 are first removed as shown in FIG. 22 in a manner similar to the embodiment 1. Since light-shielding patters 2a and light-shielding patterns 2c in element transfer regions D1 through D3 are formed of a metal, they are left as they are. Subsequently, as shown in FIG. 23, light-shielding patterns 3a different in shape from those shown in FIG. 21 are formed of a resist film within the region RE of the mask PM2 in a manner similar to the embodiment 1. In the present embodiment, a negative type resist was used as the resist film for forming the light-shielding patterns 3a as described above.

The present embodiment 2 such as referred to above can also obtain an effect similar to the embodiment 1.

(Embodiment 3)

The present embodiment 3 will explain a modification of a mask. Portions other than it are identical to those employed in the embodiment 1.

Figure 24A:
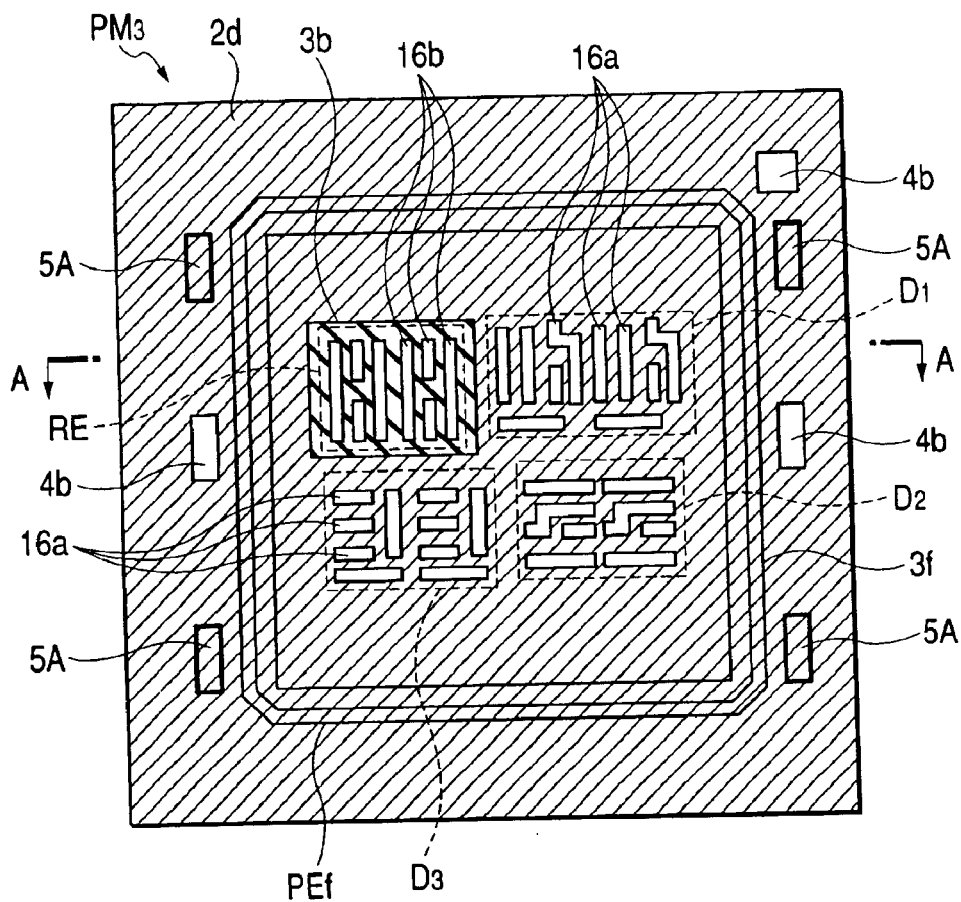
FIG. 24(a) is a plan view of a photomask showing a further embodiment of the present invention.
Figure 24B:
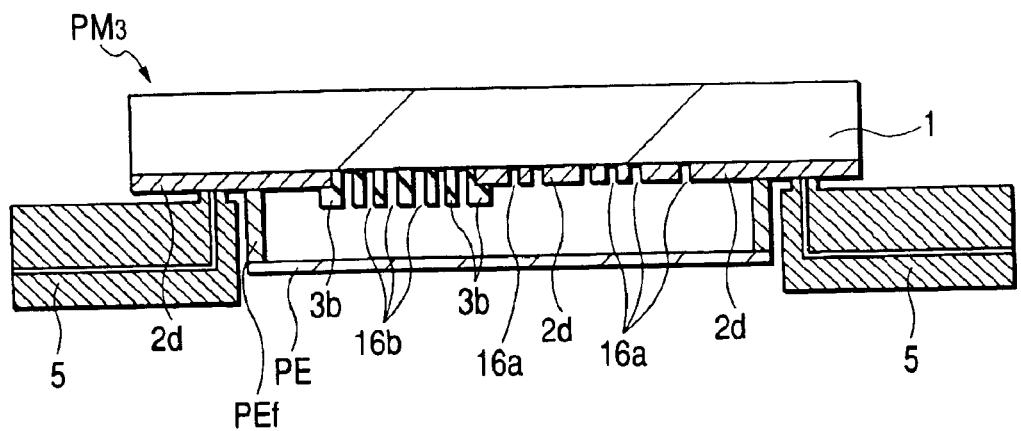
FIG. 24(b) is a cross-sectional view taken along line A—A of FIG. 24(a)

A mask PM3 shown in FIG. 24 shows, as an example, a mask wherein a negative type resist film is used over a wafer to form line patterns. Incidentally, FIG. 24(a) is a plan view of the mask PM3, and FIG. 24(b) is a cross-sectional view taken along line A—A of FIG. 24(a), respectively.

A main surface of a mask substrate 1 of the mask PM3 is covered with a light-shielding film 2d formed of a metal substantially over the whole surface thereof. The light-shielding film 2d makes use of the same material as the light-shielding patters 2a through 2c referred to above. In element transfer regions D1 through D3 in an integrated circuit pattern of the mask PM3, some of the light-shielding film 2d are removed to form light transmissive patterns 16a. In a region RE lying within the integrated circuit pattern region, the light-shielding film 2d is partly removed in the form of a plane quadrangle to thereby form a light transmissive opening or aperture region. Thus, the region RE is covered with a light-shielding film 3b formed of a resist film in place of the light-shielding film. Further, part of the light-shielding film 3b is removed to form light-shielding patterns 16b. Part of the outer periphery of the light-shielding film 3b formed of the resist film is superimposed on part of the light-shielding film 2d. A resist material for the light-shielding film 3b is the same as the resist material for the light-shielding patterns 3a, which has been described in the embodiment 1. The present embodiment illustrates a case in which the light transmissive patterns 16a and 16b are transferred as line patterns over the wafer. Namely, the patterns for the light transmissive patterns 16a and 16b are transferred onto the wafer. Further, mark patterns 4a and 4b of the mask PM3 are formed of light transmissive patterns in a manner similar to the embodiment 1. Namely, some of the light-shielding film 2d are removed to form the mark patterns. Thus, since the contrast of detected light can sufficiently be ensured, the sensitivity of detection of each mark and the accuracy of detection thereof can be improved.

A positive type resist film is used upon processing (i.e., the formation of the light-shielding patterns 16a, the light transmissive aperture region in the region RE and the mark patterns 4a and 4b) of the light-shielding film 2d over the mask substrate 1. This is because the mask PM3 can be fabricated in Q-TAT. Namely, this is because when a negative type resist film is used here, most of the inner and outer parts of the integrated circuit pattern region must be subjected to electron beam drawing and hence time is required.

A base of a pellicle stick-on frame PEf of a pellicle PE is bonded to the light-shielding film 2d in a state of being in direct contact with the light-shielding film 2d formed of the metal over the mask substrate 1. It is thus possible to prevent the peeling of the pellicle stick-on frame PEf in a manner similar to the embodiments 1 and 2. A mounting portion 5 of an exposure apparatus is also brought into a state of being in direct contact with the light-shielding film 2d formed of the metal. Thus, the occurrence of a foreign material due to resist peeling or the like can be restrained or prevented in a manner similar to the embodiments 1 and 2.

Figure 25A:
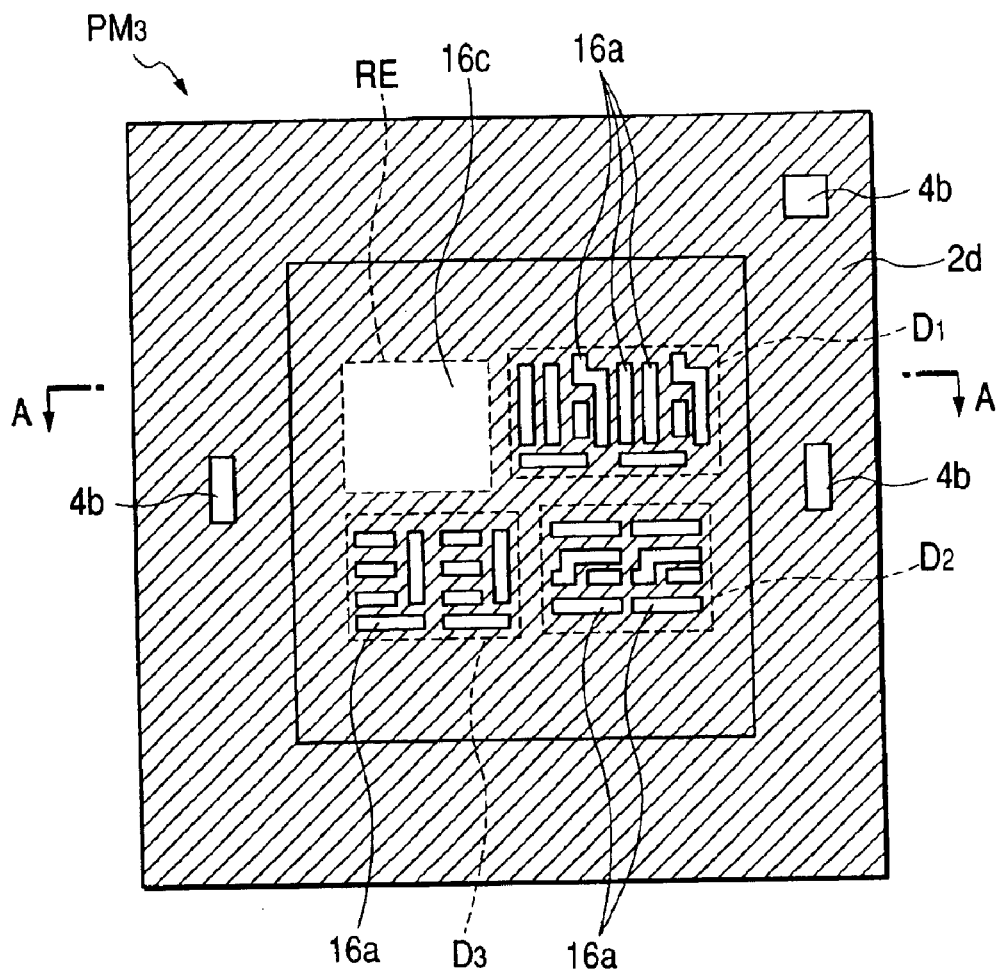
FIG. 25(a) is a plan view of the photomask shown in FIG. 24 in a correcting and changing process of light-shielding patterns each formed of a resist film.
Figure 25B:
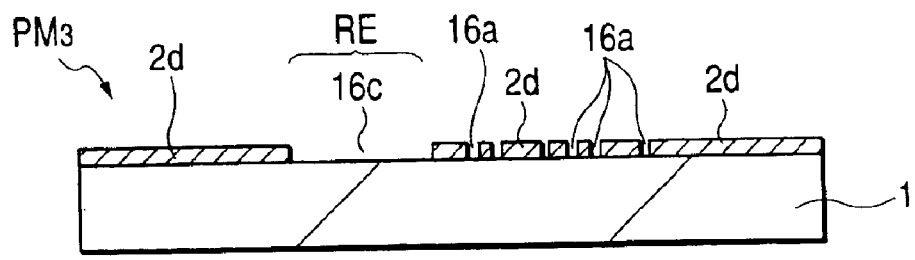
FIG. 25(b) is a cross-sectional view taken along line A—A of FIG. 25(a)
Figure 26A:
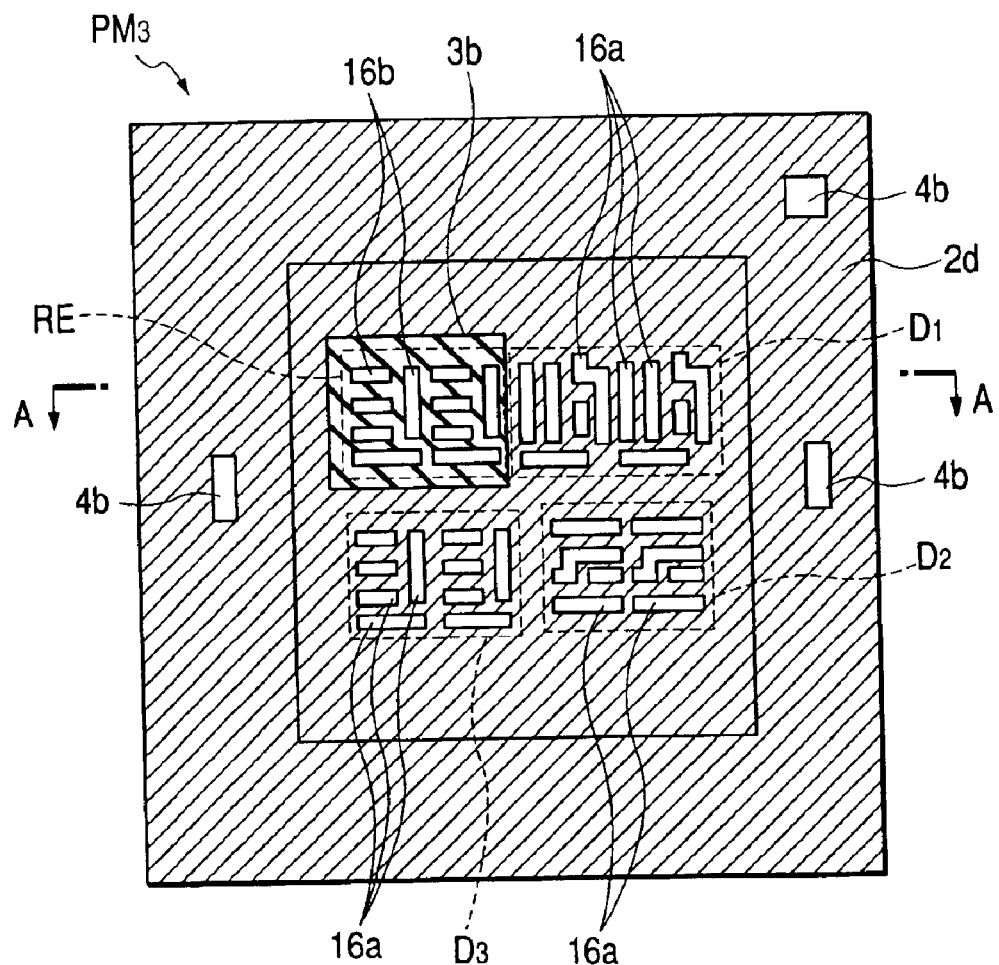
FIG. 26(a) is a plan view of the photomask shown in FIG. 24 in a correcting and changing process of light-shielding patterns each formed of a resist film.
Figure 26B:
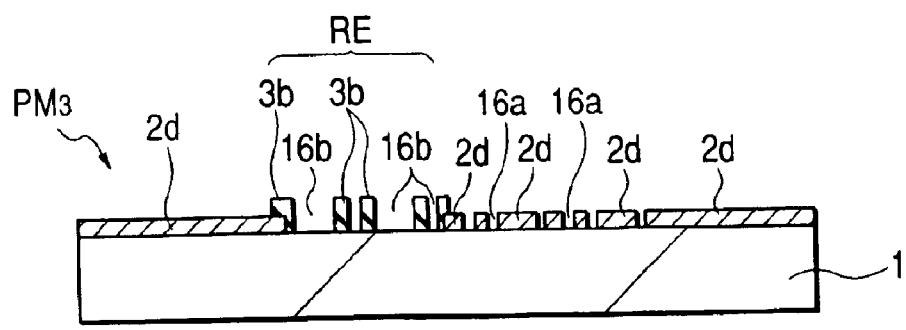
FIG. 26(b) is a cross-sectional view taken along line A—A of FIG. 26(a)

A method of changing the light-shielding patterns 16b of the mask PM3 is also identical to the embodiments 1 and 2. Using FIGS. 25 and 26, it will be explained in brief as follows. Incidentally, FIG. 25(a) and FIG. 26(a) are plan views of the mask PM3, and FIG. 25(b) and FIG. 26(b) are cross-sectional views taken along lines A—A of FIG. 25(a) and FIG. 26(a), respectively.

The light-shielding film 3b formed of the resist film in the region RE of the mask PM3 shown in FIG. 24 is first removed as shown in FIG. 25 in a manner similar to the embodiments 1 and 2 to thereby expose a light transmissive aperture region 16c of the region RE. Since the light-shielding film 2d formed of the metal is left behind at this time, the light transmissive patterns 16a in the element transfer regions D1 through D3 remain as shown in FIG. 24. The light transmissive aperture region 16c is opened in the form of a plane quadrangle, for example. The main surface of the mask substrate 1 is exposed from the light transmissive aperture region.

Subsequently, a resist film for light-shielding pattern formation is applied onto a main surface (corresponding to a surface over which a light-shielding film 2d is formed) of the mask PM3. The resist film made use of a negative type resist film. This is because the mask PM3 can be fabricated in Q-TAT. Namely, if a positive type resist film is used here, then the inside and outside of an integrated circuit pattern region must be subjected to electron beam drawing, and hence time is necessary for the drawing. However, if the negative type resist film is used, then a drawing area can be reduced and a drawing time can be shortened. Subsequently, electron beams or the like are applied to a portion for forming a light-shielding region of the resist film to thereby draw patterns, followed by subjection to development processing, whereby a light-shielding film 3b and light transmissive patterns 16b formed by removing some thereof are formed in a region RE as shown in FIG. 26.

The present embodiment 3 such as described above can also obtain an effect similar to each of the embodiments 1 and 2.

(Embodiment 4)

The present embodiment 4 describes a case in which the present invention is applied to a so-called superposition exposure technology wherein a plurality of pieces of masks are superimposed on one another and exposed to thereby form one pattern or a group of patterns over a wafer. Portions other than the above are identical to the embodiments 1 through 3.

Figure 27A:
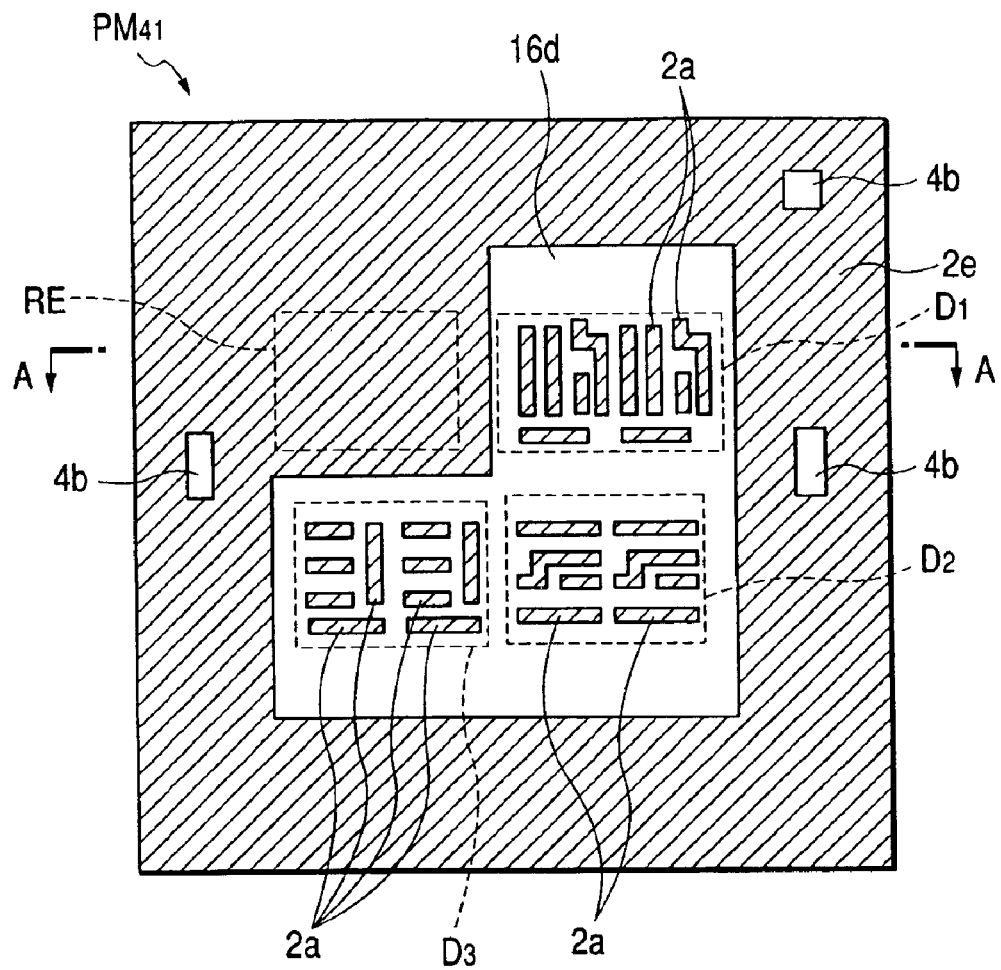
FIG. 27(a) is a plan view of a first photomask showing a still further embodiment of the present invention.
Figure 27B:
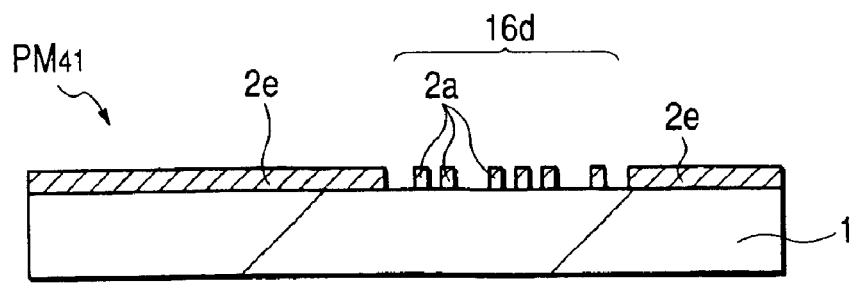
FIG. 27(b) is a cross-sectional view taken along line A—A of FIG. 27(a)

FIG. 27 shows one example of a first mask PM41 employed in the present embodiment 4. For example, a plane inverted L-shaped light transmissive aperture region 16d is formed in an integrated circuit pattern region of the mask PM41. Light-shielding patterns 2a formed of a metal, for transferring integrated circuit patterns onto the wafer are formed in the light transmissive aperture region 16d. In the present embodiment, the mask PM41 for transferring line patterns onto the wafer is illustrated by way of example. The most part of the outer periphery of the light transmissive aperture region 16d is covered with a light-shielding film 2e formed of the metal over the outer periphery of a mask substrate 1. A region RE is also covered with the light-shielding film 2e. In the first mask PM41, mark patterns 4b and a pellicle are identical to the embodiment 3.

The mask PM41 is used as a mask for transferring patterns for each circuit (see FIGS. 18 through 20) comprised of a group of fixed-form of patterns to which pattern corrections and changes are basically not made in a semiconductor integrated circuit device. In the present embodiment, the light-shielding patterns 2a and the light-shielding film 2e are formed of the same material. In the present embodiment, however, materials other than chromium and chromium oxide may not be used as the material for the light-shielding patterns 2a and the light-shielding film 2e. This is because the mask PM41 makes the same use as the normal mask. Namely, this is because since no pattern changes are made, the light-shielding patterns 2a and the light-shielding film 2e may have resistance characteristics required of the normal mask. Of course, the light-shielding patterns of the mask PM41 may be formed of a resist film.

Figure 28A:
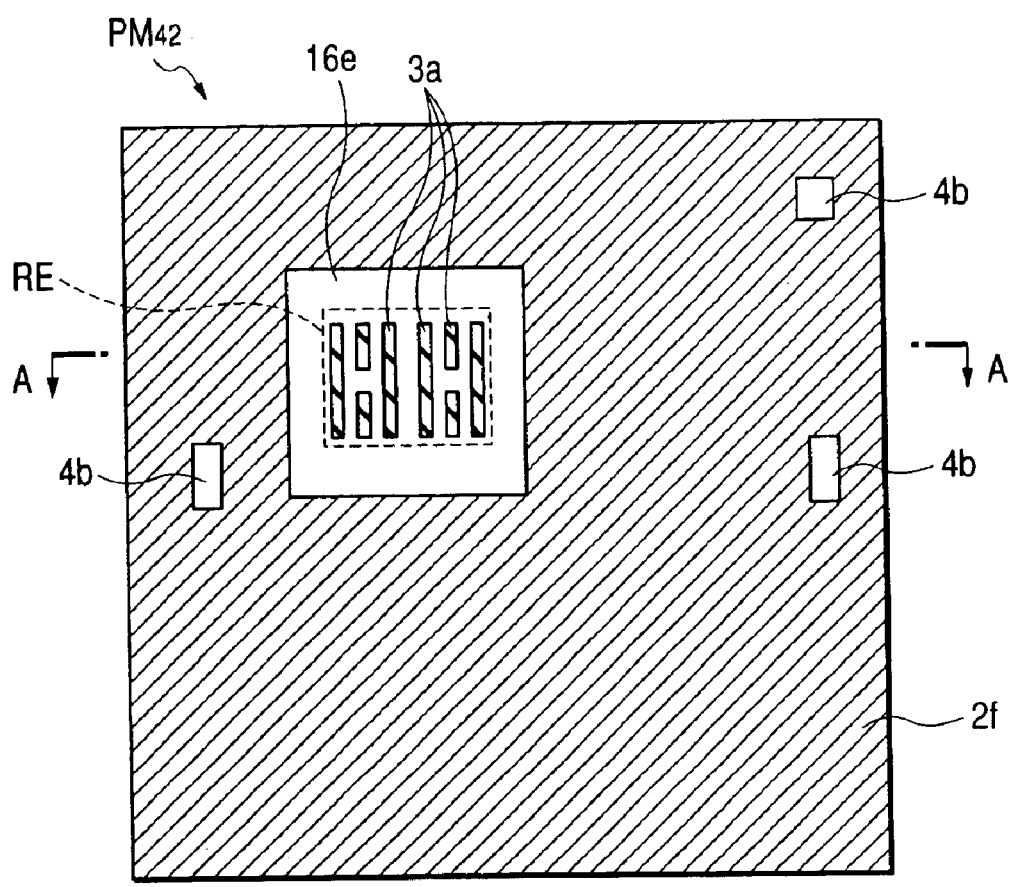
FIG. 28(a) is a plan view of a second photomask showing a still further embodiment of the present invention.
Figure 28B:
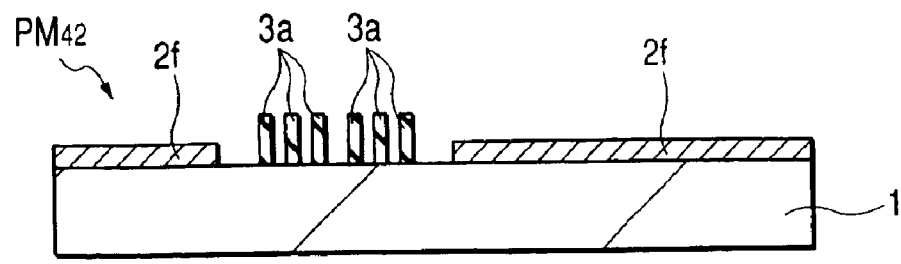
FIG. 28(b) is a cross-sectional view taken along line A—A of FIG. 28(a)

FIG. 28 shows one example of a second mask PM42 employed in the present embodiment 4. In the mask PM42, for example, a plane quadrangular light transmissive aperture region 16e is formed in a region RE of an integrated circuit pattern region of the mask PM42. Light-shielding patterns 3a formed of the resist film, for transferring integrated circuit patterns onto a wafer are formed in the light transmissive aperture region 16e. In the present embodiment, the mask PM42 for transferring line patterns onto the wafer is illustrated by way of example. The most part of the outer periphery of the light transmissive aperture region 16e is covered with a light-shielding film 2f formed of a metal over the outer periphery of a mask substrate 1. The light-shielding film 2f is comprised of the same material for the light-shielding patterns 2a described in the embodiment 1, etc.

Even in the second mask PM41, mark patterns 4b and a pellicle are identical to the embodiment 3.

Figure 29A:
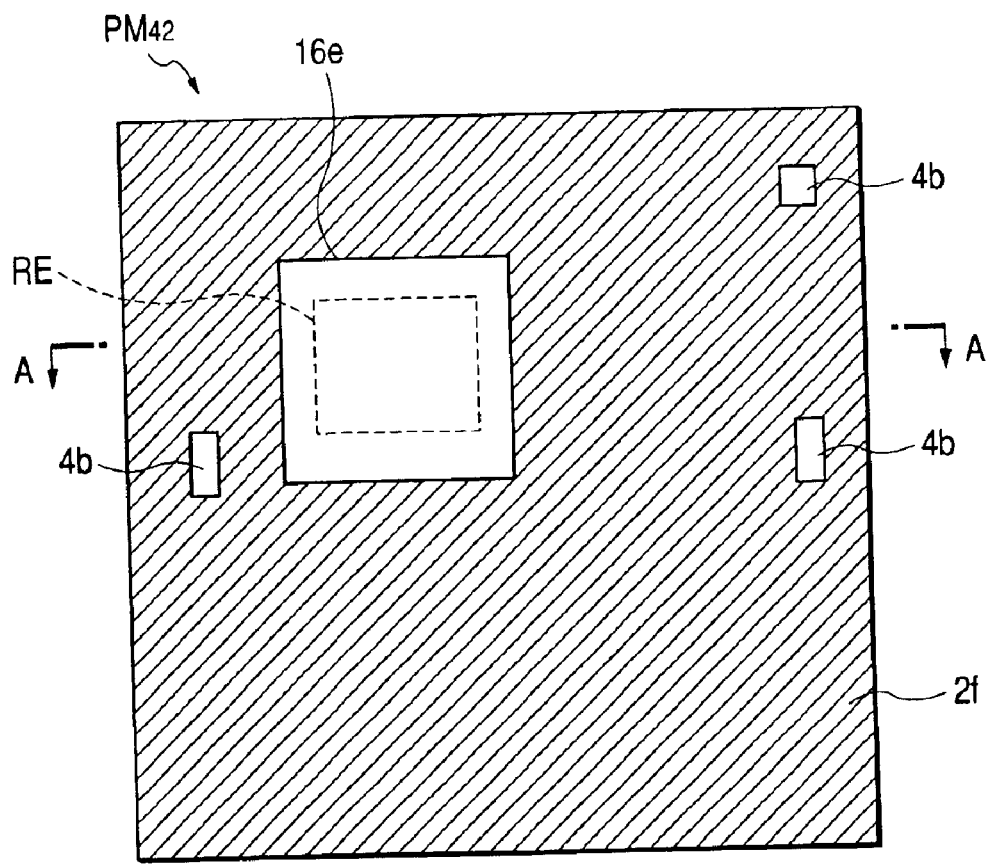
FIG. 29(a) is a plan view of the photomask shown in FIG. 28 in a correcting and changing process of light-shielding patterns each formed of a resist film.
Figure 29B:
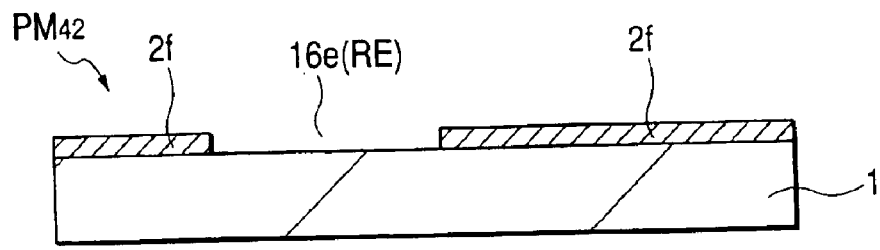
FIG. 29(b) is a cross-sectional view taken along line A—A of FIG. 29(a)
Figure 30A:
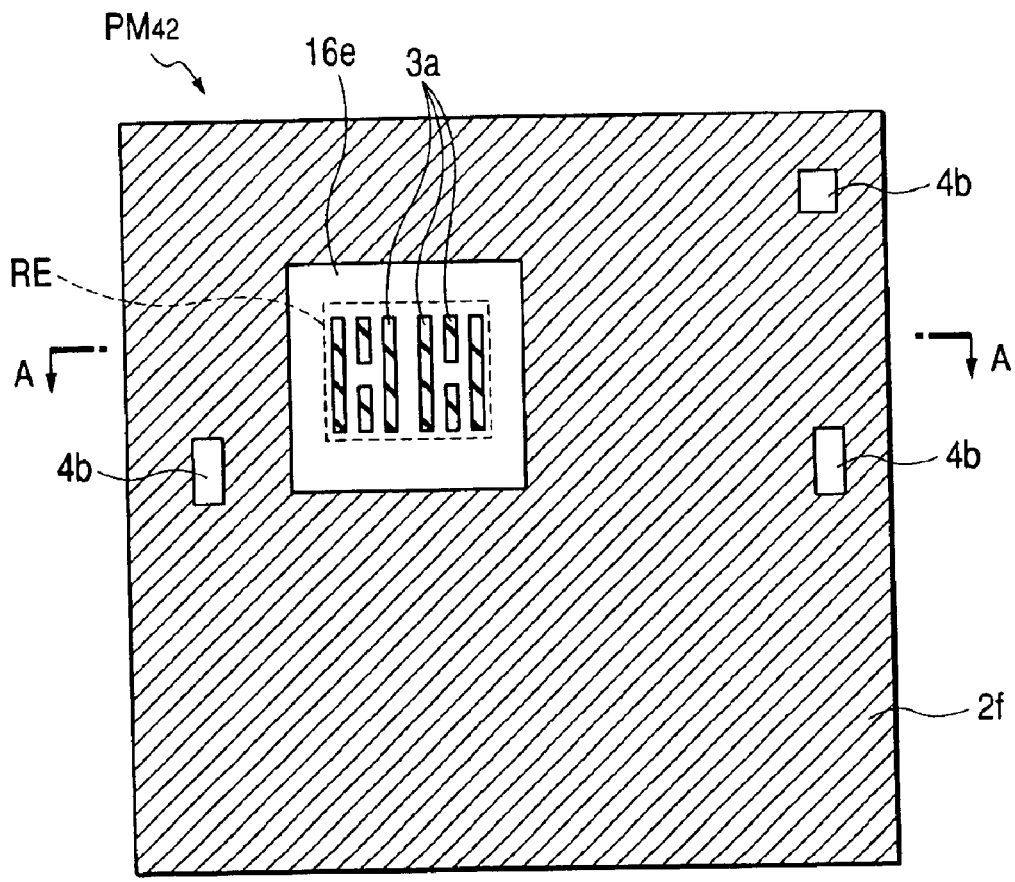
FIG. 30(a) is a plan view of the photomask shown in FIG. 28 in a correcting and changing process of light-shielding patterns each formed of a resist film.
Figure 30B:
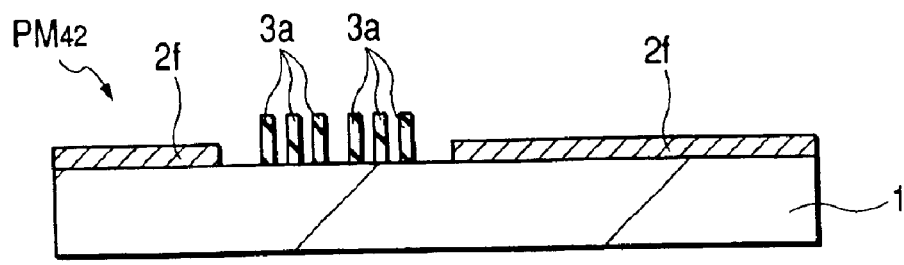
FIG. 30(b) is a cross-sectional view taken along line A—A of FIG. 30(a)

The mask PM42 is used as a mask for transferring patterns for each circuit (see FIGS. 18 through 20) comprised of the group of patterns to which the pattern corrections and changes are made in a semiconductor integrated circuit device. The way of correcting or changing the light-shielding patterns 3a in the second mask PM42 is also identical to the embodiments 1 through 3. Through the use of FIGS. 29 and 30, it will be explained in brief as follows. Incidentally, FIG. 29(a) and FIG. 30(a) are plan views of the mask PM42, and FIG. 29(b) and FIG. 30(b) are cross-sectional views taken along lines A—A of FIG. 29(a) and FIG. 30(a), respectively.

The light-shielding patterns 3a formed of the resist film, which are placed in the region RE of the mask PM42 shown in FIG. 28, are first removed as shown in FIG. 29 in a manner similar to the embodiments 1 through 3. At this time, the light-shielding film 2f formed of the metal is left behind. Subsequently, a resist film for light-shielding pattern formation is applied onto a main surface (corresponding to a surface over which a light-shielding film 2d is formed) of the mask PM42. The resist film used a negative type resist film. This is because the mask PM42 can be fabricated in Q-TAT. Namely, since the leaving of the resist film outside the integrated circuit pattern region could lead to the occurrence of foreign materials as described above, it is necessary to remove the resist film lying thereoutside. Thus, if the resist film is now formed as a positive type resist film, then even the most part of the outer periphery of the integrated circuit pattern region must be subjected to electron beam drawing, and hence time is required. However, if the negative type resist film is used, then only regions for the light-shielding patterns 3a relatively small in area may be drawn within a main surface of a mask substrate 1. It is thus possible to reduce a drawing area and shorten a drawing time. Subsequently, electron beams or the like are applied to a portion for forming a light-shielding region of the resist film to thereby draw patterns, followed by subjection to development processing, whereby light-shielding patterns 3a different in shape from the light-shielding patterns 3a shown in FIG. 28 are formed in a region RE as shown in FIG. 30. Even if the light-shielding portions (light-shielding patterns and light-shielding region) of the masks PM41 and PM42 are all formed of a metal such as chrome or the like, the mask PM42 may merely be changed as a matter of course. It is therefore possible to achieve Q-TAT upon mask manufacture.

A method of transferring patterns onto a wafer through the use of such first and second masks PM41 and PM42 will be described as follows, for example, with reference to FIG. 7 and the like.

As shown in FIG. 7, the positive type resist film 11a is applied onto the conductive film 10a formed over the wafer 8. Thereafter, the mask pattern for the first mask PM41 shown in FIG. 27 is transferred to the resist film 11a by the reduction projection exposure system 12 shown in FIG. 10. Since, at this time, exposure light passes through the light transmissive aperture region 16d of the first mask PM41, a region corresponding to the light transmissive aperture region 16d is exposed in the resist film 11a. Since, however, the region RE of the first mask PM41 is covered with the light-shielding film 2e, a region corresponding to the region RE is exposed in the resist film 11a.

Subsequently, the resist film 11a is left as it is without being removed. Next, the mask pattern for the second mask PM42 shown in FIG. 28 is transferred to the resist film 11a by the reduction projection exposure system 12 shown in FIG. 10. Contrary to the first mask PM41 at this time, only a region corresponding to the region RE of the second mask PM42 is exposed in the resist film 11a.

Thereafter, the resist film 11a is subjected to development processing to thereby form such resist patterns as to reflect the mask patterns for the first and second masks PM41 and PM42 on the conductive film 10a. Afterwards, the conductive film 10a is subjected to an etching process with the resist pattern as the etching mask to thereby form the conductive film patterns. When a correction and a change occur in the region RE of the second mask PM42 during the development and manufacturing process of the semiconductor integrated circuit device, the light-shielding patterns 3a over the second mask PM42 may be formed again in the above-described manner.

According to the present embodiment 4 such as described above, the following effect can be obtained in addition to the effects obtained in the embodiments 1 through 3.

Namely, when the light-shielding patterns 2a having less correction and change and the light-shielding patterns 3a each having a correction and a change are formed over the same mask, the process of peeling the resist film (light-shielding patterns 3a) and the process of cleaning it are effected even on the micro light-shielding patterns 2a free of the correction and change. Therefore, the light-shielding patterns 2a might be deteriorated or peeled off. On the other hand, the mask is divided into the first mask PM41 for transferring the patterns having less correction and change and the second mask PM42 for transferring the patterns subjected to the correction and change in the present embodiment 4. Thus, it is not necessary to effect the resist-film peeling and cleaning processes on the micro light-shielding patterns 2a free of the correction and change upon the correction and change of each pattern. Therefore, the light-shielding patterns 2a is no longer deteriorated and peeled off. Since the second mask PM42 includes no micro light-shielding patterns 2a, the peeling and cleaning processes can be effected on the light-shielding patterns 3a with little concern for the deterioration and peeling of the light-shielding patterns 2a. It is thus possible to extend the life of the mask and improve the reliability thereof (Embodiment 5)

The present embodiment describes a modification of a mask and illustrates a case in which the present invention is applied to a semitransparent phase shift mask (the halftone mask).

Figure 31A:
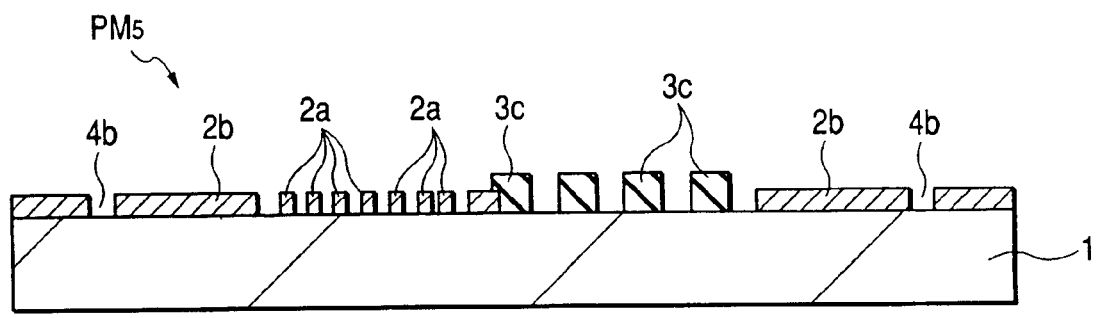
FIG. 31(a) is a cross-sectional view of a photomask showing a still further embodiment of the present invention.

FIG. 31 shows the mask PM5 according to the present embodiment 5. Halftone patterns 3c for transferring integrated circuit patterns are formed in a partial light transmissive region of an integrated circuit pattern region of the mask PM5. While the halftone patterns 3c are formed of the resist film 3 having formed the light-shielding patterns 3a described in the embodiment 1 and the like, each of them is semitransparent to each exposure light and adjusted to a thickness for inverting the phase of the exposure light. Incidentally, the halftone patterns 3c are formed over the same plane as light-shielding patterns 2a and 2b over a mask substrate 1.

Figure 31B:
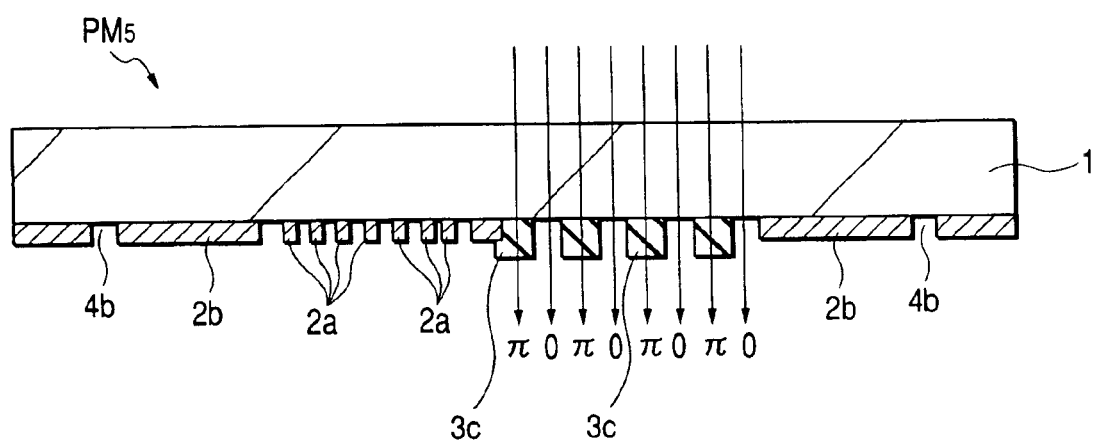
FIG. 31(b) is a cross-sectional view of the photomask, which shows the manner in which exposure lights transmitted through respective portions of the photomask of FIG. 31(a) are phase-inverted.

FIG. 31(b) shows the manner in which exposure lights emitted from the reverse side of the mask PM5 according to the present embodiment 5 are reversed in phase. Each exposure light having passed through the halftone patterns 3c is 180° out of phase with exposure light having passed through a transparent portion (light transmissive region). Namely, these exposure lights are opposite in phase to one another. The transmittance of each halftone pattern 3c is equivalent to a light intensity of about 2% to 10% of each exposure light anterior to passing through the halftone pattern 3c. Thus, while the halftone patterns 3c substantially serve as a light-shielding portion, they provide the effect of defining the boundary of transferred patterns. Incidentally, a pattern processing method of the halftone patterns 3c and a pattern changing method thereof are identical to the pattern processing method of the light-shielding patterns 3a employed in the embodiments 1 through 4 and the pattern changing method thereof.

When an ArF excimer laser is used as a light source of exposure, the absorption thereof by a resist film used as a mask is high. Therefore, the concurrent implementation of both the transmittance of about 2%~10% and the phase inversion needs to make adjustments to the resist film for the formation of the halftone patterns 3c. On the other hand, when an $F^2$ laser light having a wavelength of 157 nm is used as a light source of exposure, the absorption thereof by the resist film becomes low. Therefore, it is advantageous for the simultaneous implementation of both the transmittance of about 2%~10% and the phase inversion.

The present embodiment 5 can also bring about an effect similar to each of the embodiments 1 through 4.

(Embodiment 6)

The present embodiment 6 describes a correction of the mask according to the embodiment 5.

In the embodiment 5, there may be cases in which since a phase difference is set according to the thickness of each halftone pattern, it is necessary to set its thickness to a predetermined range, and it is difficult to set the intensity of light transmitted through each halftone pattern formed of the resist film.

Thus, the present embodiment 6 is intended to adjust the thickness of each halftone pattern and the depth (i.e., the thickness of a mask substrate at a groove or trench forming portion) of a groove or trench defined or dug in the mask substrate without setting the phase difference in light only by the thickness of the halftone pattern formed of the resist film. Thus, the following effect can be obtained in addition to the effect obtained in the embodiment 5. Namely, it is possible to easily set the intensity of the light transmitted through each halftone pattern. It is also possible to extend the range of selection of a material for the halftone patterns.

Figure 32A:
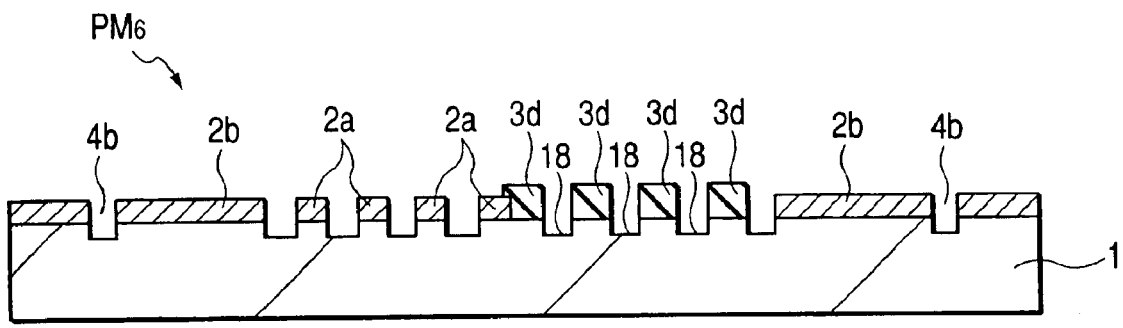
FIG. 32(a) is a cross-sectional view of a photomask showing a still further embodiment of the present invention.

FIG. 32(a) shows a specific example of the mask PM6 according to the present embodiment 6. In the mask PM6, halftone patterns 3d formed of a resist film are formed of the same material as the halftone patterns 3c employed in the embodiment 5. On the other hand, the thickness of each halftone pattern 3d is formed of a semitransparent film thinner than the halftone pattern 3c. Further, the phase inversion of transmitted light has been implemented by the thickness of the halftone pattern 3d and the thickness of a mask substrate 1a at each groove or trench 18 defined in the mask substrate 1a.

The halftone patterns 3d were formed of a novolak resin having a thickness of about 50 nm, for example. As a result, the transmittance of each halftone pattern 3d has reached 5%. However, the transmittance thereof is not limited to 5% and may be changed in various ways. The transmittance can be selected according to purposes within a range of about 2% to about 20%, for example. The phase inversion in this case was about 90°. Therefore, grooves or trenches 18 each having a depth of about 90 nm were dug in the mask substrate 1 so that exposure light transmitted through the mask PM6 were phase-inverted about 180° in total. The thickness of each halftone pattern 3d is not limited to the above and may be changed in various ways. The phase of the exposure light may be adjusted so as to be inverted according to the refractive index of a material, the wavelength of exposure light, etc.

Figure 32B:
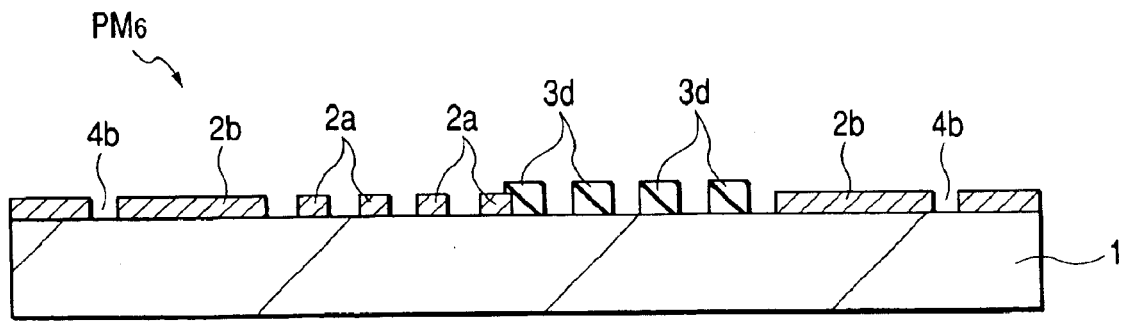
FIG. 32(b) is a cross-sectional view of the photomask of FIG. 32(a) placed during its manufacturing process.

A method of forming such a mask PM6 is as follows, for example. In a manner similar to the embodiment 5 and the like, light-shielding patterns 2a and 2b and halftone patterns 3d are first formed over a mask substrate 1 as shown in FIG. 32(b). Subsequently, the light-shielding patterns 2a and 2b and the halftone patterns 3d are used as etching mask and the mask substrate 1 exposed therefrom is selectively removed by etching by the above depth. Consequently, the trenches 18 shown in FIG. 32(a) are defined in self alignment with the halftone patterns 3d. In the present embodiment 6, the mask PM6 having the halftone patterns 3d whose transmittance is 5%, for example, could be manufactured in this way. Incidentally, while the mask substrate 1 in each mark pattern 4b region is also removed by etching and subjected to digging upon formation of the trenches 18 in the illustration of FIG. 32(a) in the interests of simplicity of a mask manufacturing process, the removal of the mask substrate 1 portions in the regions by etching may be avoided. When it is desired to correction and change the halftone patterns 3d in the mask PM6, their correction and change are executed before the formation of the trenches 18.

The present embodiment 6 can also obtain an effect similar to each of the embodiments 1 through 5.

(Embodiment 7)

The present embodiment 7 describes a correction of the mask according to each of the embodiments 5 and 6.

The present embodiment 7 is intended to provide another film superimposed on halftone patterns on a plane basis to thereby adjust the phase of the exposure light without adjusting the phase thereof by the halftone patterns alone, for the purpose of solving the problem described in the embodiment 6. Thus, according to the present embodiment 7, the intensity of light transmitted through the halftone patterns can easily be set in a manner similar to the embodiment 6. It is also possible to extend the range of selection of materials used for forming the halftone patterns.

Figure 33A:
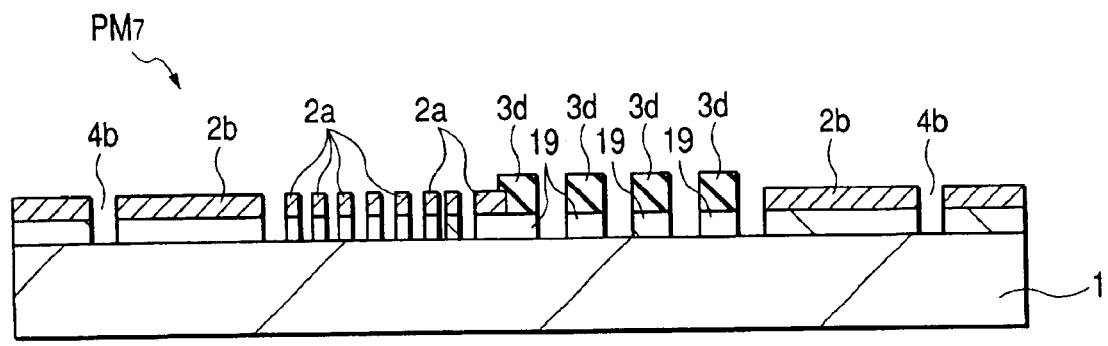
FIG. 33(a) is a cross-sectional view of a photomask showing a still further embodiment of the present invention.

FIG. 33(a) shows a specific example of a mask PM7 according to the present embodiment 7. In the mask PM7, a transparent phase adjustment film 19 formed of a silicon oxide film, fore example, is provided between halftone patterns 3d formed of a resist film, which are similar to the embodiment 6, and a mask substrate 1. The thickness of each halftone pattern 3d and that of the phase adjustment film 19 are adjusted to implement the phase inversion.

Figure 33B:
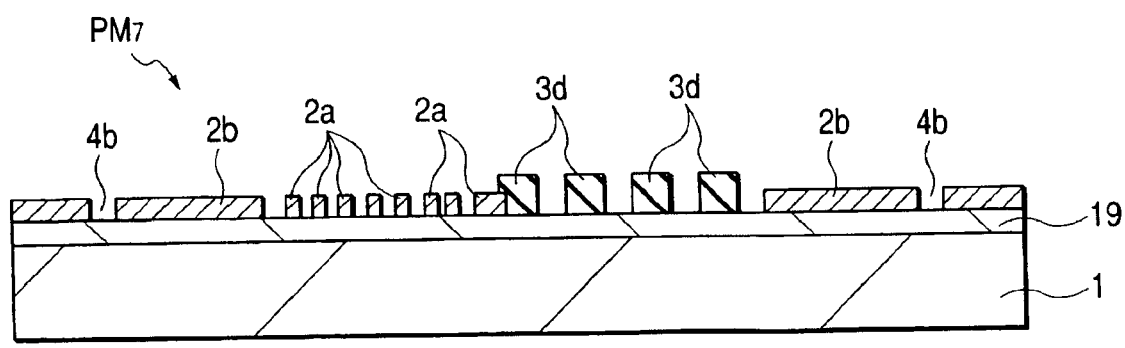
FIG. 33(b) is a cross-sectional view of the photomask of FIG. 33(a) placed during its manufacturing process.

A method of forming such a mask PM7 is as follows, for example. As shown in FIG. 33(b), a phase adjustment film 19 formed of a silicon oxide film, for example, is first formed over a main surface of a mask substrate 1 by a sputtering method, a CVD (Chemical Vapor Deposition) method, or a coating or application method or the like. Subsequently, light-shielding patterns 2a and 2b and halftone patterns 3d are formed over the phase adjustment film 19 in a manner similar to the embodiments 5, 6 and the like. Since the phase inversion was about 90° in the case of the halftone patterns 3d alone as described above, the phase adjustment film 19 placed below the halftone patterns 3d and the light-shielding patterns 2a and 2b was thereafter subjected to digging to reach about 90 nm, for example with both patterns as etching masks to thereby obtain a phase inversion of about 180° in total. At this time, the mask substrate 1 may be used as an etching stopper. The mask PM7 shown in FIG. 33(a) is manufactured in this way. Even in the case of the present embodiment 7, a halftone type mask PM7 having a transmittance of 5%, for example, could be fabricated. Incidentally, the thickness of each halftone pattern 3d is not limited to the above in a manner similar to the embodiment 6. In the interests of simplicity of a mask manufacturing process even in the case of the present embodiment 7, the phase adjustment film 19 in each mark pattern 4b region is removed by etching upon patterning of the phase adjustment film 19. However, the removal of the phase adjustment film 19 portions in the regions by etching may be avoided. In this case, the halftone patterns 3d of the mask PM7 may preferably be corrected and changed before the phase adjustment film 19 is subjected to an etching process.

The present embodiment 7 can also obtain an effect similar to each of the embodiments 1 through 6.

(Embodiment 8)

The present embodiment 8 describes corrections of the mask according to each of the embodiments 5 through 7 and its manufacturing method.

One example of a method of manufacturing a mask according to the present embodiment 8 will be explained with reference to FIG. 34.

Figure 34A:
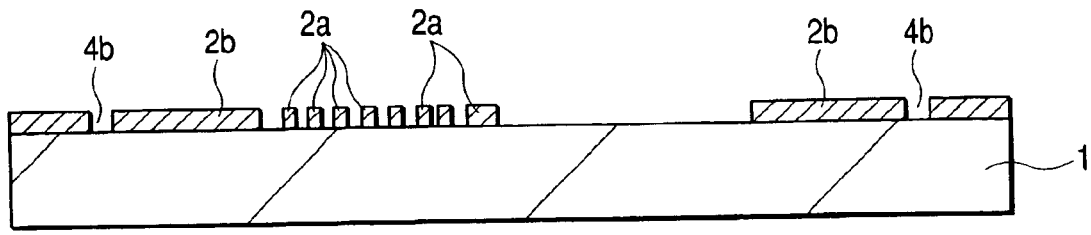
FIGS. 34(a) through 34(d) are respectively cross-sectional views of a photomask showing a still further embodiment of the present invention, which is placed during its manufacturing process.
Figure 34B:
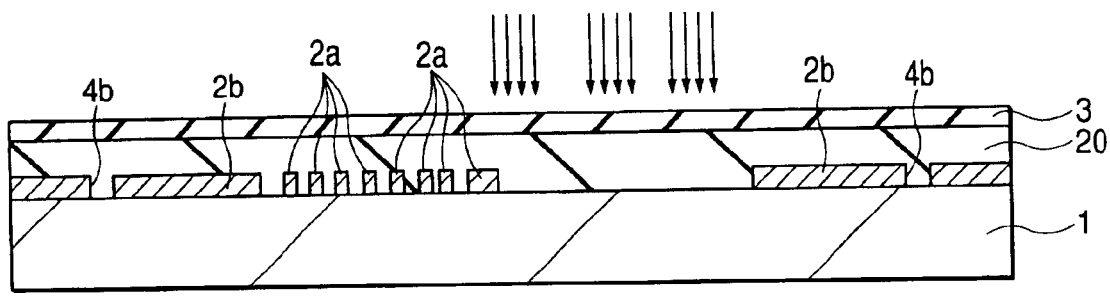
Figure 34C:
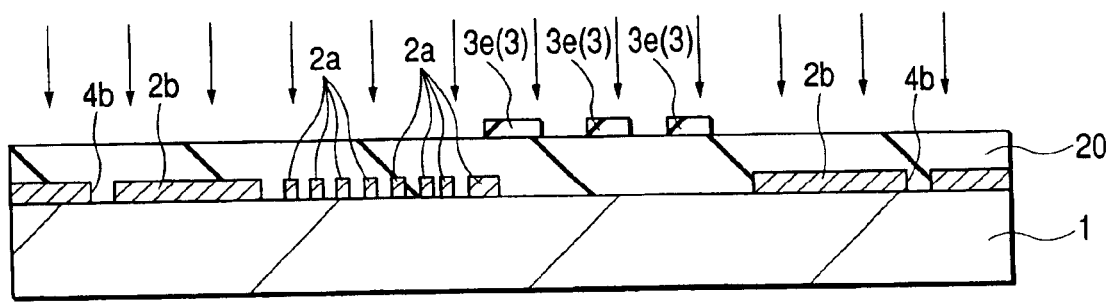

As shown in FIG. 34(a), the light-shielding patterns 2a and 2b and mark patterns 4b, etc. are first formed over a main surface of a mask substrate 1 in a manner similar to the embodiments 1 through 7. Subsequently, as shown in FIG. 34(b), a resist film 20 transparent to each exposure light is applied onto the main surface of the mask substrate 1 so as to cover the light-shielding patterns 2a and 2b and the surface of the mask substrate 1. Further, a resist film 3 having such a light-shielding characteristic or effect as employed in the embodiment 5 is formed over the resist film 20 as a thin film and made semitransparent. In the present embodiment, for example, PGMA24 (Poly Glycidyl Methacrylate) or the like indicative of a positive type was used as the transparent resist film 20. Further, the light-shielding resist film 3 was formed of, for example, a novolak resin indicative of a negative type and having a thickness of about 50 nm. Thereafter, a desired integrated circuit pattern was drawn over the resist film 3 by electron beams or the like. Even in the present embodiment, the antistatic process was done. Afterwards, the normal development processing is carried out to develop the resist film 3, whereby halftone patterns 3e each formed of the resist film 3 are formed as shown in FIG. 34(c).

Figure 34D:
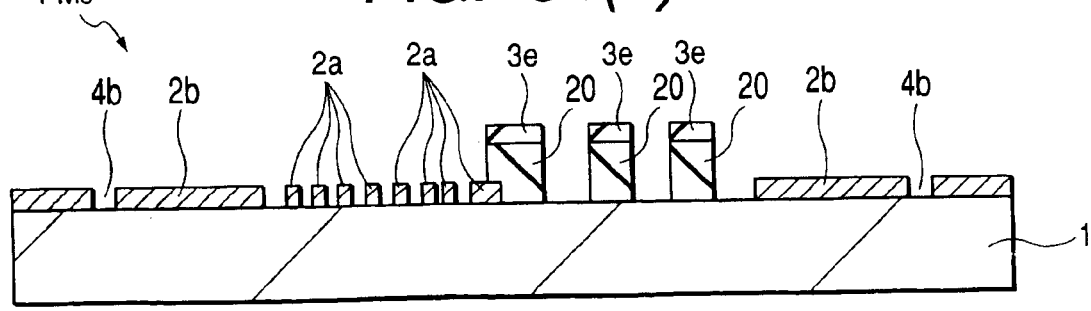

Next, the normal exposing process is effected on the main surface of the mask substrate 1 to thereby expose resist film 20 portions made bare from the halftone patterns 3e each having a light-shielding characteristic, followed by development thereof, whereby a phase adjustment film formed of the resist film 20 is formed in self alignment with each halftone pattern 3e as shown in FIG. 34(d). The mask PM8 was fabricated in this way.

In the mask PM8, the resist film 20 (phase adjustment film) is provided only below the halftone patterns 3e. The phase of each exposure light transmitted through the mask PM8 is adjusted according to the thickness of each halftone pattern 3e and that of the resist film 20 (phase adjustment film). Thus, the phase could be inverted 180° by light transmitted through layered pattern regions of the halftone patters 3e and the resist film 20 (phase adjustment film) and light transmitted through the mask substrate 1 alone. The transmittance of each layered pattern region has reached about 5%. Namely, the mask PM8 having the halftone patterns 3e each having the transmittance of 5%, for example, could be fabricated in a manner similar to the embodiments 6, 7 and the like. In this case, the halftone patterns 3e may be corrected or changed even after the resist film 20 has been pattern-processed. Namely, when the change in pattern is made, both the halftone patterns 3e and the resist film 20 may be removed, and the procedure may be re-executed from the application of a resist film 20.

The present embodiment 8 can also obtain an effect similar to each of the embodiments 1 through 7.

(Embodiment 9)

The present embodiment 9 describes a modification of a mask and illustrates an example of a combination of a normal halftone mask and a halftone mask using such a resist film as employed in each of the embodiments 5 through 8.

Figure 35A:
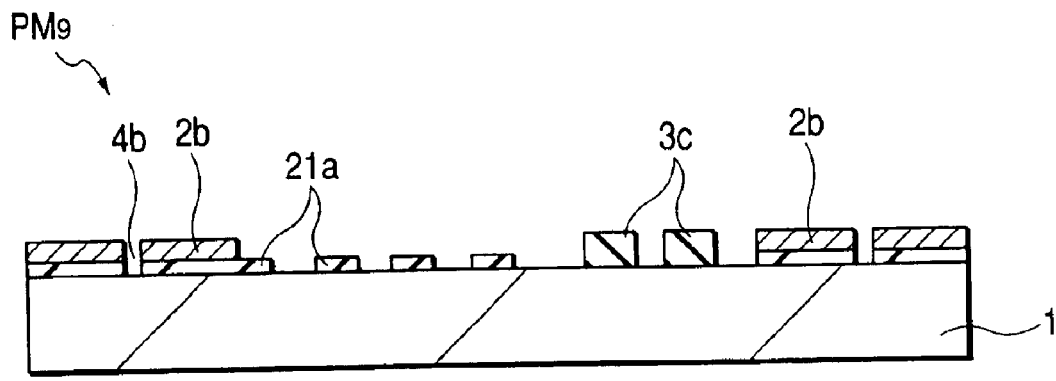
FIG. 35(a) is a cross-sectional view of a photomask showing a still further embodiment of the present invention.

FIG. 35 shows a specific example of a mask PM9 according to the present embodiment 9. The mask PM9 illustrates, as an example, a mask for transferring line patterns like wirings or the like onto a wafer with halftone patterns. In the present embodiment, normal halftone patterns 21a comprised of, for example, MoSiOx or MoSiON or the like, and halftone patterns 3c formed of the resist film described in the embodiments 5 through 8 are formed in patterns within an integrated circuit pattern region over a main surface of a mask substrate 1. The thickness of each halftone pattern 3c was set to a thickness required to invert the phase, and a thickness that satisfies a desired light-shielding characteristic in a manner similar to the embodiments 5 through 8. Accordingly, the difference in phase between transmitted lights is not limited to 180° and can be selected to various ones such as 540°, 900°.

Figure 35B:
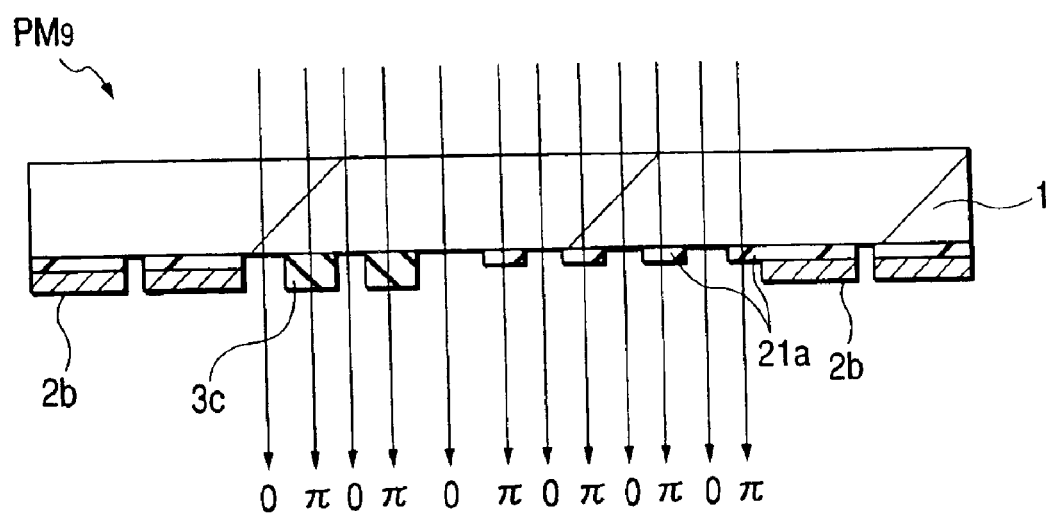
FIG. 35(b) is a cross-sectional view of the photomask, which shows the manner in which exposure lights transmitted through respective portions of the photomask of FIG. 35(a) are phase-inverted.

FIG. 35(b) shows the manner of phase inversion of each exposure light applied from the reverse side of the mask PM9. The exposure lights transmitted through the halftone patterns 3c and 21a are 180° out of phase with exposure lights transmitted through a transparent portion (light transmissive region). Namely, these exposure lights are opposite in phase to one another.

One example of a method of manufacturing the mask PM9 will next be described with reference to FIG. 36.

Figure 36A:
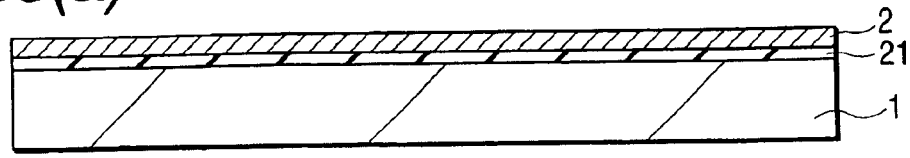
FIGS. 36(a) through 36(e) are respectively cross-sectional views of the photomask shown in FIG. 35, which is placed during its manufacturing process.
Figure 36B:
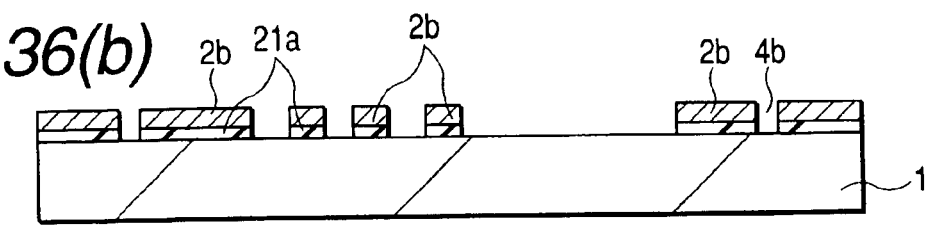
Figure 36C:
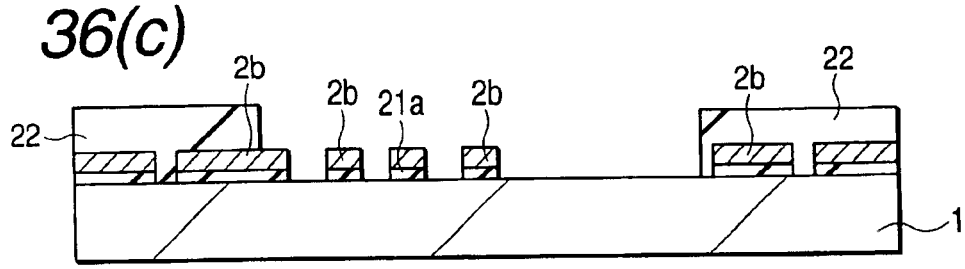
Figure 36D:
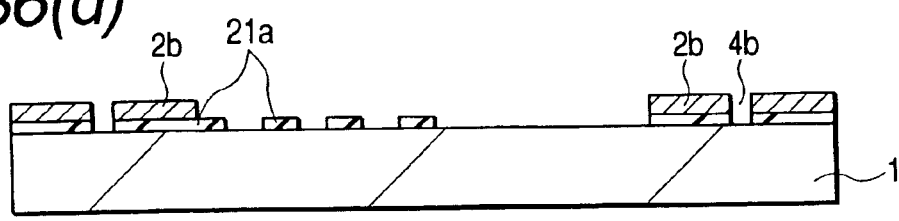
Figure 36E:
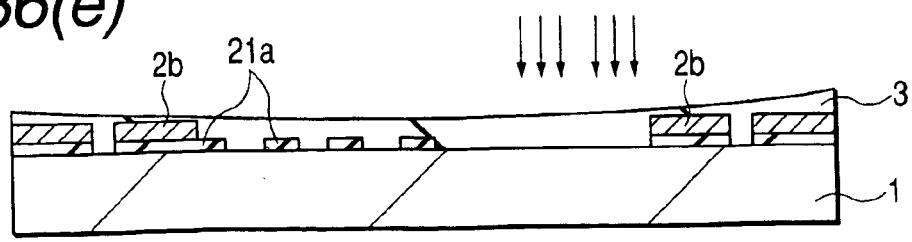

As shown in FIG. 36(a), a halftone film 21 comprised of, for example, MoSiOx or MoSiON or the like is deposited over a main surface of a mask substrate 1 by a sputtering method or a CVD method, for example. Thereafter, a light-shielding film 2 comprised of the metal for the light-shielding film is deposited over the halftone film 21 by the sputtering method or the like. Subsequently, the light-shielding film 2 and the halftone film 21 are pattern-processed by normal photolithography and etching technologies to thereby form halftone patterns 21a, light-shielding patterns 2b and mark patterns 4b as shown in FIG. 36(b). Thereafter, a resist film 22 is formed so as to cover light-shielding patterns 2b other than regions for forming the halftone patterns 21a, as shown in FIG. 36(c). Afterwards, the light-shielding film 2 exposed from the resist film 22 is removed with the resist film 22 as an etching mask, thereby exposing the halftone patterns 21a as shown in FIG. 36(d). Thereafter, as shown in FIG. 36(e), a resist film 3 for a light-shielding mask is applied and electron beams are applied to a predetermined position to thereby form halftone patterns 3c comprised of the resist film 3 shown in FIG. 35. A method of correcting and changing the halftone patterns 3c is identical to the embodiment 1 and the like.

The present embodiment 9 can also obtain an effect similar to each of the embodiments 1 through 7.

(Embodiment 10)

The present embodiment 10 describes a modification of a mask and illustrates an example of a combination of a Levenson type phase shift mask and a light-shielding pattern mask using the resist film employed in each of the embodiments 1 through 4.

Figure 37A:
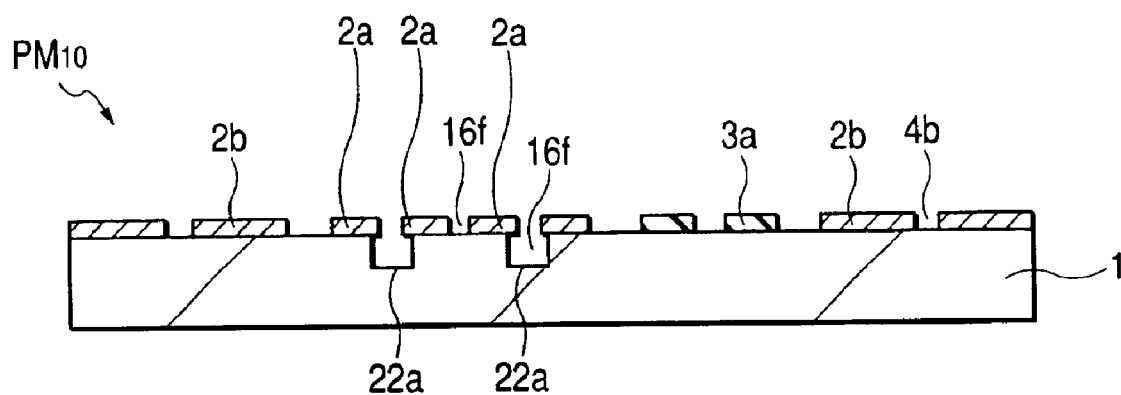
FIG. 37(a) is a cross-sectional view of a photomask showing a still further embodiment of the present invention.

FIG. 37 shows a specific example of a mask PM10 according to the present embodiment 10. In the present embodiment, the mask PM10 for transferring line patterns like wirings or the like onto a wafer is illustrated by way of example. A Levenson type phase shift pattern region (corresponding to the left side of FIG. 37(a)) and a region (corresponding to the right side of FIG. 37(a)) for forming the light-shielding patterns 3a formed of the resist film described in the embodiments 1 through 4 are disposed in an integrated circuit pattern region over a main surface of the mask PM10.

Figure 37B:
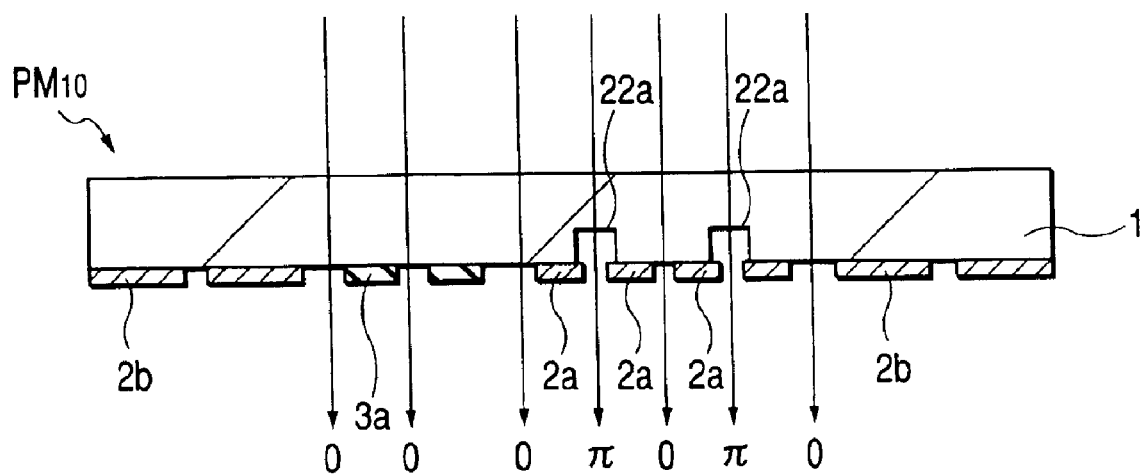
FIG. 37(b) is a cross-sectional view of the photomask, which shows the manner in which exposure lights transmitted through respective portions of the photomask of FIG. 37(a) are phase-inverted.

A plurality of metal light-shielding patterns 2a, light transmissive patterns 16f adjacent to one another with the light-shielding patterns 2a interposed therebetween, and phase shifters 22a disposed in ones of the adjacent light transmissive patterns 16f are disposed in the Levenson type phase shift pattern region. The phase shifters 22a are respectively configured as groove or trench type shifters, for example. As the trench type shifter, a structure can be adopted wherein part of each trench, which extends in its transverse direction, is overhung over a lower portion of each light-shielding pattern 2a. It is thus possible to improve the accuracy of pattern transfer. FIG. 37(b) shows the manner of phase inversion of each exposure light applied from the reverse side of the mask PM10. The exposure lights transmitted through the phase shifters 22a are respectively 180° out of phase with the exposure lights transmitted through the light transmissive patterns 16f free of the phase shifters 22a. Namely, these exposure lights are opposite in phase to one another. On the other hand, the light-shielding patterns 3a are identical to those described in the embodiment 1 or the like. It is thus possible to easily correct and change the light-shielding patterns 3a.

Such a mask PM10 may preferably be applied to a semiconductor integrated circuit device having a memory such as a DRAM or the like. The scale-down of elements and wirings in each memory cell region is proceeding in the semiconductor integrated circuit device having the memory such as the DRAM. Therefore, there may be cases in which if the Levenson type phase shift mask is not used, then the transfer of patterns cannot be performed upon formation of word lines, data lines or hole patterns. On the other hand, it is not necessary to use the Levenson type phase shift mask in a peripheral circuit region other than the memory cell region and other logic circuit regions. However, patterns for a peripheral circuit and a logic circuit might be changed in various ways according to customer's requests and the specifications of a product. The mask PM10 can cope with both demands. Namely, patterns for micro elements and wirings can be transferred on the memory cell region side, and circuits other than the memory cell region are capable of flexibly coping with various pattern shapes and changes in a short period of time. Since their modifications and changes are allowed from a stage subsequent to the formation of the trenches for the phase shifters, a mask manufacturing time can be shortened. Except for it, the present embodiment 10 can also obtain an effect similar to each of the embodiments 1 through 9.

(Embodiment 11)

The present embodiment 11 describes a modification of a mask and illustrates an example of a combination of a normal Levenson type phase shift mask and a Levenson type phase shift mask comprised of light-shielding patterns using the resist film employed in each of the embodiments 1 through 4.

Figure 38:
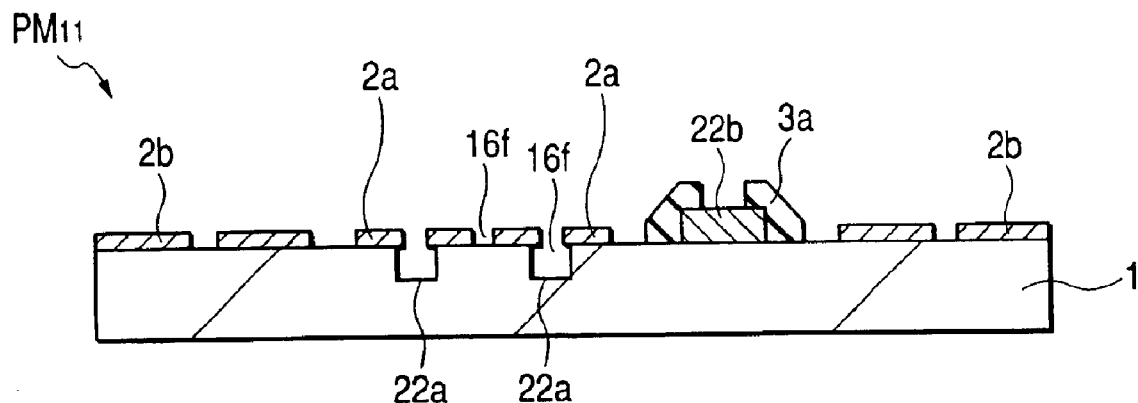
FIG. 38 is a cross-sectional view of a photomask showing a still further embodiment of the present invention.

FIG. 38 shows a specific example of a mask PM11 according to the present embodiment 11. The mask PM11 for transferring line patterns like wirings or the like onto a wafer is illustrated by way of example. A Levenson type phase shift pattern region (corresponding to the left side of FIG. 38) and a Levenson type phase shift pattern region (corresponding to the right side of FIG. 38) constituted of light-shielding patterns 3a formed of the resist film described in the embodiments 1 through 4 are laid out in an integrated circuit pattern region over a main surface of the mask PM11.

Since the Levenson type phase shift pattern region on the left side of FIG. 38 is identical to the embodiment 10, the description thereof will be omitted. A phase shifter 22b formed of a photosensitive transparent film like a photosensitive SOG film or the like, for example, is formed in patterns on the right side of FIG. 38. Further, light-shielding patterns 3a each formed of a resist film are formed in patterns so as to cover the sides of the phase shifter 22 and the neighborhood of the sides thereof. A light transmissive pattern 16g for exposing part of a main surface of a mask substrate 1 and a light transmissive pattern 16h for exposing part of the upper surface of the phase shifter 22b are formed of the light-shielding patterns 3a. The phases of respective lights transmitted through the light-shielding patterns 16g and 16h adjacent to each other are 180° out of phase with each other.

In order to manufacture such a mask PM11, light-shielding patterns 2a and 2b formed of a metal are first formed over the main surface of the mask substrate 1 in a manner similar to the normal mask. Thereafter, trenches are dug in predetermined portions of the main surface of the mask substrate 1 to thereby form phase shifters 22a. Subsequently, a photosensitive SOG film or the like is applied onto the main surface of the mask substrate 1 and pattern-processed by a photolithography technology to thereby form phase shifters 22b. Afterwards, the light-shielding film forming resist film is applied onto the main surface of the mask substrate 1 and thereafter subjected to pattern processing by the photolithography technology to thereby form light-shielding patters 3a.

The present embodiment 11 can also obtain an effect similar to each of the embodiments 1 through 9.
(Embodiment 12)

The present embodiment 12 describes a modification of a mask and illustrates an example of a combination of a normal mask and a Levenson type phase shift mask comprised of light-shielding patterns formed of the resist film employed in the embodiment 11.

Figure 39:
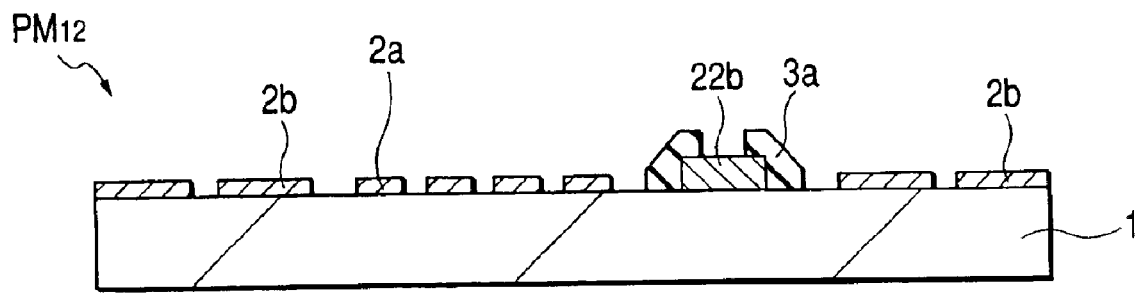
FIG. 39 is a cross-sectional view of a photomask showing a still further embodiment of the present invention.

FIG. 39 shows a specific example of a mask PM12 according to the present embodiment 12. The mask PM12 for transferring line patterns like wirings or the like onto a wafer is illustrated by way of example. A normal mask pattern region (corresponding to the left side of FIG. 39) and a Levenson type phase shift pattern region (corresponding to the right side of FIG. 39) constituted of light-shielding patterns 3a formed of the resist film described in the embodiment 11 are laid out in an integrated circuit pattern region over a main surface of the mask PM12. A method of manufacturing the mask PM12 is substantially identical to the embodiment 11, and is different therefrom in that a process for forming trench type phase shifters 22a is not provided.

The present embodiment 12 can also obtain an effect similar to each of the embodiments 1 through 9.
(Embodiment 13)

The present embodiment 13 describes a modification of a mask.

Since patterns over the mask are removed in the mask according to the present embodiment as described above, light-shielding patterns formed of a metal need a certain degree of resistance characteristics. Thus, a protective coat or film is formed over the surfaces of the light-shielding patterns formed of the metal in the embodiment 13.

Figure 40A:
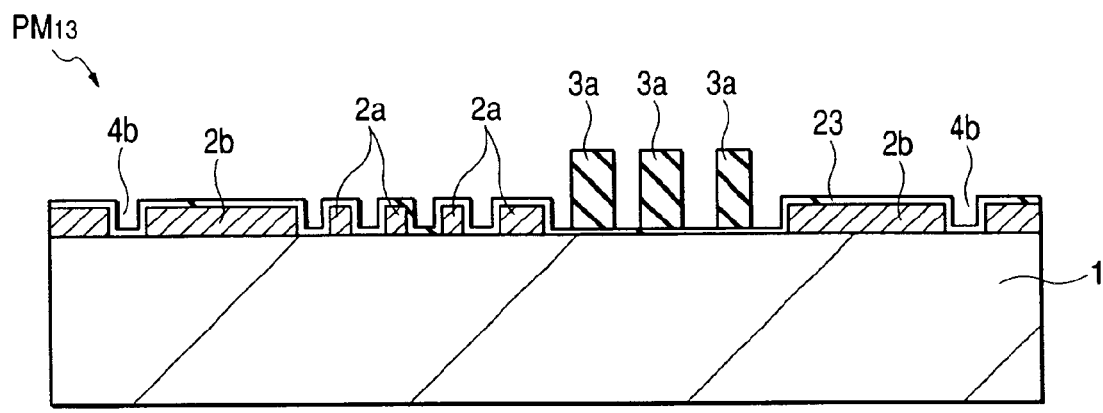
FIG. 40(a) is a cross-sectional view of a photomask showing a still further embodiment of the present invention.
Figure 40B:
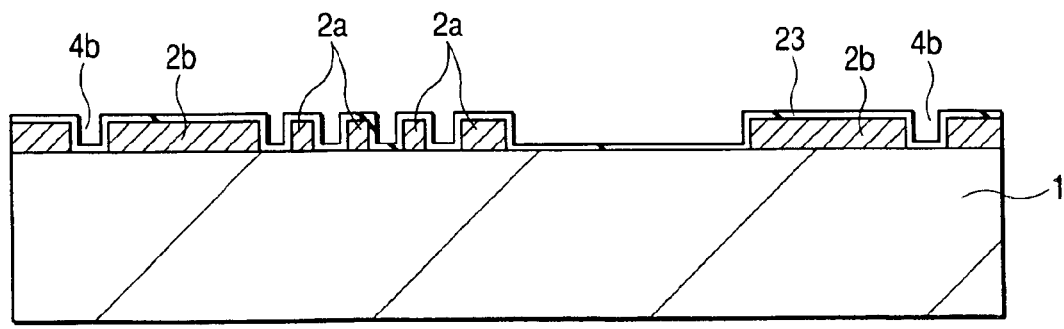
FIG. 40(b) is a cross-sectional view illustrating the photomask of FIG. 40(a) at the time of a pattern correction and change.

FIG. 40(a) shows a specific example of a cross-section of a mask PM13 according to the present embodiment 13. A thin protective coat or film 23 comprised of a silicon oxide film or the like, for example, is placed over the surfaces (upper and side faces of light-shielding patterns 2a and 2b) of the metal light-shielding patterns 2a and 2b formed over a mask substrate 1 and the surface of the mask substrate 1. Thus, the light-shielding patterns 2a and 2b can be protected upon peeling of a resist film (light-shielding patterns 3a) of the mask PM13 and its cleaning process. It is therefore possible to improve resistance characteristics of the light-shielding patterns 2a and 2b. When the light-shielding patterns 2a for transferring micro integrated circuit patterns are formed in particular, a main structure for covering the whole surface of each light-shielding pattern 2a with the protective coat 23 is preferable to enhance resistance to the peeling of the light-shielding patterns 2a. The protective coat 23 is formed by, for example, a CVD method or a sputtering method or the like after the light-shielding patterns 2a and 2b have been subjected to pattern processing. The light-shielding patterns 3a each formed of the resist film are formed in patterns over the protective coat 23. FIG. 40(b) shows a state in which the light-shielding patterns 3a have been removed. In order to form new or additional light-shielding patterns, a light-shielding pattern forming resist film is applied in a manner similar to the embodiment 1, and patterns may be drawn onto it through the use of electron beams or the like. Incidentally, the present structure can be applied to any of the masks according to the embodiments 1 through 12.

In addition to the effects obtained in the embodiments 1 through 12, the present embodiment 13 can obtain an effect in that the life span of the mask PM13 can be extended.
(Embodiment 14)

The present embodiment 14 describes a modification of the embodiment 13.

Figure 41A:
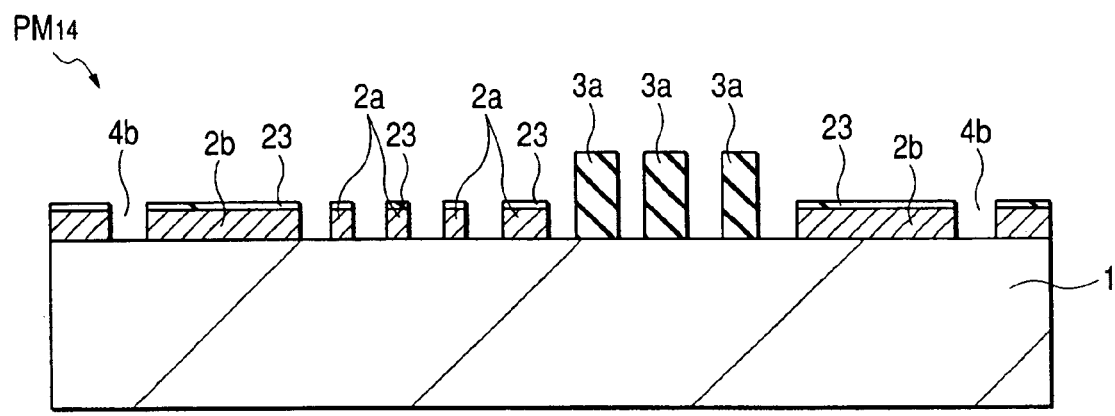
FIG. 41(a) is a cross-sectional view of a photomask showing a still further embodiment of the present invention.
Figure 41B:
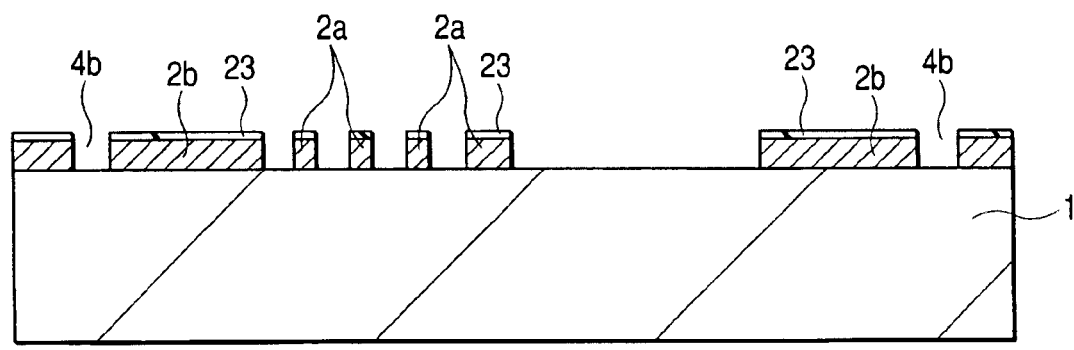
FIG. 41(b) is a cross-sectional view illustrating the photomask of FIG. 41(a) at the time of a pattern correction and change.

FIG. 41(a) shows a specific example of a cross-section of a mask PM14 according to the embodiment 14. The present embodiment 14 shows, as an example, a case in which a protective coat or film 23 is placed only over upper surfaces of light-shielding patterns 2a and 2b. The protective coat 23 in this case is formed simultaneously when a light-shielding film is deposited over a mask substrate 1 by a sputtering method, the protective coat 23 is thereafter deposited over the light-shielding film by a CVD method or sputtering method or the like, and the light-shielding film is pattern-processed to form the light-shielding patterns 2a and 2b. Except for it, the present embodiment 14 is identical to the embodiment 13. FIG. 41(b) shows a state in which light-shielding patterns 3a have been removed. Even in this case, the resistance characteristics of the light-shielding patterns 2a and 2b can be improved and the life span of the mask PM14 can be extended.
(Embodiment 15)

The present embodiment 15 describes a modification of a mask.

According to the discussions of the present inventors, it has been found that the formation of a transparent protective coat or film for covering light-shielding patterns formed of a resist film, which are used to form the integrated circuit patterns and mark patterns after the light-shielding patterns have been formed over a main surface of a mask substrate, is also effective. Thus, the light-shielding patterns formed of the resist film can be improved in mechanical strength. Blocking oxygen by the protective coat allows prevention of a change in the quality of each light-shielding pattern formed of the resist film.

Figure 42A:
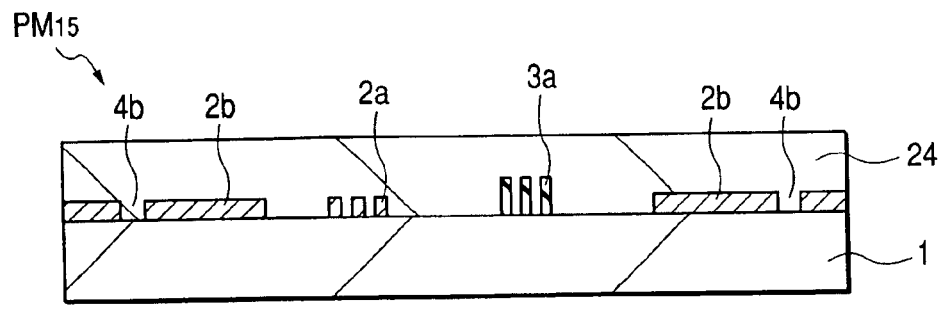
FIG. 42(a) is a cross-sectional view of a photomask showing a still further embodiment of the present invention.
Figure 42B:
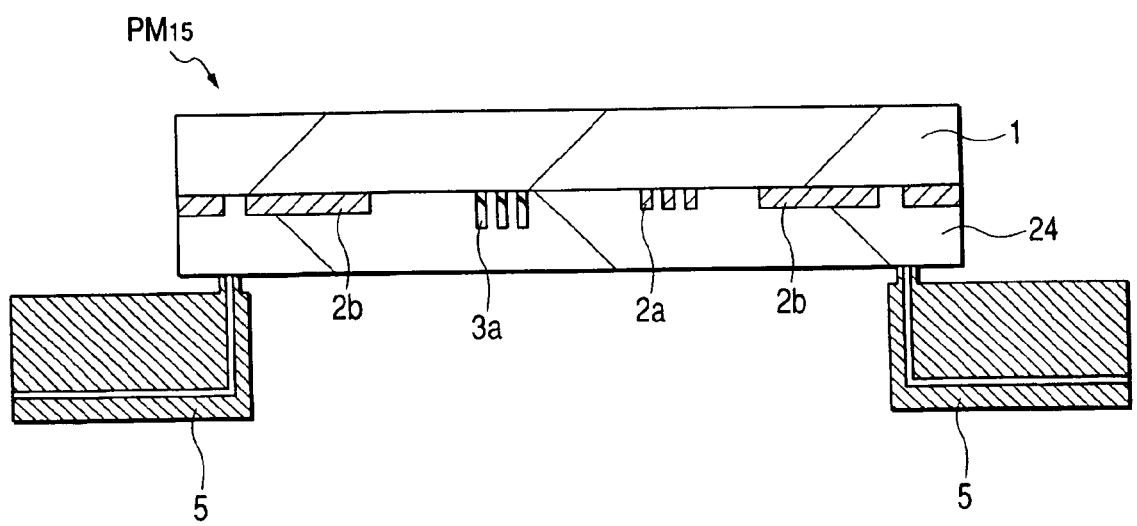
FIG. 42(b) is an explanatory view of the photomask shown in FIG. 42(a) at the time that it is mounted to an exposure system.

FIG. 42 shows a specific example thereof. A protective coat 24 comprised of, for example, a silicon oxide film or a coated silicon compound is formed over the whole main surface of a mask substrate 1 that constitutes a mask PM15. When the protective coat 24 is comprised of the silicon oxide film or the like, it may be formed by, for example, a sputtering method or CVD method. On the other hand, when the protective coat 24 is comprised of the coated silicon compound, it may be heat-treated at temperatures ranging from 100° C. to 200° C., for example after it has been applied.

In the mask PM15 according to the present embodiment 15, the protective coat 24 is deposited over the entire main surface of the mask substrate 1 so as to cover light-shielding patterns 2a, 2b and 3a. Namely, when the mask PM15 is mounted to an inspection apparatus, an exposure system or the like, the protective coat 24 of the mask PM15 takes a structure brought into contact with a mounting portion of the inspection apparatus or the exposure system or the like. Thus, since the mounting portion 5 of the inspection apparatus or the exposure system or the like is not brought into direct contact with patterns (light-shielding patterns 3a, etc.) each formed of a resist film, over the mask substrate 1 in a manner similar to the embodiments 1 through 14, it is possible to prevent peeling and scraping of the resist film due to its mounting and prevent the occurrence of foreign materials due to it. Incidentally, the present structure can be applied even to the photomasks according to the embodiments 1 through 14.

(Embodiment 16)

The present embodiment 16 explains a problem which arises when light-shielding patterns formed of a metal and light-shielding patterns formed of a resist film are formed over a mask, and means for solving the problem.

Figure 43A:
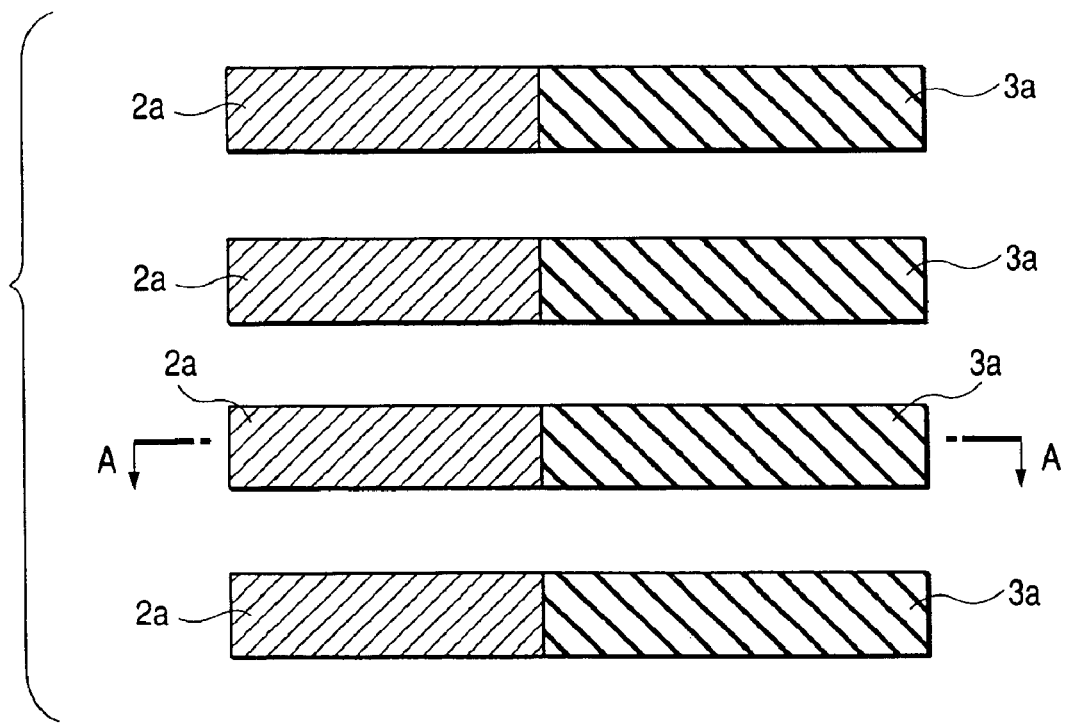
FIG. 43(a) is a plan view of portions where light-shielding patterns each formed of a metal and light-shielding patterns each formed of a resist film both of which are employed in a photomask showing a still further embodiment of the present invention, are connected to one another.
Figure 43B:
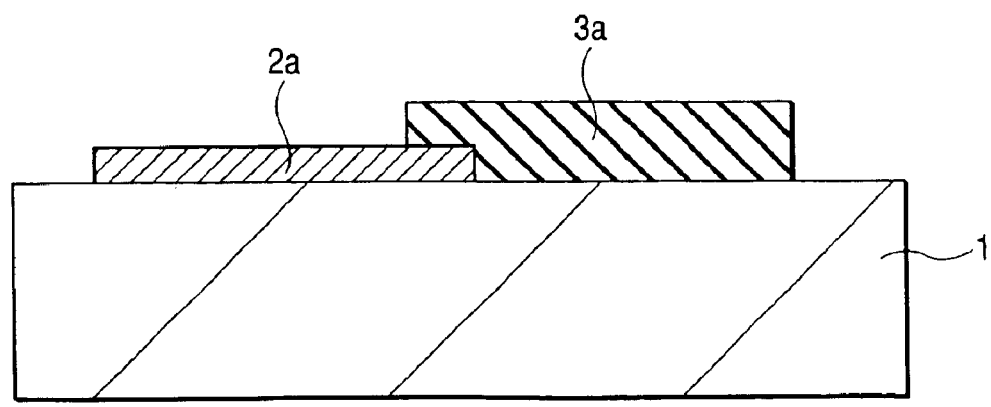
FIG. 43(b) is a cross-sectional view taken along line A—A of FIG. 43(a)

FIG. 43(a) is a fragmentary plan view of a mask for transferring a plurality of line patterns adjacent to one another over a wafer and illustrates portions where light-shielding patterns 2a formed of a metal, for transferring the line patterns and light-shielding patterns 3a formed of a resist film, for transferring them are connected. FIG. 43(b) is a cross-sectional view taken along line A—A of FIG. 43(a).

Figure 44A:
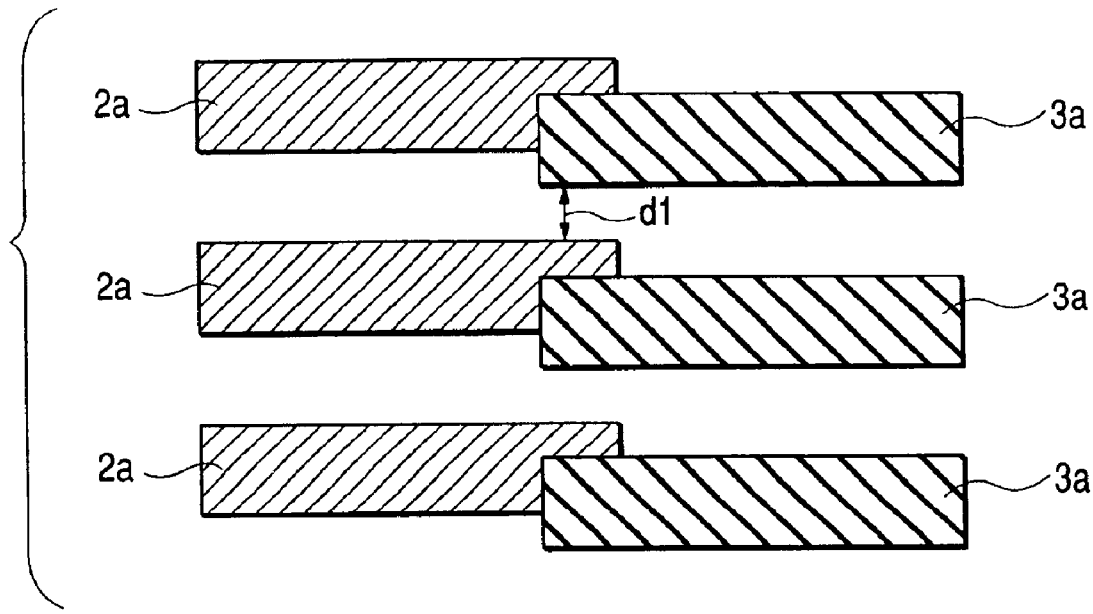
FIGS. 44(a) and 44(b) are views for describing positional displacements developed between light-shielding patterns each formed of a metal and light-shielding patterns each formed of a resist film both of which are employed in a photomask showing a still further embodiment of the present invention.
Figure 44B:
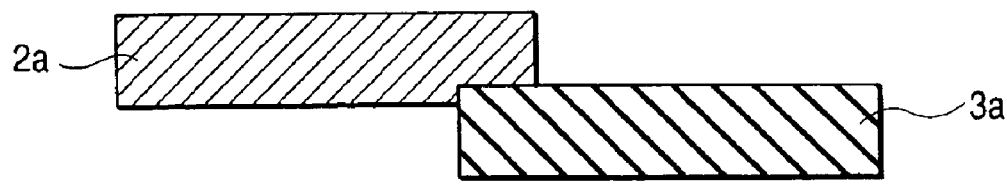

The present embodiment shows, as an example, a case in which the light-shielding patterns 2a and 3a overlap each other without shifts in position. Since, however, the light-shielding patterns 2a and 3a are respectively separately pattern-processed, the alignment therebetween is not always laid out satisfactorily. The patterns might be shifted in their width directions as shown in FIG. 44(a). Such shifts in pattern position will cause a problem that an interval d1 between adjacent patterns cannot be ensured. Even in the case of a portion where the isolated light-shielding patterns 2a and 3a overlap each other as shown in FIG. 44(b), there may be cases in which the respective patterns are greatly shifted in their width directions and hence sufficient connected states cannot be ensured.

Figure 45A:
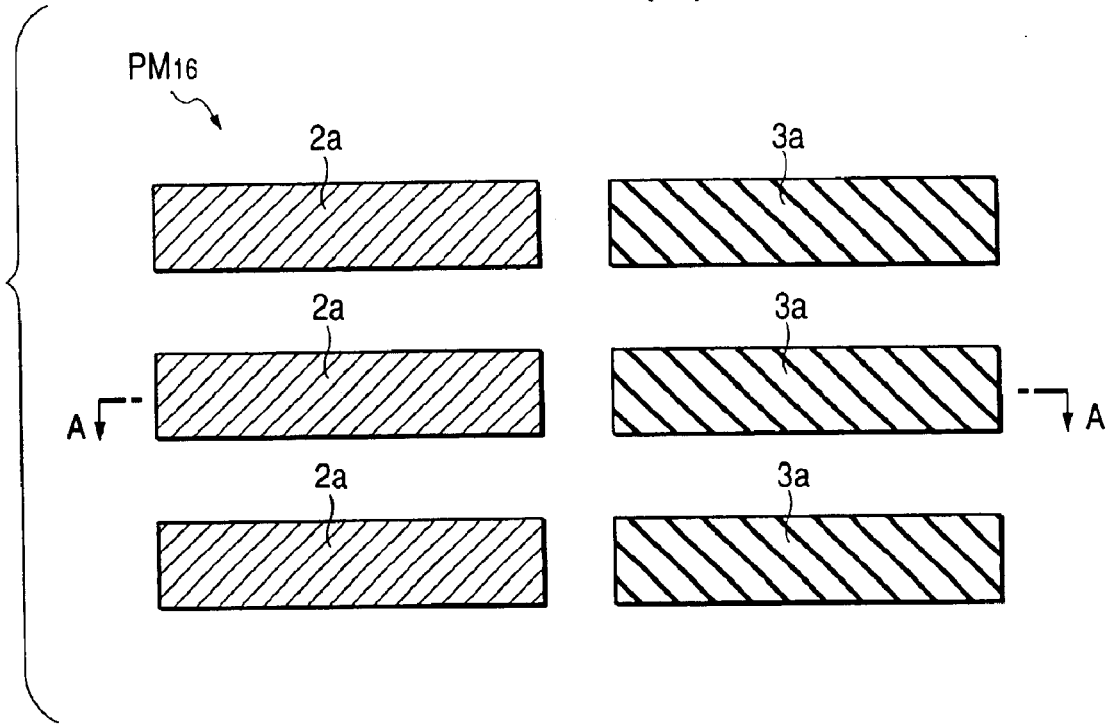
FIG. 45(a) is a plan view of portions where light-shielding patterns each formed of a metal and light-shielding patterns each formed of a resist film both of which are employed in a photomask showing a still further embodiment of the present invention, are connected to one another.
Figure 45B:
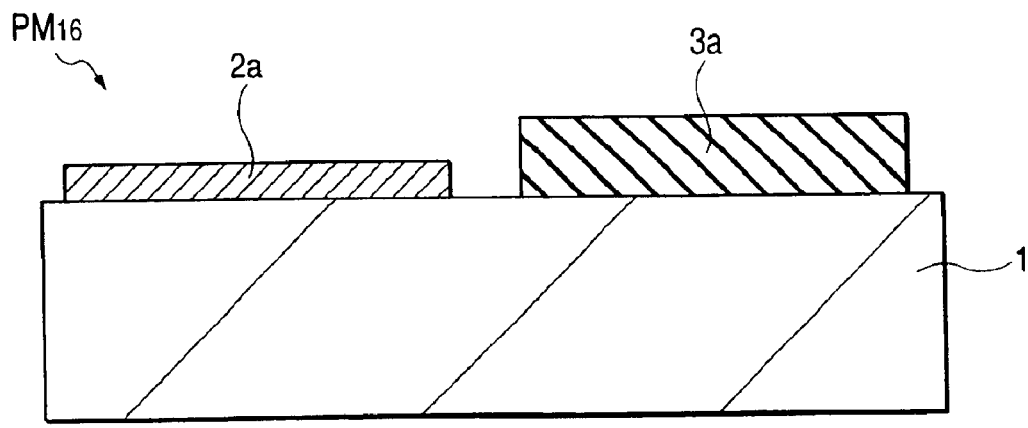
FIG. 45(b) is a cross-sectional view taken along line A—A of FIG. 45(a)

Therefore, when predetermined conditions are established even if portions to originally connect light-shielding patterns 2a formed of a metal and light-shielding patterns 3a formed of a resist film exist in a mask PM16 according to the present embodiment 16, the light-shielding patterns 2a formed of the metal and the light-shielding patterns 3a formed of the resist film are disposed away from one another as shown in FIG. 45.

Figure 46A:
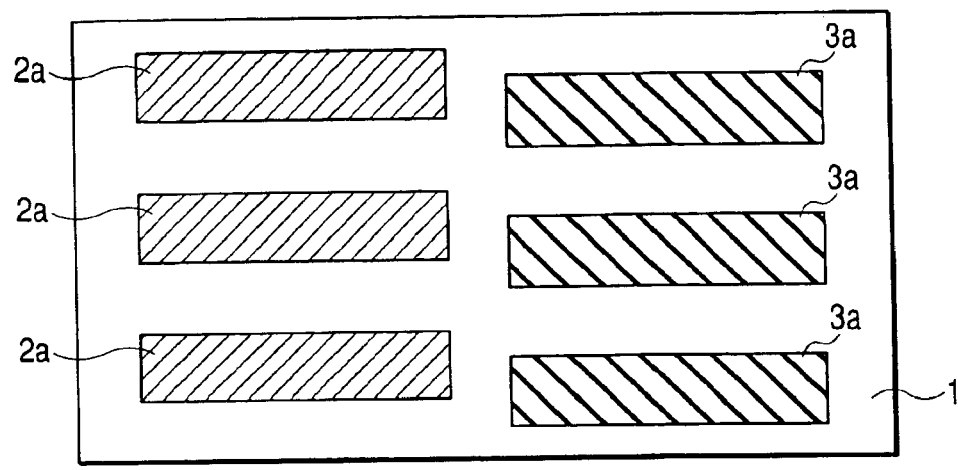
FIG. 46(a) is a view for describing positional displacements developed between the light-shielding patterns each formed of the metal and the light-shielding pattern each formed of the resist film both of which are employed in the photomask shown in FIG. 45.
Figure 46B:
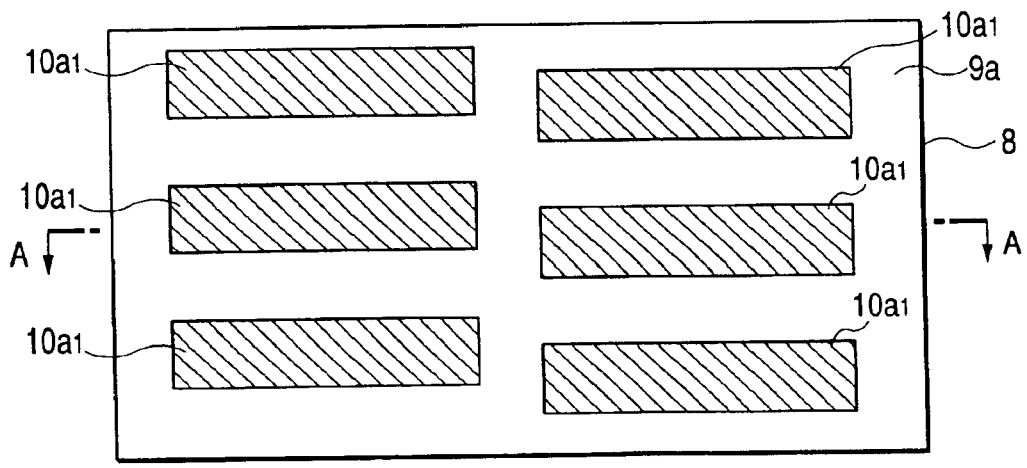
FIG. 46(b) is a plan view of patterns transferred to a semiconductor wafer by using the photomask shown in FIG. 46(a)
Figure 46C:
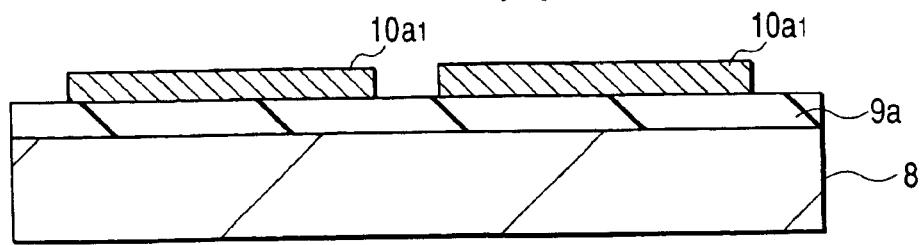
FIG. 46(c) is a cross-sectional view taken along line A—A of FIG. 46(b)
Figure 47A:
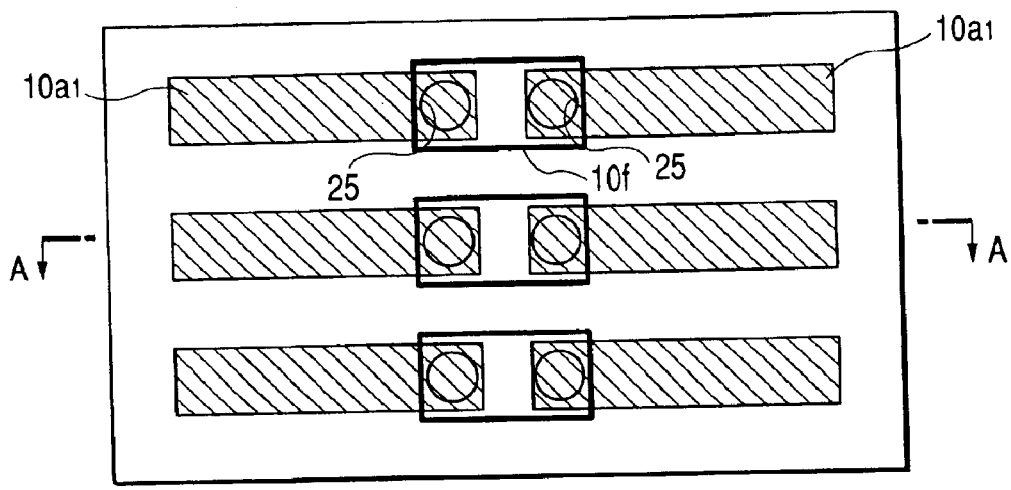
FIGS. 47(a) and 47(b) are respectively fragmentary plan views of the semiconductor wafer, showing even upper patter layers of FIG. 46(b)
Figure 47B:
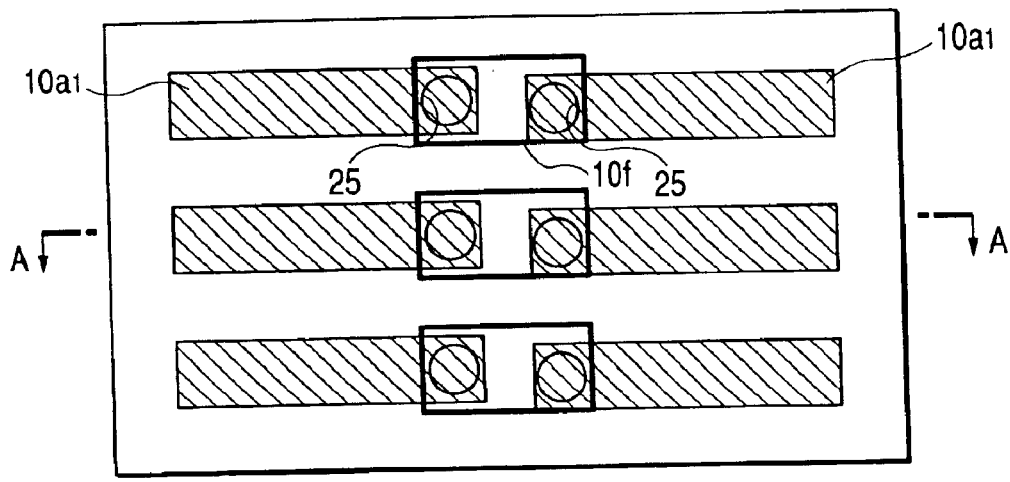
Figure 47C:
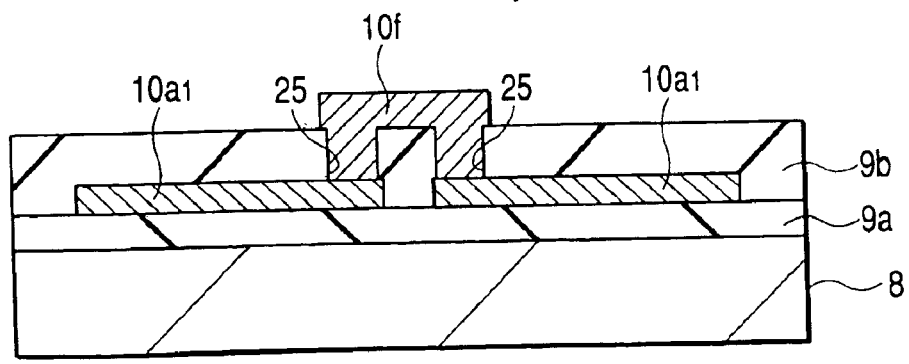
FIG. 47(c) is a cross-sectional view taken along lines A—A of FIGS. 47(a) and 47(b)

FIG. 46(a) shows a case in which the light-shielding patterns 2a formed of the metal and the light-shielding patterns 3a formed of the resist film are shifted in their width directions in their position relationships in the mask PM16 according to the present embodiment 16. FIG. 46(b) is a plan view at the time that conductor film patterns 10a1 over a wafer 8 are formed using the mask PM16. FIG. 46(c) is a cross-sectional view taken along line A—A of FIG. 46(b). On the other hand, since the conductor film patterns 10a1 and 10a1 are to be originally connected to one another, the conductor film patterns 10a1 and 10a1 are respectively connected to one another by conductor film patterns 10f placed thereabove as shown in FIGS. 47(a) through 47(c). FIG. 47(a) shows a case in which the relative position relationship between the adjacent conductor film patterns 10a1 and 10a1 is satisfactory, FIG. 47(b) illustrates a case in which the conductor film patterns 10a1 and 10a1 are shifted in position, and FIG. 47(c) is a cross-sectional view taken along lines A—A of FIGS. 47(a) and 47(b), respectively. The conductor film patterns 10a1 and 10a1 are respectively electrically connected to the conductor film patterns 10f via through holes 25 defined in an insulating film 9b and are electrically connected to one another.

(Embodiment 17)

The present embodiment 17 describes anther means for solving the problem described in the embodiment 16.

Figure 48A:
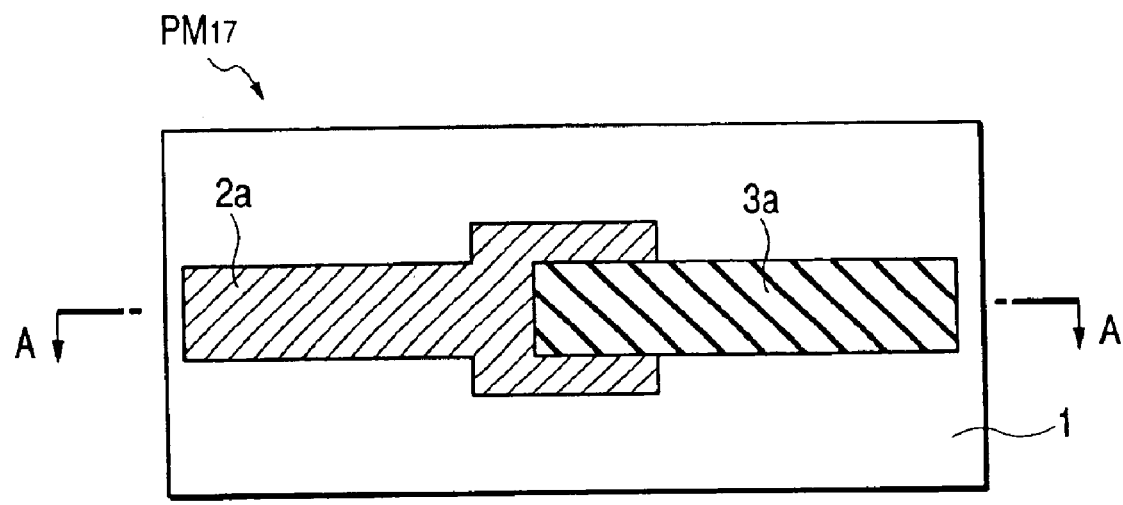
FIG. 48(a) is a plan view of a portion where a light-shielding pattern formed of a metal and a light-shielding pattern formed of a resist film both of which are employed in a photomask according to a still further embodiment of the present invention.
Figure 48B:
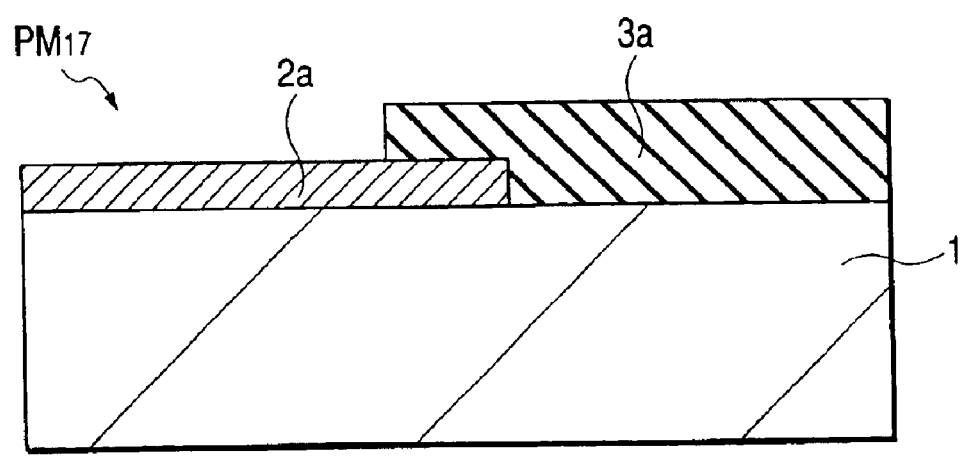
FIG. 48(b) is a cross-sectional view taken along line A—A of FIG. 48(a)
Figure 49A:
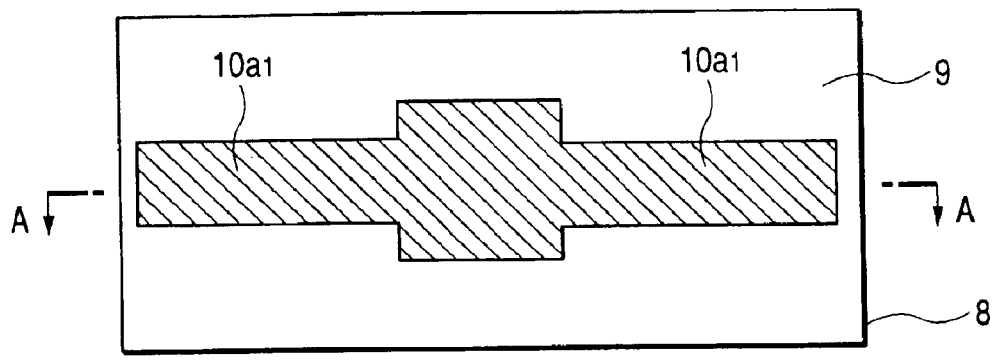
FIG. 49(a) is a plan view of a pattern transferred to a semiconductor wafer through the use of the photomask shown in FIG. 48.
Figure 49B:
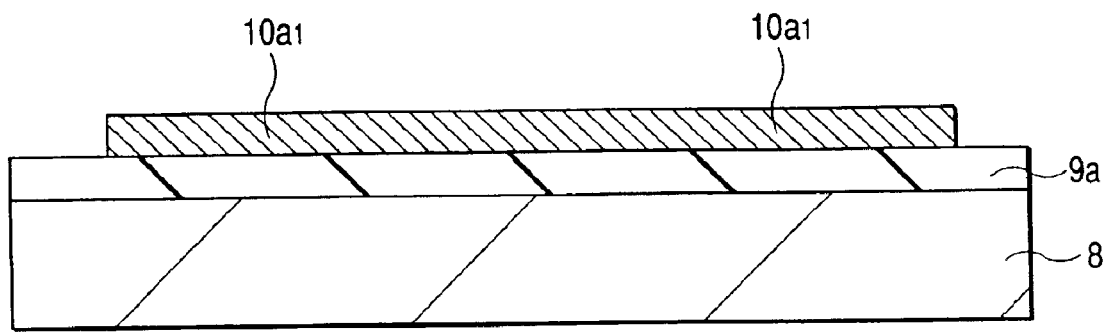
FIG. 49(b) is a cross-sectional view taken along line A—A of FIG. 49(a)

In the present embodiment 17, both or either one of a light-shielding pattern formed of a metal and a light-shielding pattern formed of a resist film is configured so that each connecting portion thereof is wider than other pattern portions. FIG. 48 shows a specific example thereof. FIG. 48(a) is a fragmentary plan view of a mask PM17, and FIG. 48(b) is a cross-sectional view taken along line A—A of FIG. 48(a), respectively. In the present embodiment, an end of a light-shielding pattern 2a formed of a metal is broader than another portion thereof. An end of a light-shielding pattern 3a formed of a resist film is superimposed on the broad portion of the light-shielding pattern 2a. Thus, even if the relative position between the light-shielding pattern 2a and the light-shielding pattern 3a is slightly shifted, the amount of overlapping of the respective patterns can be ensured sufficiently. A pattern transferred by the mask PM17 is shown in FIG. 49. While a broader portion is formed at a portion where a conductor film pattern 10a1 transferred by the light-shielding pattern 2a formed of the metal and a conductor film pattern 10a1 transferred by the light-shielding pattern 3a formed of the resist film are connected, both are connected as designed. Incidentally, FIG. 49(a) is a fragmentary plan view of a wafer, and FIG. 49(b) is a cross-sectional view taken along line A—A of FIG. 49(a), respectively.

As another method, the amount of overlapping of the light-shielding patterns 2a and 3a may be set to a pattern alignment accuracy or more.

(Embodiment 18)

The present embodiment 18 describes a modification of the embodiment 17.

Figure 50A:
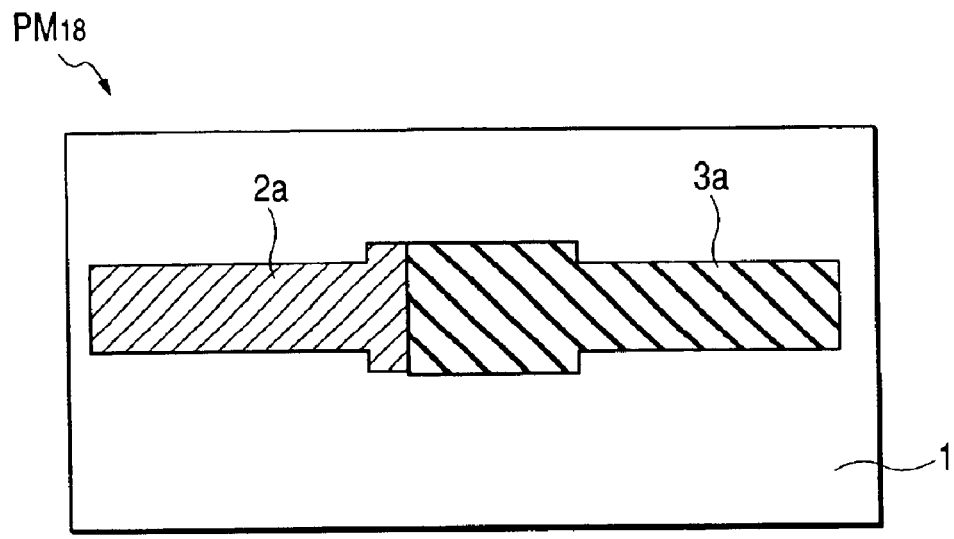
FIG. 50(a) is a fragmentary plan view of a portion where a light-shielding pattern formed of a metal and a light-shielding pattern formed of a resist film both of which are employed in a photomask showing a still further embodiment of the present invention.
Figure 50B:
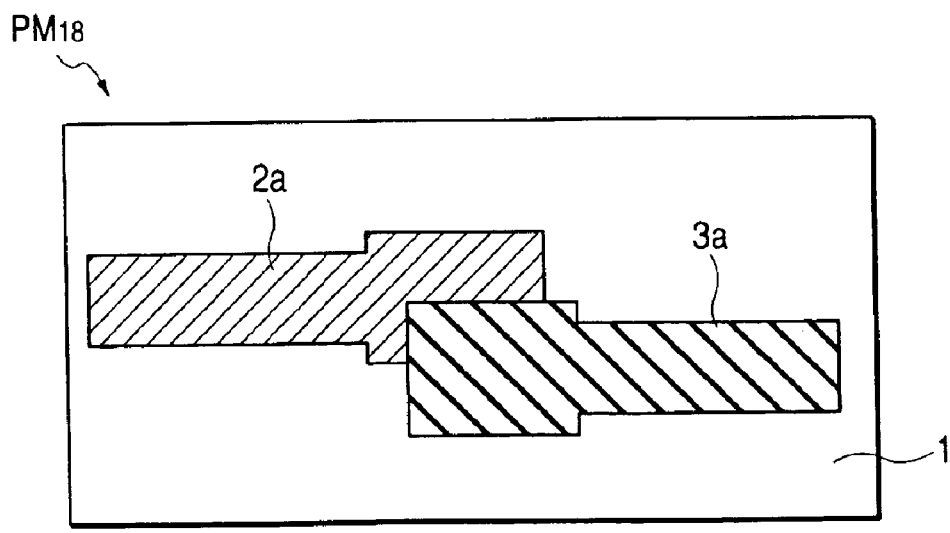
FIG. 50(b) is a fragmentary plan view showing a positional displacement developed between the light-shielding pattern formed of the metal and the light-shielding pattern formed of the resist film.

In the present embodiment 18, respective connecting portions of a light-shielding pattern 2a formed of a metal and a light-shielding pattern 3a formed of a resist film in a mask PM18 are rendered broader as shown in FIG. 50. FIG. 50(a) shows a case in which the light-shielding patterns 2a and 3a are laid out in good alignment, and FIG. 50(b) shows a case in which the light-shielding patterns 2a and 3a are disposed with being shifted in their width directions. Even if the relative position between the light-shielding pattern 2a formed of the metal and the light-shielding pattern 3a formed of the resist film is slightly shifted even in this case, the amount of overlapping of the respective patterns can be ensured sufficiently. Since the amounts of extensions of the ends of the light-shielding patterns 2a and 3a can be reduced in this case, they can be used even in the transfer of transfer patterns narrow in adjacent pitch.

(Embodiment 19)

The present embodiment 19 describes a case in which the technical idea of the present invention is applied to the manufacture of an ASIC (Application Specific IC) like a gate array, a standard cell or the like, for example.

Figure 51:
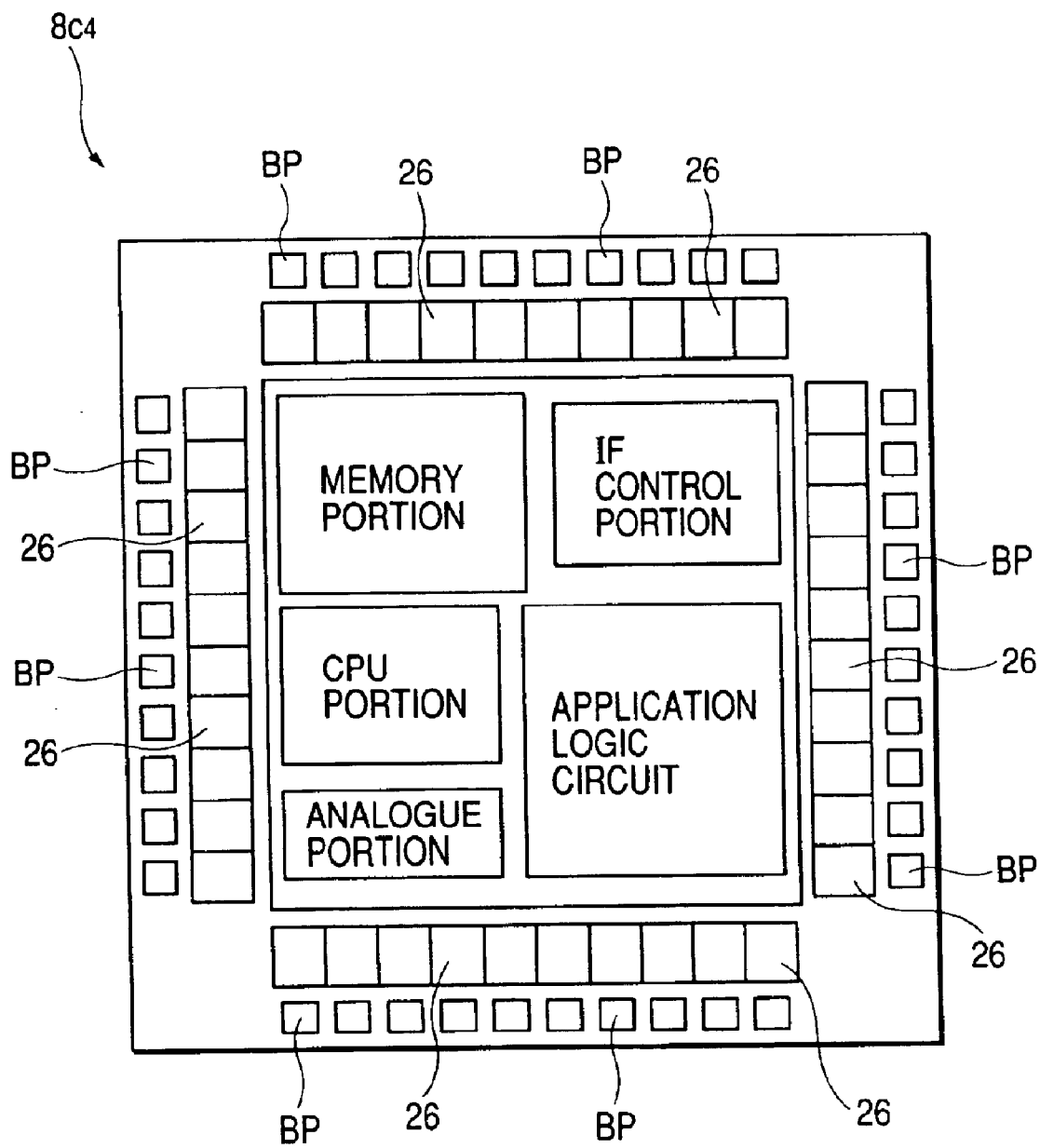
FIG. 51 is a plan view of a semiconductor chip showing a still further embodiment of the present invention.

FIG. 51 shows an example of a configuration of a semiconductor chip 8c4 of the present embodiment 19. A memory portion, an IF control portion, a CPU portion, an application logic circuit and an analog portion are placed over a main surface of the semiconductor chip 8c4. In the semiconductor chip 8c4, a plurality of input/output circuit regions 26 are disposed over the outer periphery of a group of these circuits side by side along the outer periphery of the semiconductor chip 8c4. An input circuit, an output circuit or an input/output bi-method circuit, etc. are placed in each of the input/output circuit regions 26. Further, bonding pads BP are disposed over the outer peripheries thereof every input/output circuit regions 26.

Of these, the IF control portion and the application logic circuit are apt to be modified and changed according to customer's requests or the like. Therefore, such portions are brought into gate arrays and light-shielding patterns over a mask, for transferring the portions are formed of a resist film as described in the embodiments 1 through 18. Further, light-shielding patterns over the mask, for transferring patterns for circuit regions other than the above are formed of a metal.

Figure 52A:
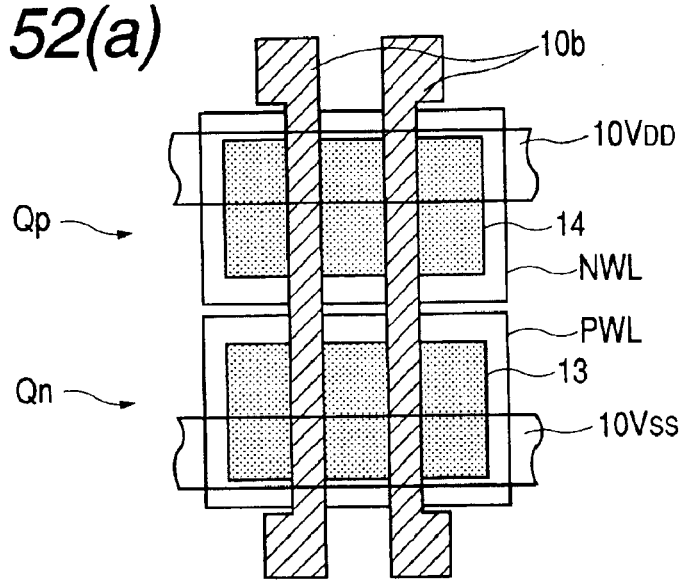
FIG. 52(a) is a plan view of a basic cell employed in the semiconductor chip shown in FIG. 51.
Figure 52B:
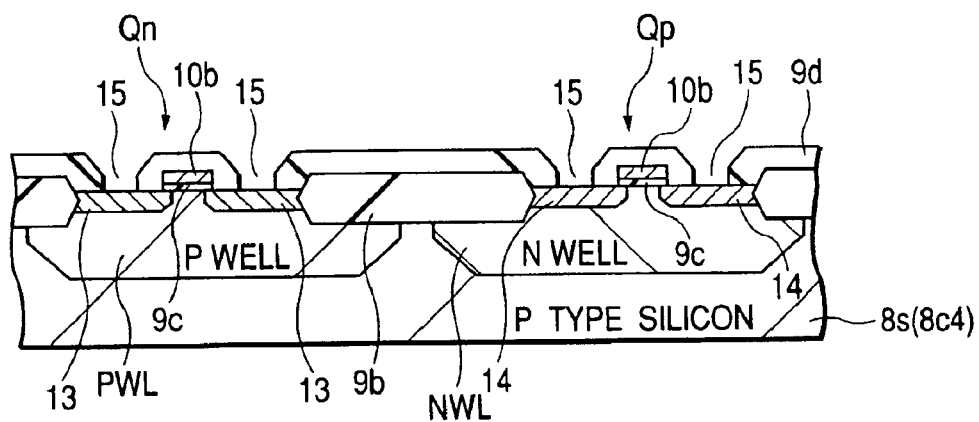
FIG. 52(b) is a fragmentary cross-sectional view of FIG. 52(a)

FIG. 52(a) is a plan view of a basic cell BC placed in each of the IF control portion and the application logic circuit, and FIG. 52(b) is a cross-sectional view of FIG. 52(a). For instance, a plurality of basic cells BC are disposed in regions for forming the IF control portion and the application logic circuit so as to be spread over their whole surfaces (so-called SOG structure: Sea Of Gate). The basic cell BC comprises, for example, two nMISQn and two pMISQp. Gate electrodes 10b are shared between nMISQn and pMISQp and disposed so as to cross across both regions. A power or source wiring 10VDD is a source wiring on the high potential (e.g., about 3.3V or 1.8V) side. A source wiring 10VSS is a source wiring on the low potential (e.g., about 0V) side. The source wirings 10VDD and 10VSS intersect the gate electrodes 10b and are placed so as to extend along the direction in which an n well NWL and a p well PWL extend. Incidentally, the description of the vertical structure of nMISQn and pMISQp will be omitted because it has been described in the embodiment 1.

Figure 52C:
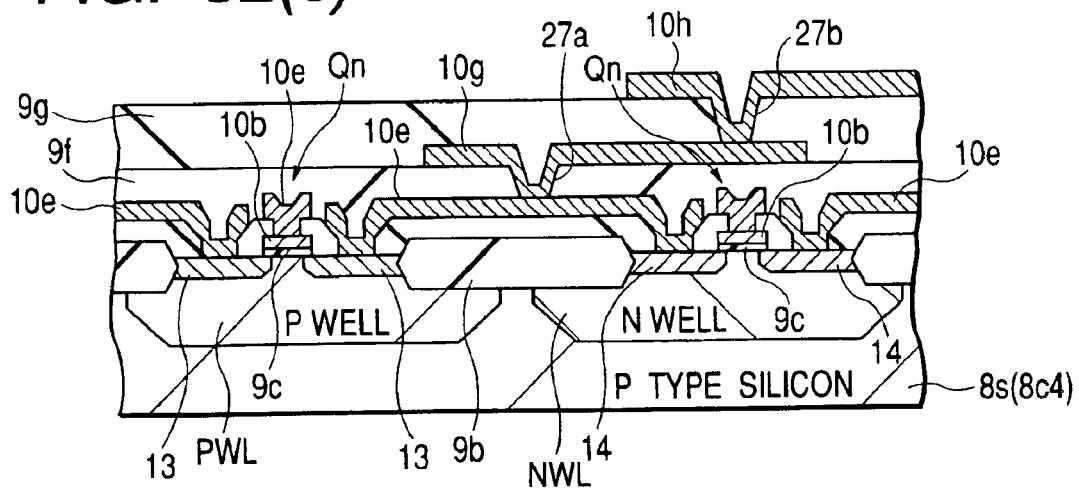
FIG. 52(c) is a fragmentary cross-sectional view of the semiconductor chip at the time that wiring layers are formed in FIG. 52(b)

Portions up to the stage of such basic cells BC have been formed. Since the shapes of patterns up to the stage of each basic cell BC have been fixed, patterns for the basic cells BC are formed in patterns with normal masks. A desired circuit is configured according to the layout of wiring layers, contact holes and through holes placed thereabove. FIG. 52(c) is a cross-sectional view showing post-formation first, second and third layer wirings 10e, 10g and 10h. The second layer wiring 10g is electrically connected to the first layer wiring 10e via a through hole 27a defined in an interlayer dielectric 9f. Further, the third layer wiring 10h is electrically connected to the second layer wiring 10g via a through hole 27b defined in an interlayer dielectric 9g. Since the shapes of patterns for such first through third layer wirings 10e, 10g and 10h, and the layout of the contact holes 15 and through holes 27a and 27b might be changed in various ways according to customer's requests, masks having light-shielding patterns each formed of a resist film are used upon formation of those patterns.

One example of a change in pattern over the mask will next be described.

Figure 53A:
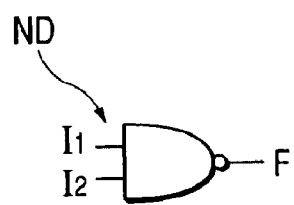
FIG. 53(a) is a symbol diagram of a NAND circuit formed in the semiconductor chip shown in FIG. 51.
Figure 53B:
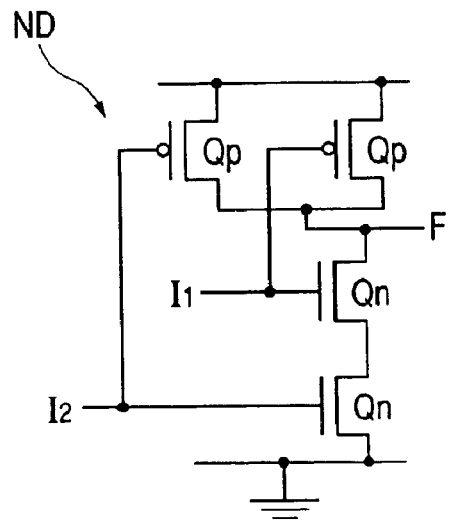
FIG. 53(b) is a circuit diagram of FIG. 53(a)
Figure 53C:
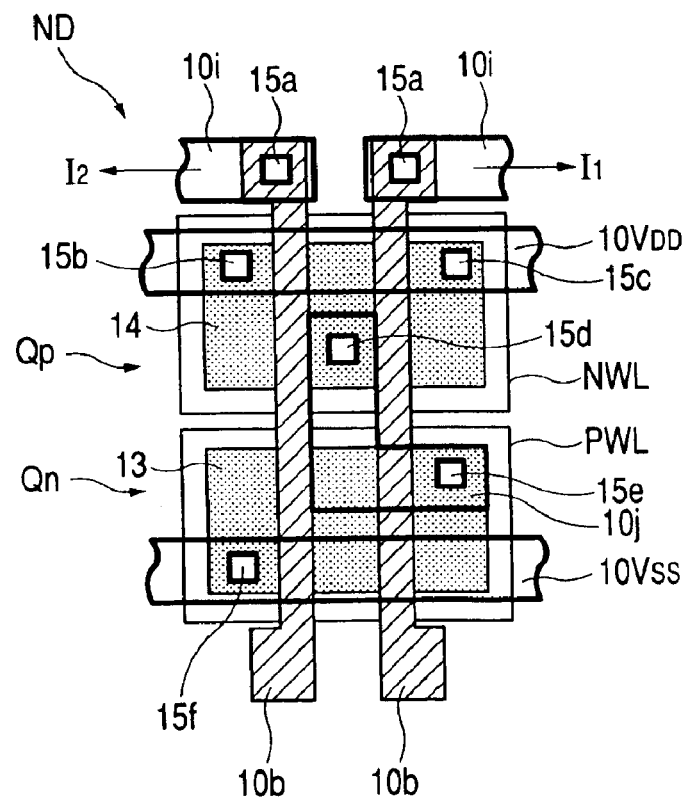
FIG. 53(c) is a fragmentary plan view showing a pattern layout of FIG. 53(b)

FIG. 53 shows a NAND circuit ND formed using the basic cell BC. FIG. 53(a) is a symbolic diagram of the NAND circuit ND, FIG. 53(b) is a circuit diagram thereof, and FIG. 53(c) is a layout plan view thereof, respectively. A NAND circuit ND having two inputs I1 and I2 and one output F is illustrated by way of example herein.

As shown in FIG. 53(c), wirings 10i and 10i connected to the inputs I1 and I2 are respectively electrically connected to gate electrodes 10b and 10b through contact holes 15a and 15a. A power or source wiring 10VDD is electrically connected to a semiconductor region 14 for both pMISQp through contact holes 15b and 15c. A wiring 10j is electrically connected to the semiconductor region 14 shared between both pMISQp through a contact hole 15d. Further, the wiring 10j is electrically connected to a semiconductor region 13 for one nMISQn through a contact hole 15e. In addition, a power or source wiring 10VSS is electrically connected to the semiconductor region 13 for another one nMISQn through a contact hole 15f. Incidentally, while the planar shapes of the contact holes 15a through 15f are represented in the form of quadrangles in FIG. 53, they are commonly represented in the form of substantially circles in practice.

Figure 54A:
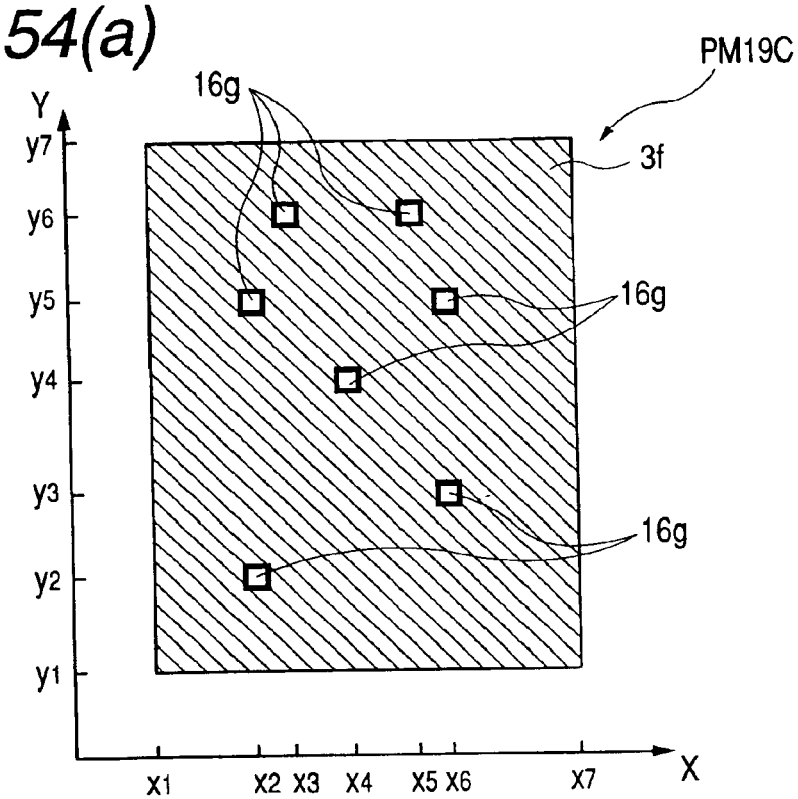
FIGS. 54(a) and 54(b) are respectively fragmentary plan views of a photomask showing a still further embodiment of the present invention and used upon transfer of circuit patterns shown in FIG. 53.
Figure 54B:
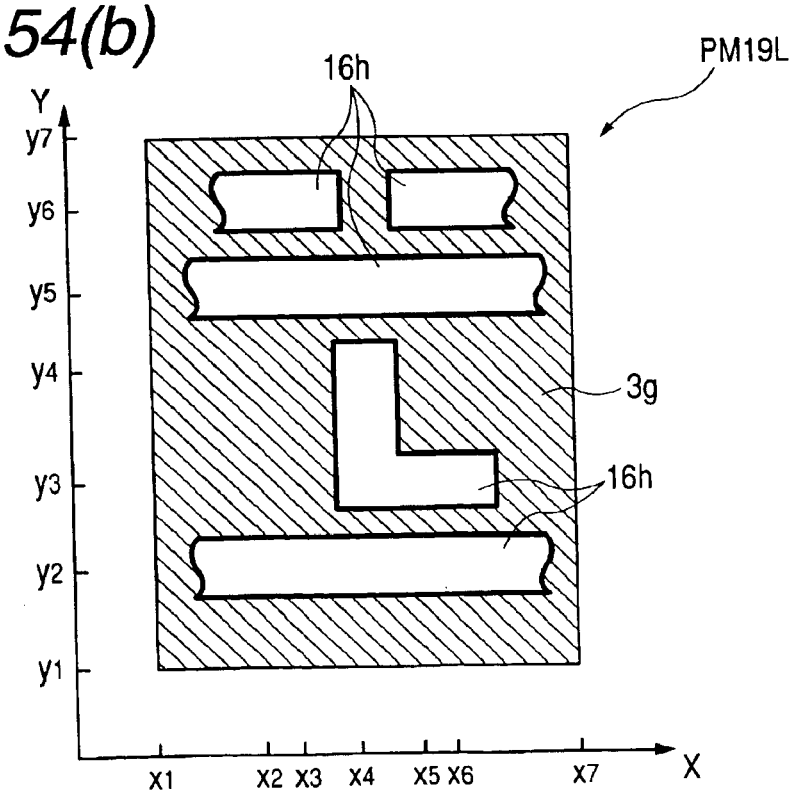

One examples of fragmentary plan views of patterns on masks for transferring patterns for the contact holes and wirings of the NAND circuit ND are shown in FIGS. 54(a) and 54(b). Incidentally, the masks shown in FIGS. 54(a) and 54(b) are different from each other and hence X–Y axes are shown so as to understand the relationship of position between the two.

FIG. 54(a) illustrates patterns over a mask PM19C for transferring the contact holes 15a through 15f shown in FIG. 53(c) onto a wafer. A light-shielding film 3f is formed of the same resist material as the light-shielding patterns 3a described in the embodiment 1 and the like. The light-shielding film 3f is partly removed to open or define plane quadrangular micro light transmissive patterns 16g in plural locations therewithin. The light transmissive patterns 16g are patterns used to form the contact holes 15a through 15f. When the patterns over the mask are transferred onto the wafer, a positive type resist film is used over the wafer.

FIG. 54(b) illustrates patterns over a mask PM19L for transferring the wirings 10i and 10j and source wirings 10VDD and 10VSS shown in FIG. 53(c) onto a wafer. A light-shielding film 3g is formed of the same resist material as the light-shielding patterns 3a described in the embodiment 1 and the like. The light-shielding film 3g is partly removed to open or define light transmissive patterns 16h in plural locations therewithin. The light transmissive patterns 16h are patterns used to form the wirings 10i and 10j and source wirings 10VDD and 10VSS. When the patterns over the mask are transferred onto the wafer, a negative type resist film is used over the wafer.

Figure 55A:
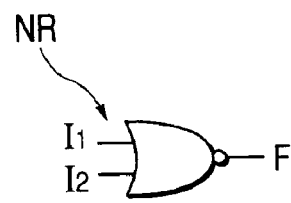
FIG. 55(a) is a symbol diagram of a NOR circuit formed in the semiconductor chip shown in FIG. 51.
Figure 55B:
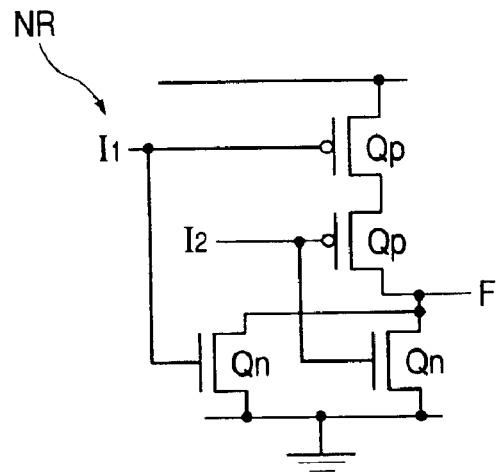
FIG. 55(b) is a circuit diagram of FIG. 55(a)
Figure 55C:
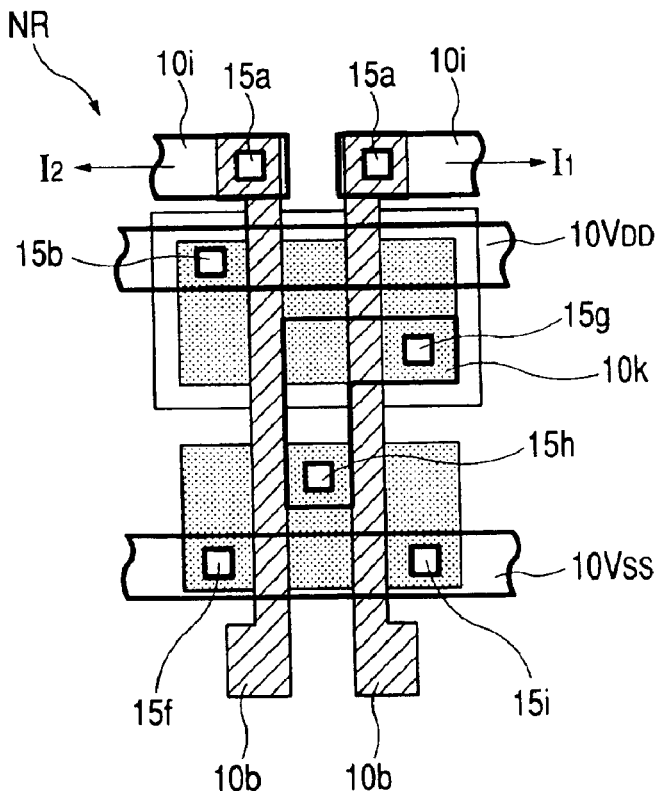
FIG. 55(c) is a fragmentary plan view showing a pattern layout of FIG. 55(b)

FIG. 55 shows, as an example, a two-input NOR circuit NR formed by using the basic cell BC. FIG. 55(a) is a symbolic diagram of the NOR circuit NR, FIG. 55(b) is a circuit diagram thereof, and FIG. 55(c) is a layout plan view thereof, respectively. Portions different from the NAND circuit configuration of FIG. 53(c) will be explained herein.

As shown in FIG. 55(c), a source wiring 10VDD is electrically connected to a semiconductor region 14 for one pMISQp through a contact hole 15b. A wiring 10k is electrically connected to the semiconductor region 14 for another one pMISQp through a contact hole 15g. Further, the wiring 10k is electrically connected to a semiconductor region 13 shared between both nMISQn through a contact hole 15h. In addition, a source wiring 10VSS is electrically connected to the semiconductor region 13 for both nMISQn through contact holes 15f and 15i. Incidentally, while the planar shapes of the contact holes 15a, 15b, 15f and 15g through 15*i* are represented in the form of quadrangles even in FIG. 55, they are commonly represented in the form of substantially circles in practice.

Figure 56A:
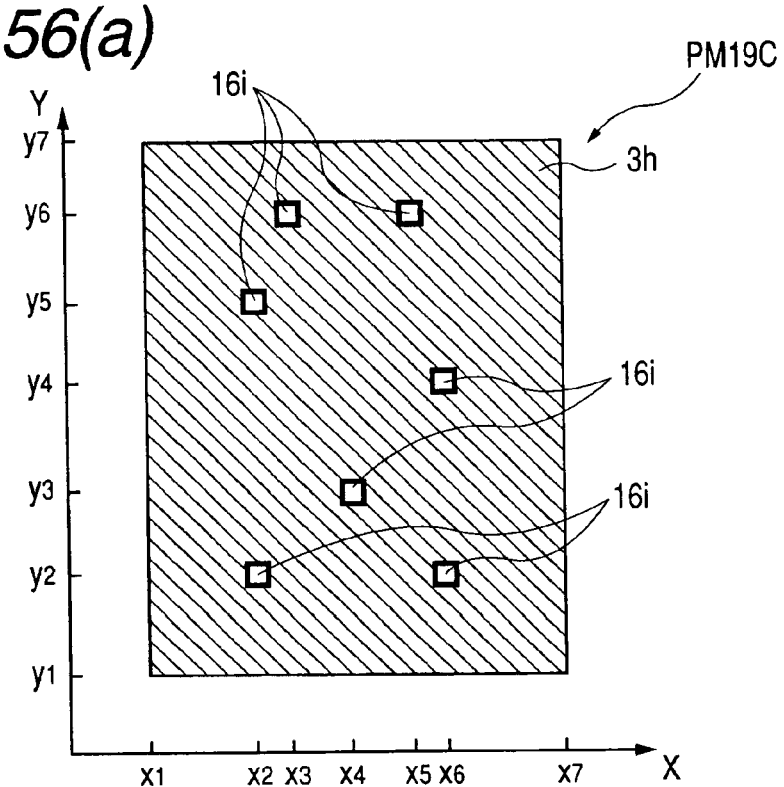
FIGS. 56(a) and 56(b) are respectively fragmentary plan views of a photomask showing a still further embodiment of the present invention and used upon transfer of circuit patterns shown in FIG. 55.
Figure 56B:
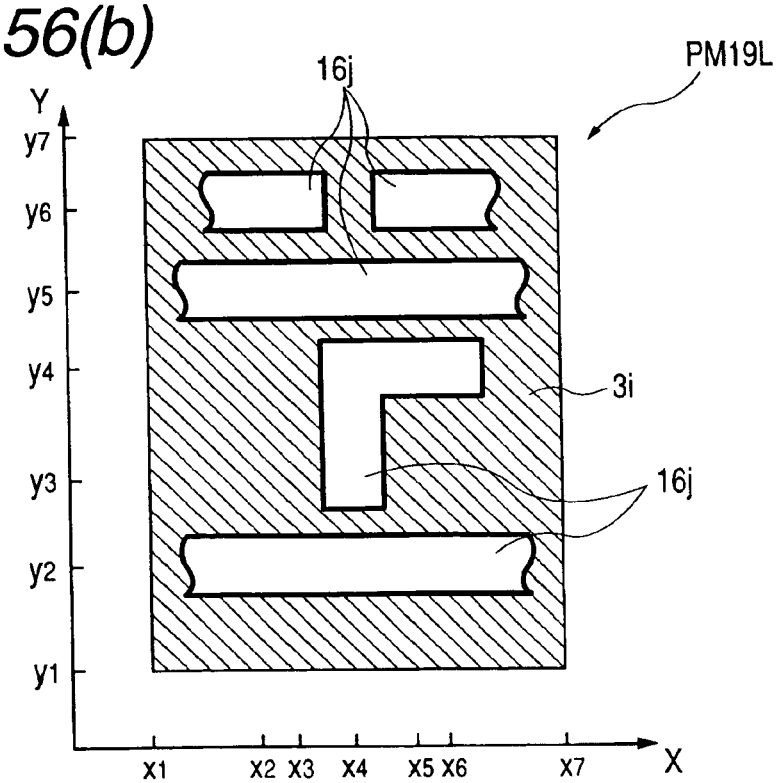

One examples of fragmentary plan views of patterns over masks for transferring patterns for the contact holes and wirings of the NOR circuit NR are shown in FIGS. 56(*a*) and 56(*b*). Incidentally, the masks shown in FIGS. 56(*a*) and 56(*b*) are different from each other and hence X-Y axes are shown so as to understand the relationship of position between the two.

FIG. 56(*a*) illustrates patterns over a mask PM19C for transferring the contact holes 15*a*, 15*b*, 15*f* and 15*g* through 15*i* shown in FIG. 55(*c*) onto a wafer. A light-shielding film 3*h* is formed of the same resist material as the light-shielding patterns 3*a* described in the embodiment 1 and the like. The light-shielding film 3*h* is partly removed to open or define plane quadrangular micro light transmissive patterns 16*i* in plural locations therewithin. The light transmissive patterns 16*i* are patterns used to form the contact holes 15*a*, 15*b*, 15*f* and 15*g* through 15*i*. When the patterns over the mask are transferred onto the wafer, a positive type resist film is used over the wafer.

FIG. 56(*b*) illustrates patterns over a mask PM19L for transferring the wirings 10*i* and 10*j* and source wirings 10VDD and 10VSS shown in FIG. 55(*c*) onto a wafer. A light-shielding film 3*i* is formed of the same resist material as the light-shielding patterns 3*a* described in the embodiment 1 and the like. The light-shielding film 3*i* is partly removed to open or define light transmissive patterns 16*j* in plural locations therewithin. The light transmissive patterns 16*j* are patterns used to form the wirings 10*i* and 10*j* and source wirings 10VDD and 10VSS. When the patterns over the mask are transferred onto the wafer, a negative type resist film is used over the wafer.

Changes in patterns over such masks PM19C and PM19L shown in FIGS. 54 and 56 may be performed in a manner similar to those described in the embodiment 1 and the like. When it is desired to change the patterns for the NAND circuit over the mask PM19C shown in FIG. 54 to the patterns for the NOR circuit over the mask PM19C shown in FIG. 56, for example, the light-shielding film 3*f* over the mask PM19C shown in FIG. 54 is removed. Thereafter, the light-shielding film forming resist film is newly applied onto its corresponding mask substrate, and the patterns for the NOR circuit are drawn onto the resist film by electron beams or ultraviolet rays, whereby a light-shielding film 3*h* and light transmissive patterns 16*i* over the mask PM19C shown in FIG. 56 may be formed. Namely, the patterns for the NAND circuit can be changed to those for the NOR circuit with ease and in a short time and the vice verse. It is thus possible to greatly shorten the time required to develop and manufacture a semiconductor integrated circuit device using the mask. Since a material cost and a process cost can be lowered, the cost of the semiconductor integrated circuit device can greatly be reduced. It is therefore possible to realize cost reductions even in the case of small-produced semiconductor integrated circuit devices.

Thus, the present embodiment 19 can also obtain an effect similar to the embodiment 1 or the like.

(Embodiment 20)

The present embodiment 20 describes a case in which the technical idea of the present invention is applied to the manufacture of a mask ROM, for example.

In the mask ROM, a large-capacity memory can be implemented because each memory cell is formed of one MIS. Since a write operation is unnecessary, the whole circuit configuration can be simplified. Since, however, the contents of the memory changes according to customer's requests, TAT becomes longer than that for another ROM (e.g., EEPROM (Electric Erasable Programmable Read Only Memory)). Since masks different every customer's diversified ROM codes must be fabricated, a problem arises in that the manufacturing cost increases upon small production. Thus, in the present embodiment 20, various patterns with changes in memory cell region are transferred using a mask with the resist film as light-shielding patterns on the basis of the data base, whereby the contents of the memory is changed. Incidentally, patterns for transferring patterns in a region other than the memory cell region were formed by light-shielding patterns each formed of a metal. Of course, all the integrated circuit patterns may be formed of light-shielding patterns comprised of a resist film.

Figure 57A:
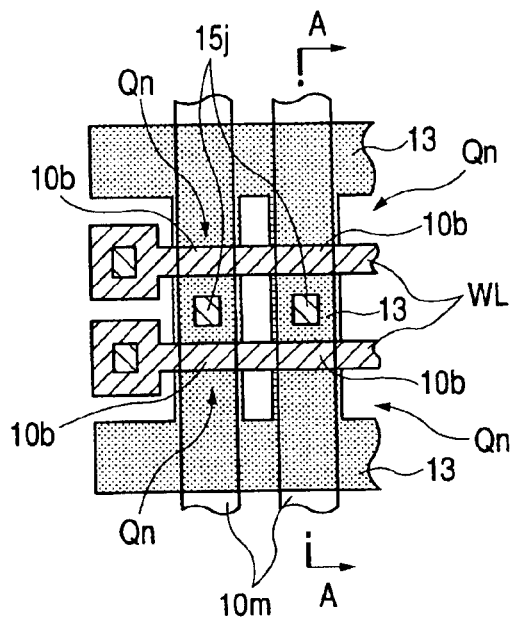
FIG. 57(a) is a fragmentary plan view of a mask ROM.
Figure 57B:
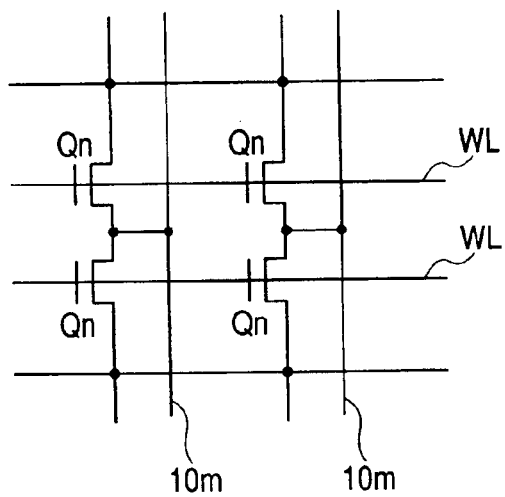
FIG. 57(b) is a circuit diagram of FIG. 57(a)
Figure 57C:
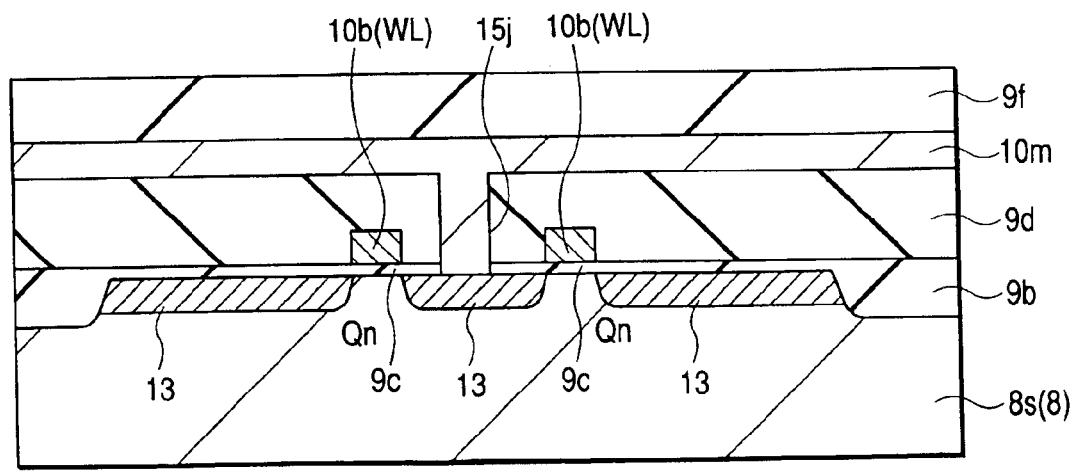
FIG. 57(c) is a cross-sectional view taken along line A—A of FIG. 57(a)

FIG. 57 shows a data base for a mask ROM, wherein FIG. 57(*a*) is a layout plan view of a memory cell region, FIG. 57(*b*) is a circuit diagram thereof, and FIG. 57(*c*) is a cross-sectional view taken along line A—A of FIG. 57(*a*), respectively. An ion-implantation program type mask ROM is illustrated by way of example herein. Data lines 10*m* are electrically connected to a semiconductor region 13 through contact holes 15*j*. Gate electrodes 10*b* are formed of parts of word lines WL respectively. One memory cell is formed by one nMOSQn lying in the vicinity of a point where each data line 10*m* and its corresponding word line WL intersect. The ion-implantation program type ROM corresponds to a system wherein threshold voltages of nMISQn are produced so as to be divided into a high type (type high to such a degree that the word lines WL are not brought into conduction even when high in level) and a low type (at the time that the word lines WL are brought into conduction when high in level) according to whether an impurity should be introduced into channel regions of nMISQn each constituting the memory cell, and they are associated with "0" an "1" of information. The mask with the metal as the light-shielding patterns was used to transfer the patterns for the data base. Of course, the patterns for the data base may be formed of the light-shielding patterns each formed of the resist film.

One example of a method of rewriting information in a mask ROM will next be described with reference to FIGS. 58 through 60. In respective drawings of FIGS. 58 through 59, FIGS. 58(*a*) through 59(*a*) are respectively fragmentary plan views of masks, FIGS. 58(*b*) through 59(*b*) are respectively layout plan views of memory cell regions of the mask ROM, showing patterns for memory information writing, and FIGS. 58(*c*) through 59(*c*) are respectively cross-sectional views of portions each equivalent to one taken along line A—A of FIG. 57(*a*) upon an information writing process.

Figure 58A:
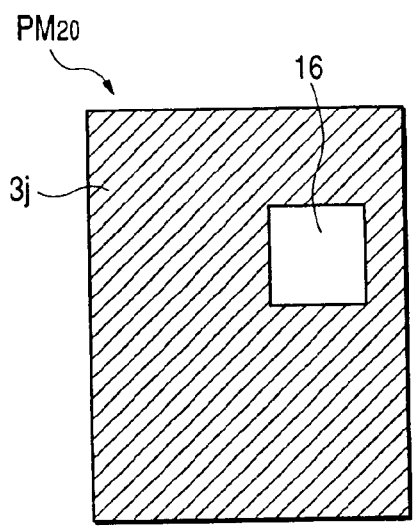
FIG. 58(a) is a fragmentary plan view of a photomask which shows a still further embodiment of the present invention and is used when patterns for writing data into the mask ROM shown in FIG. 57 by ion implantation are transferred onto a semiconductor wafer.
Figure 58B:
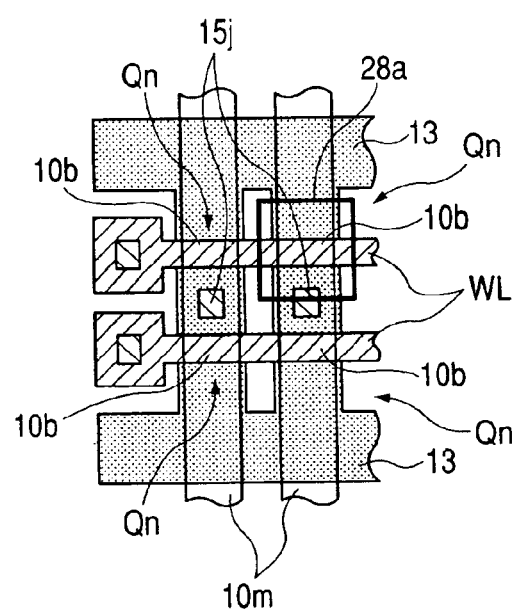
FIG. 58(b) is a fragmentary plan view of the semiconductor wafer, which shows the positions of the patterns transferred by the photomask shown in FIG. 58(a)
Figure 58C:
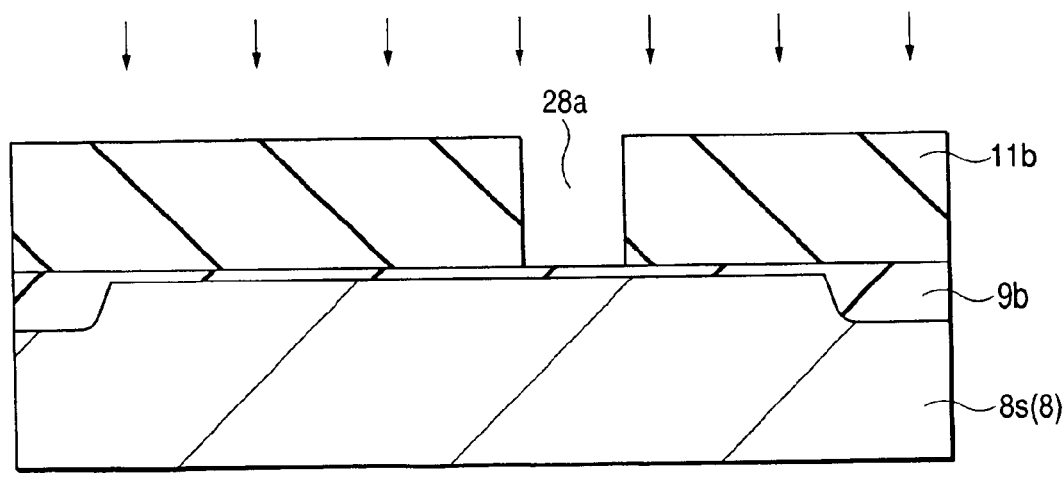
FIG. 58(c) is a cross-sectional view of the semiconductor wafer, which shows the manner of on-data writing in FIG. 58(a)

First of all, FIG. 58 illustrates, as an example, a case in which a mask PM20 shown in FIG. 58(*a*) is used to form an opening or aperture pattern 28*a* shown on a data base (FIG. 58(*b*)), and an impurity is ion-implanted in a semiconductor substrate 8*s* exposed from the aperture pattern 28*a* as shown in FIG. 58(*c*), whereby memory information is written. A light-shielding film 3*j* of the mask PM20 is made of the same resist material as the light-shielding patterns 3*a* employed in the embodiment 1. A part of the light-shielding film 3*j* is removed to open or define a plane quadrangular light transmissive pattern 16*k*. The light transmissive pattern 16*k* serves as a pattern for forming the opening or aperture pattern 28*a* in a resist film 11*b* over a wafer 8. The resist film 11*b* makes use of a positive type resist. Incidentally, an impurity implanting process for information writing is carried out before the process of forming gate electrodes 10*b* (i.e., word lines WL). When it is desired to increase the threshold value of each nMISQn, for example, boron may be introduced as the impurity. On the other hand, when it is desired to lower the threshold value of the nMISQn, for example, phosphor or arsenic may be introduced as the impurity.

Figure 59A:
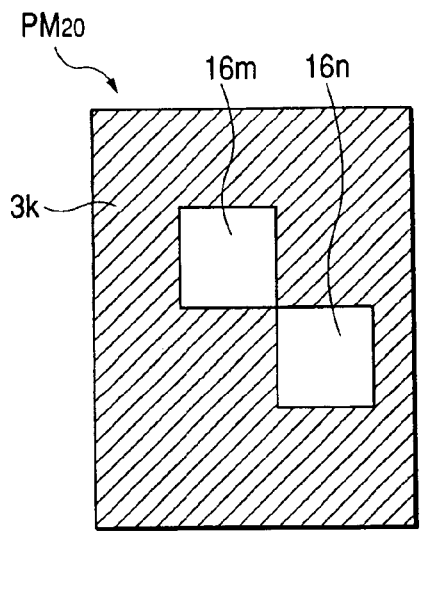
FIG. 59(a) is a fragmentary plan view of a photomask which shows a still further embodiment of the present invention and is used when patterns for writing data into the mask ROM shown in FIG. 57 by ion implantation are transferred onto a semiconductor wafer.
Figure 59B:
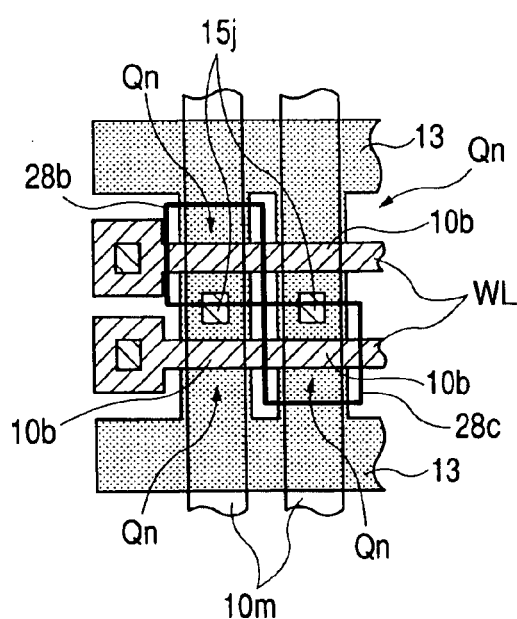
FIG. 59(b) is a fragmentary plan view of the semiconductor wafer, which shows the positions of the patterns transferred by the photomask shown in FIG. 59(a)
Figure 59C:
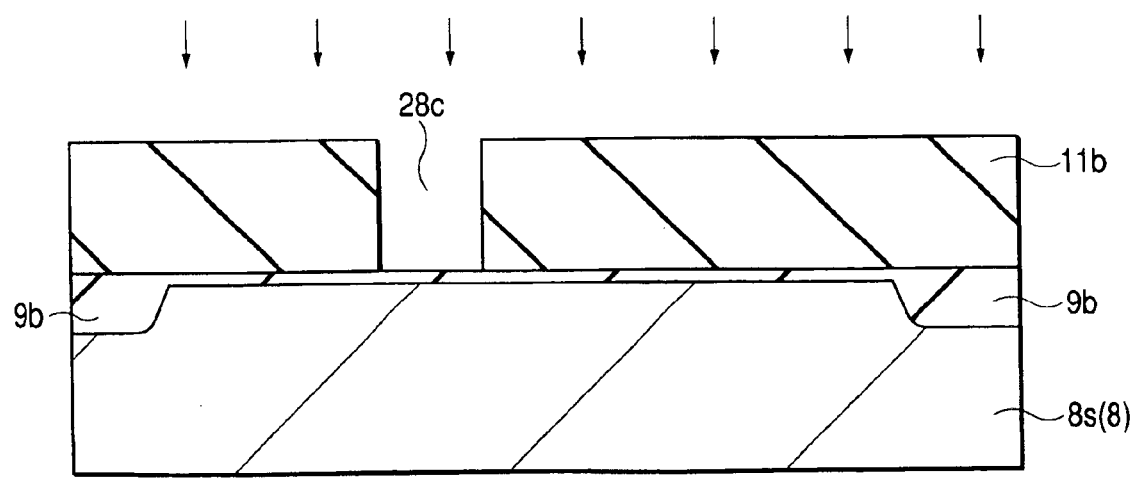
FIG. 59(c) is a cross-sectional view of the semiconductor wafer, which shows the manner of on-data writing in FIG. 59(a)

Next, FIG. 59 illustrates, as an example, a case in which a mask PM20 shown in FIG. 59(a) is used to form opening or aperture patterns 28b and 28c shown on a data base (FIG. 59(b)), and an impurity is ion-implanted in a semiconductor substrate 8s exposed from the aperture patterns 28b and 28c, whereby memory information is written. A light-shielding film 3k of the mask PM20 is made of the same resist material as the light-shielding patterns 3a employed in the embodiment 1. A part of the light-shielding film 3k is removed to open or define two light transmissive patterns 16m and 16n each shaped in the form of a plane quadrangle. The light transmissive patterns 16m and 16n respectively serve as patterns for forming the aperture patterns 28b and 28c in a resist film 11b over a wafer 8.

Figure 60A:
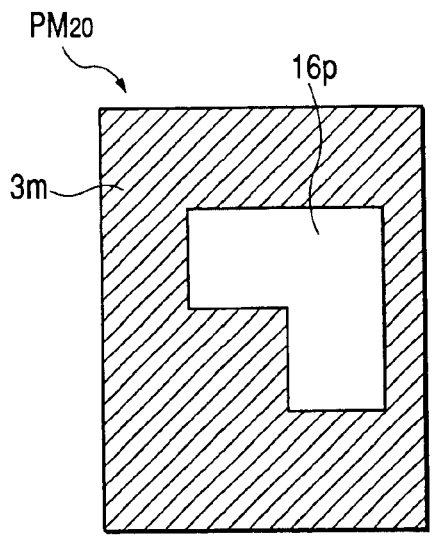
FIG. 60(a) is a fragmentary plan view of a photomask which shows a still further embodiment of the present invention and is used when patterns for writing data into the mask ROM shown in FIG. 57 by ion implantation are transferred onto a semiconductor wafer.
Figure 60B:
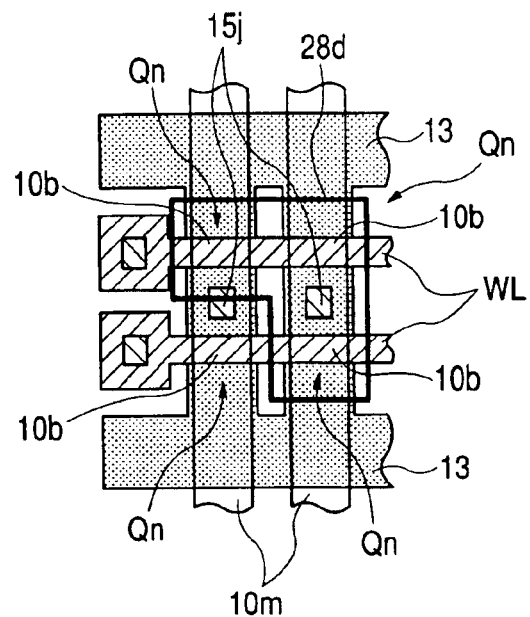
FIG. 60(b) is a fragmentary plan view of the semiconductor wafer, which shows the positions of the patterns transferred by the photomask shown in FIG. 60(a)
Figure 60C:
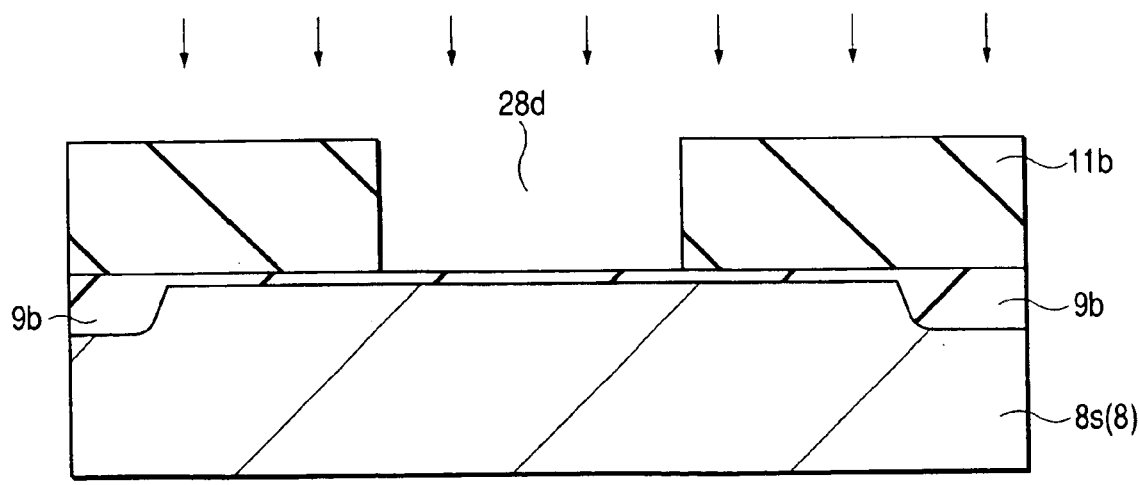
FIG. 60(c) is a cross-sectional view of the semiconductor wafer, which shows the manner of on-data writing in FIG. 60(a)

Next, FIG. 60 illustrates, as an example, a case in which a mask PM20 shown in FIG. 60(a) is used to form an opening or aperture pattern 28d shown on a data base (FIG. 60(b)), and an impurity is ion-implanted in a semiconductor substrate 8s exposed from the aperture pattern 28d, whereby memory information is written. A light-shielding film 3m of the mask PM20 is comprised of the same resist material as the light-shielding patterns 3a employed in the embodiment 1. A part of the light-shielding film 3m is removed to open a light transmissive pattern 16p. The light transmissive pattern 16p serves as a pattern for forming the aperture pattern 28d in a resist film 11b over a wafer 8.

Changes in patterns over such masks PM20 shown in FIGS. 58 through 60 may be done in a manner similar to ones described in the embodiment 1 and the like. When the patterns over the mask PM20 shown in FIG. 58 are changed to the patterns over the mask PM20 shown in FIG. 59, for example, the light-shielding film 3j over the mask PM20 shown in FIG. 58 is removed. Thereafter, the light-shielding film forming resist film is newly applied onto its corresponding mask substrate, and electron beams or ultraviolet rays are applied to predetermined positions of the resist film, whereby the light-shielding film 3k and light transmissive patterns 16m and 16n over the mask PM20 shown in FIG. 59 may be formed. Consequently, many kinds of mask ROMs can be manufactured efficiently. It is also possible to greatly reduce TAT of the wide variety of mask ROMs. Since a material cost and a process cost can be lowered, the cost of the mask ROM can greatly be reduced even in the case of small production.

Thus, the present embodiment 20 can also obtain an effect similar to each of the embodiment 1 and the like.

(Embodiment 21)

The present embodiment 21 is a modification of the embodiment 20 and explains an information rewriting system different from the mask ROM according to the embodiment 2.

Figure 61A:
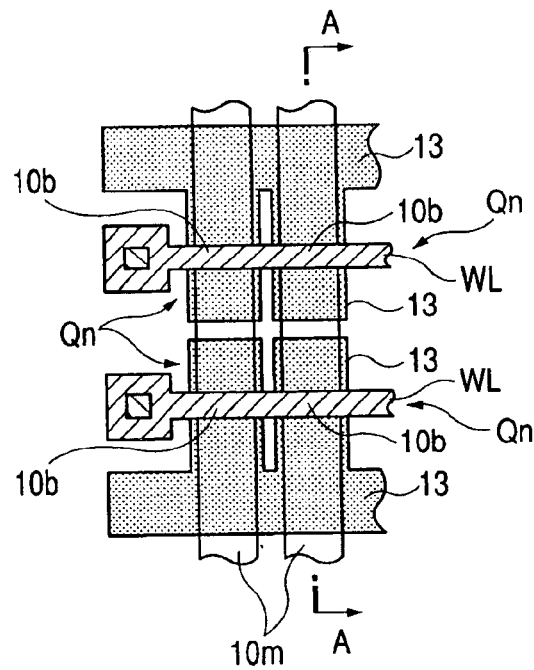
FIG. 61(a) is a fragmentary plan view of another mask ROM.
Figure 61B:
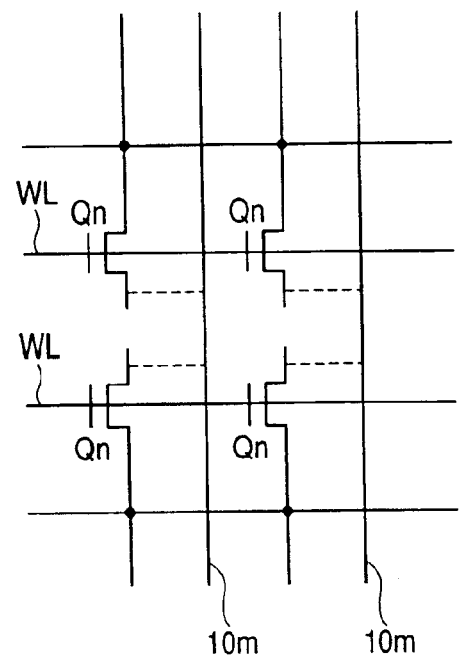
FIG. 61(b) is a circuit diagram of FIG. 61(a)
Figure 61C:
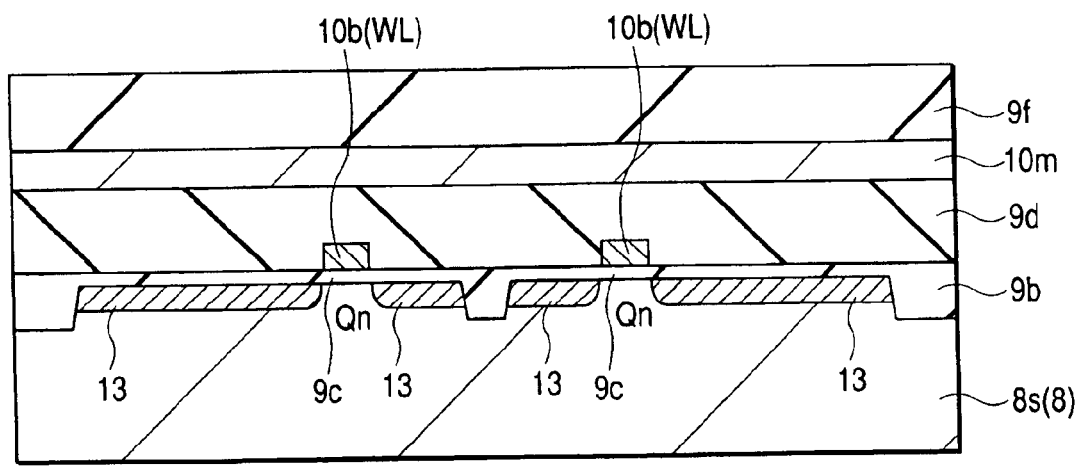
FIG. 61(c) is a cross-sectional view taken along line A—A of FIG. 61(a)

FIG. 61 shows a data base for a mask ROM according to the present embodiment 21, wherein FIG. 61(a) is a layout plan view of a memory cell region, FIG. 61(b) is a circuit diagram thereof, and FIG. 61(c) is a cross-sectional view taken along line A—A of FIG. 61(a), respectively. A contact hole program type ROM is illustrated by way of example herein. The contact hole program type ROM corresponds to a system wherein a program is carried out according to how to lay out contact holes (indicated by broken lines in FIG. 61(b)) used to connect semiconductor regions 13 and data lines 10m. Even in the case of the present embodiment 21, the mask with the metal as the light-shielding patterns was used to transfer the patterns for the data base.

One example of a method of rewriting information in a mask ROM will next be described with reference to FIGS. 62 through 65. In respective drawings of FIGS. 62, 64 and 65, FIGS. 62(a), 64(a) and 65(a) are respectively fragmentary plan views of masks, FIGS. 62(b), 64(b) and 65(b) are respectively layout plan views of memory cell regions of the mask ROM, showing patterns for memory information writing, and FIGS. 62(c), 64(c) and 65(c) are respectively circuit diagrams thereof, and FIGS. 62(d), 64(d) and 65(d) are respectively cross-sectional views taken along lines A—A of FIGS. 62(b), 64(b) and 65(b).

First of all, FIG. 62 illustrates, as an example, a case in which a mask PM21 shown in FIG. 62(a) is used to form or define a contact hole 15k shown on a data base (FIG. 62(b)), and semiconductor regions 13 for predetermined nMISQn and data lines 10m are respectively connected as shown in FIGS. 62(c) and 62(d), whereby memory information is written.

Figure 63A:
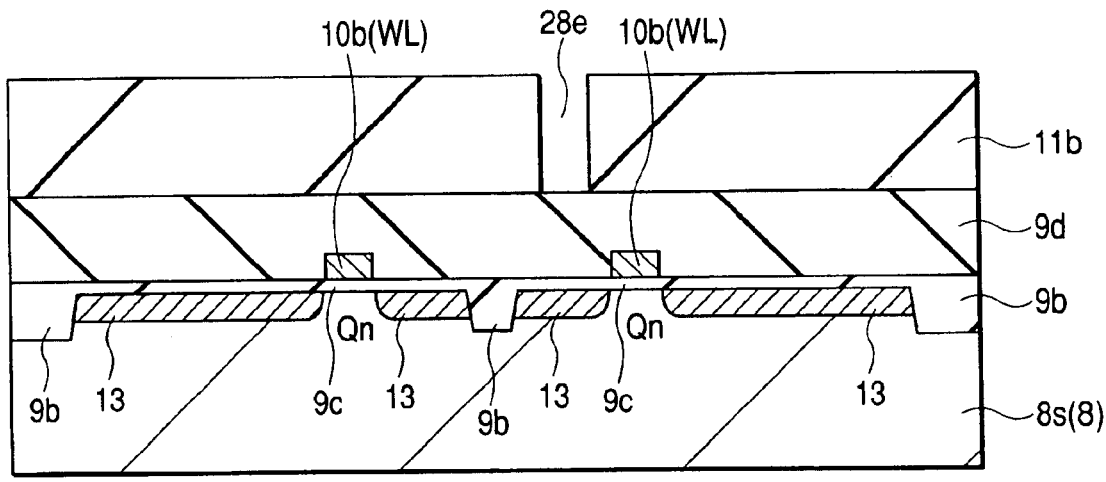
FIGS. 63(a) and 63(b) are respectively fragmentary cross-sectional views of a semiconductor wafer, for describing a method of forming the contact hole shown in FIG. 62.
Figure 63B:
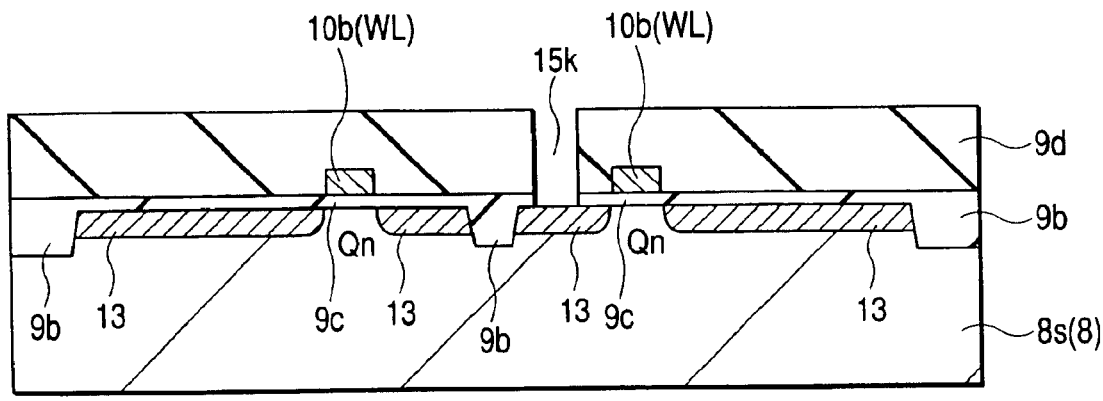

A light-shielding film 3p for the mask PM21 is comprised of the same resist material as the light-shielding patterns 3a employed in the embodiment 1. A part of the light-shielding film 3p is removed to open or define light transmissive patterns 16m each shaped in the form of a plane quadrangle. The light transmissive pattern 16m serves as a pattern for forming an opening or aperture pattern for the formation of the contact hole 15k in a resist film over a wafer 8. A method of defining the contact hole 15k is identical to one described in the embodiment 1 or the like. It will be described in brief as follows. As shown in FIG. 63(a), a positive type resist film 11b is first applied onto an insulating film 9d. Thereafter, patterns are transferred to the resist film 11b through the use of the mask PM21 shown in FIG. 62 and subjected to development processing or the like to thereby form an aperture pattern 28e. Subsequently, an etching process is effected with the resist film 11b as an etching mask to thereby define a contact hole 15k for exposing part of a semiconductor substrate 8s in the insulating film 9d.

Next, FIG. 64 illustrates, as an example, a case in which a mask PM21 shown in FIG. 64(a) is used to form or define two contact holes 15m and 15n shown on a data base (FIG. 64(b)), and semiconductor regions 13 for predetermined nMISQn and data lines 10m are respectively connected as shown in FIGS. 64(c) and 64(d), whereby memory information is written. A light-shielding film 3q for the mask PM21 is comprised of the same resist material as the light-shielding patterns 3a employed in the embodiment 1. A part of the light-shielding film 3q is removed to open or define light transmissive patterns 16q each shaped in the form of a plane quadrangle. The light transmissive patterns 16q serve as patterns for forming opening or aperture patterns used for defining the contact holes 15m and 15n and word line contact holes in a resist film over a wafer 8. Since a method of defining the contact holes 15m and 15n and word line contact holes is identical to one described in FIGS. 63(a) and 63(b), the description thereof will be omitted.

Figure 65A:
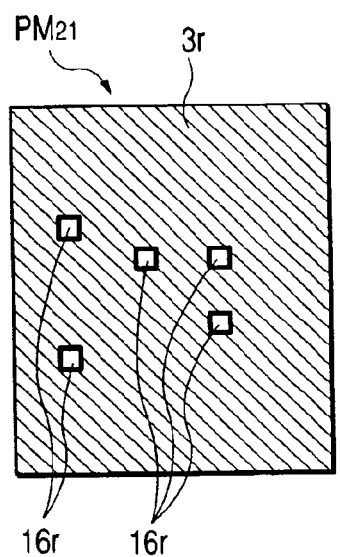
FIG. 65(a) is a fragmentary plan view of a photomask which shows a still further embodiment of the present invention and is used when contact hole patterns for writing data into the mask ROM shown in FIG. 61 are transferred onto a semiconductor wafer.
Figure 65B:
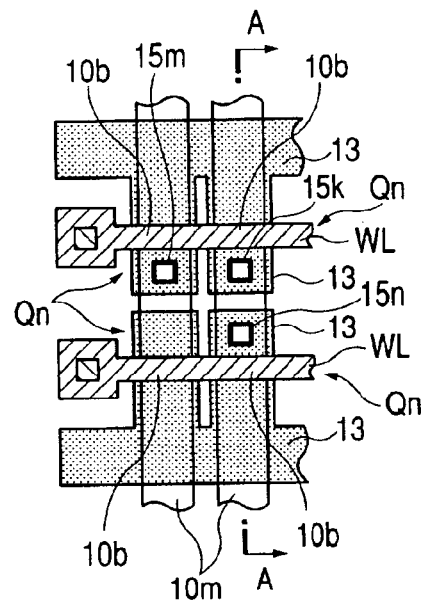
FIG. 65(b) is a fragmentary plan view of the semiconductor wafer, which shows the positions of the patterns transferred by the photomask shown in FIG. 65(a)
Figure 65C:
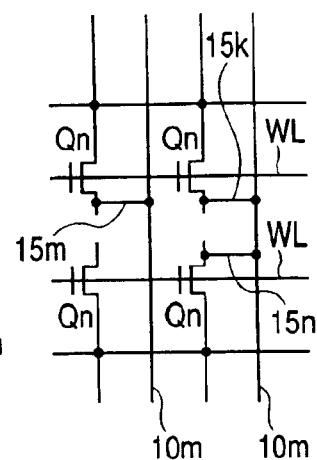
FIG. 65(c) is a circuit diagram of FIG. 65(b)
Figure 65D:
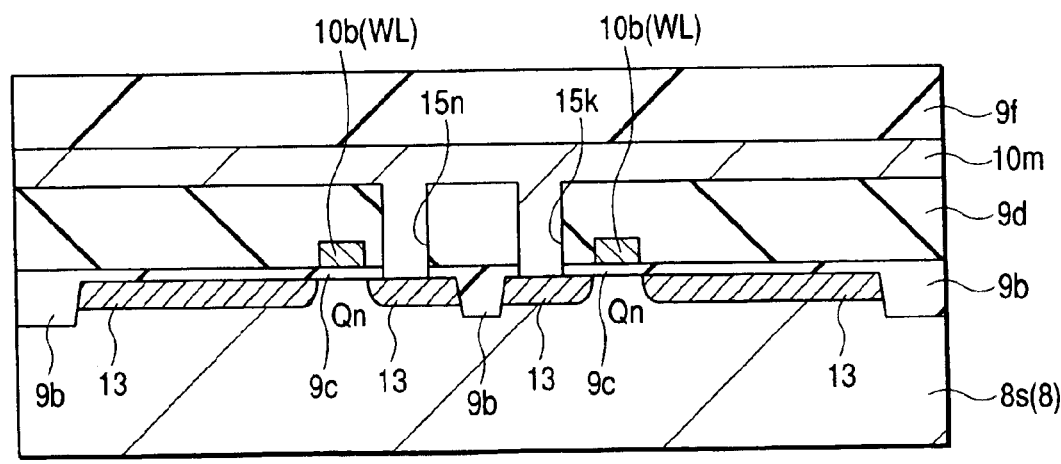
FIG. 65(d) is a cross-sectional view taken along line A—A of FIG. 65(b)

Next, FIG. 65 illustrates, as an example, a case in which a mask PM21 shown in FIG. 65(a) is used to form or define three contact holes 15k, 15m and 15n shown on a data base (FIG. 65(b)), and semiconductor regions 13 for predetermined nMISQn and data lines 10m are respectively connected as shown in FIGS. 65(c) and 65(d), whereby memory information is written. A light-shielding film 3r for the mask PM21 is comprised of the same resist material as the light-shielding patterns 3a employed in the embodiment 1. A part of the light-shielding film 3r is removed to open or define light transmissive patterns 16r each shaped in the form of a plane quadrangle. The light transmissive patterns 16r serve as patterns for forming opening or aperture patterns used for defining the contact holes 15k, 15m and 15n and word line contact holes in a resist film over a wafer 8. Since a method of defining the contact holes 15k, 15m and 15n and word line contact holes is identical to one described in FIGS. 63(a) and 63(b), the description thereof will be omitted.

Changes in patterns over such masks PM21 shown in FIGS. 62, 64 and 65 may be done in a manner similar to ones described in the embodiment 1 and the like. When the patterns over the mask PM21 shown in FIG. 62 are changed to the patterns over the mask PM21 shown in FIG. 64, for example, the light-shielding film 3p over the mask PM21 shown in FIG. 62 is removed. Thereafter, the light-shielding film forming resist film is newly applied onto its corresponding mask substrate, and electron beams or ultraviolet rays are applied to predetermined positions of the resist film, whereby the light-shielding film 3q and light transmissive patterns 16q over the mask PM21 shown in FIG. 64 may be formed. Consequently, many kinds of mask ROMs can be manufactured efficiently in a manner similar to the embodiment 20. It is also possible to greatly reduce TAT of the wide variety of mask ROMs. Since a material cost and a process cost can be lowered, the cost of each mask ROM can greatly be reduced even in the case of small production.

Thus, the present embodiment 21 can also obtain an effect similar to each of the embodiment 1 and the like.
(Embodiment 22)

The present embodiment 22 is a modification of the embodiment 20 and describes a mask ROM different in structure from the embodiment 20.

Figure 66A:
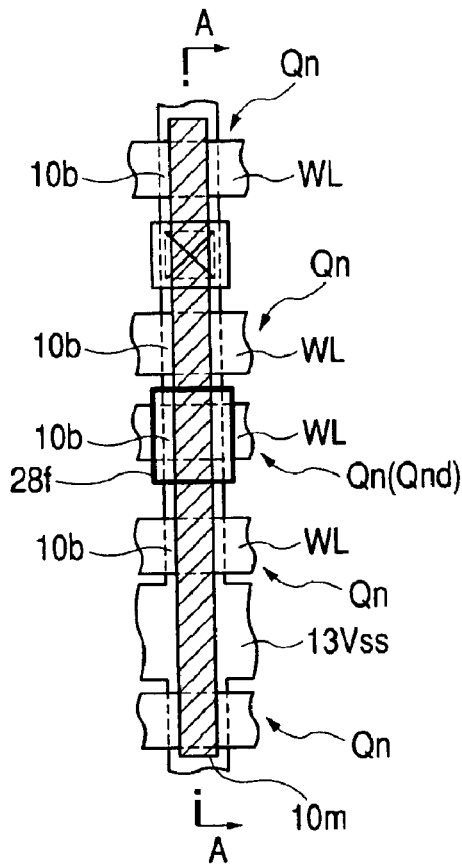
FIG. 66(a) is a fragmentary plan view of a mask ROM showing a still further embodiment of the present invention.
Figure 66B:
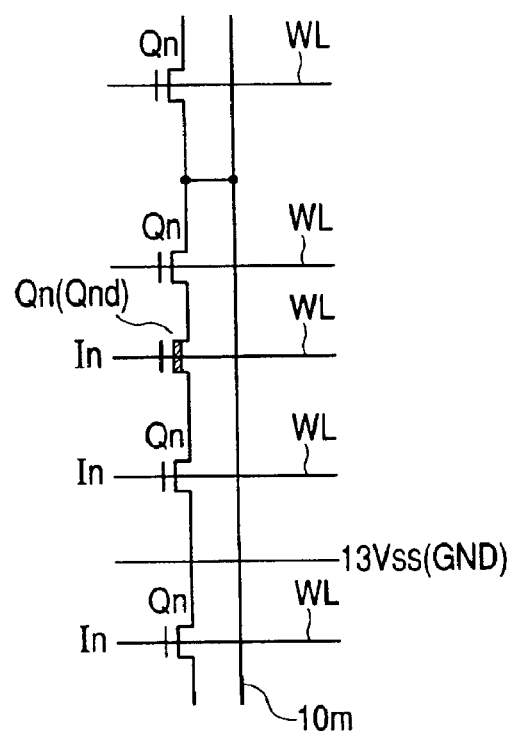
FIG. 66(b) is a circuit diagram of FIG. 66(a)
Figure 66C:
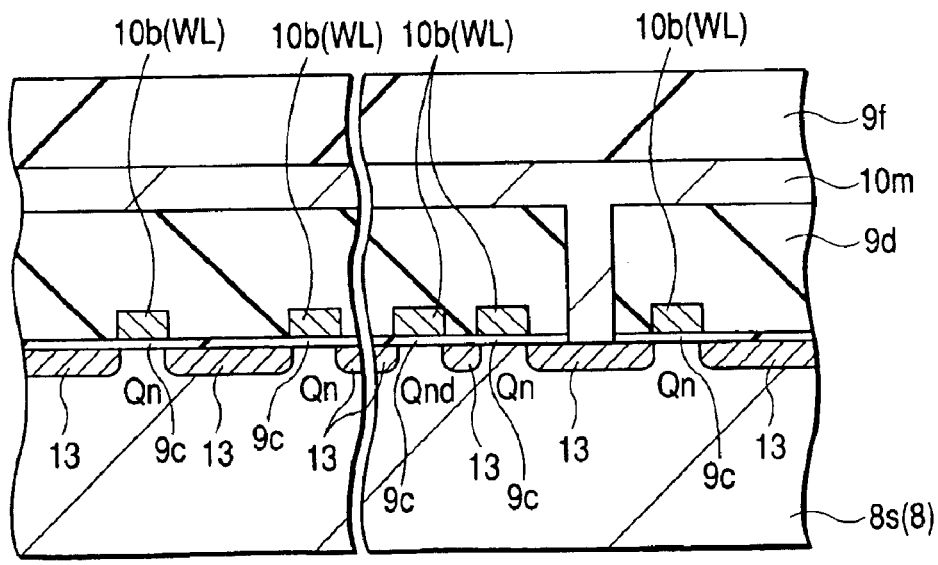
FIG. 66(c) is a cross-sectional view taken along line A—A of FIG. 66(a)

FIG. 66 shows part of a NAND type mask ROM according to the present embodiment 22. A plurality of nMISQn that constitute memory cells, are connected in parallel with semiconductor regions 13 interposed therebeween. An ion-implantation system is adopted as a program system. Namely, nMISQn (memory cell) corresponding to an ion-implanted portion is configured as a depletion type, and nMISQn (memory cell) corresponding to a portion free of ion-implantation is configured as an enhancement type. These are respectively associated with "0" and "1".

FIG. 66 illustrates, as an example, a case in which an impurity is introduced into a channel region for nMISQnd to provide it as a depletion type. An opening or aperture pattern 28f indicative of a pattern for memory's information writing indicates an opening pattern of an ion-implantation mask at the time that a program (impurity ion-implantation) is effected on the nMISQnd. Incidentally, a semiconductor region 13VSS also has a function used as a power or source wiring on the low potential (e.g., 0V=GND) side.

Since a method of changing patterns over the mask according to the present embodiment 22 and a method of selectively introducing an impurity into a wafer for a program are identical to the embodiment 20, the description thereof will be omitted.

The present embodiment 22 can also obtain an effect similar to the embodiment 21.
(Embodiment 23)

In the present embodiment, a description will be made of a case in which the characteristics of a semiconductor integrated circuit device are adjusted using the mask with the resist film as each light-shielding pattern.

Figure 67:
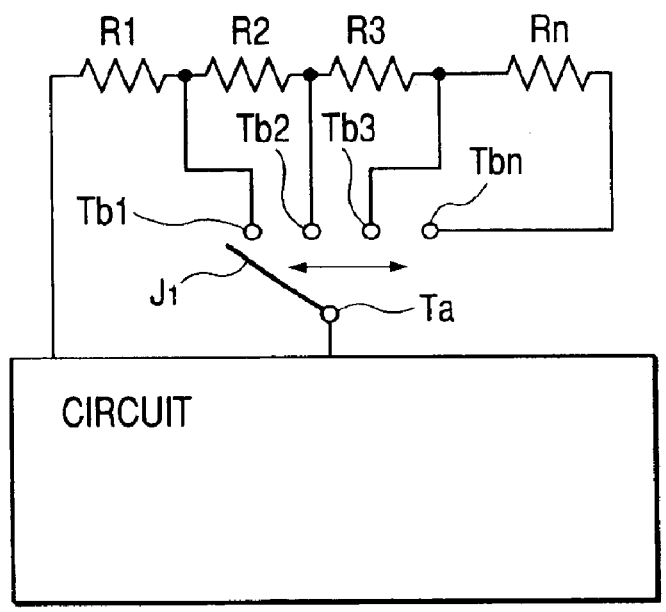
FIG. 67 is a view for describing characteristic adjustments to a semiconductor integrated circuit device showing a still further embodiment of the present invention.
Figure 68:
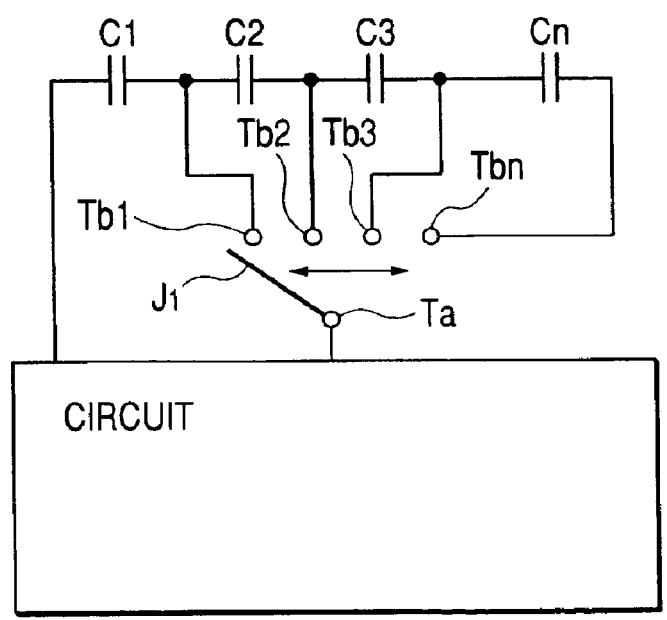
FIG. 68 is a view for describing characteristic adjustments to a semiconductor integrated circuit device showing a still further embodiment of the present invention.

FIG. 67 and FIG. 68 respectively illustrate circuits which are placed within a semiconductor integrated circuit device formed over a wafer and perform their characteristic adjustments.

FIG. 67 is a circuit diagram for describing characteristic adjustments made by a plurality of resistors R1 through Rn connected in series. The states of connections between a terminal Ta connected to a circuit (e.g., CPU or the like of semiconductor integrated circuit device) and terminals Tb1 through Tbn respectively connected to the resistors R1 through Rn are switched by a connecting portion J1 to thereby change the resistance value of the whole circuit.

FIG. 68 is a circuit diagram for describing characteristic adjustments by a plurality of capacitors C1 through Cn connected in series. The states of connections between a terminal Ta connected to a circuit and terminals Tb1 through Tbn respectively connected to the capacitors C1 through Cn are switched by a connecting portion J1 to thereby change the capacitance value of the whole circuit.

Upon development or the like of the semiconductor integrated circuit device, there may be cases in which the values of the resistors and capacitors are changed in various ways to thereby perform characteristic adjustments to the semiconductor integrated circuit device, like signal timing adjustments, etc., for example. When the normal mask is used upon transfer of such patterns, the mask must be re-manufactured every adjustments even though a change portion (connecting portion J1) per se is small, as is understood from the circuit diagrams of FIGS. 67 and 68. Thus, since it takes time to manufacture the mask, the period required to develop the semiconductor integrated circuit device becomes long. Since waste grows and material and process costs increase, the cost of the semiconductor integrated circuit device also increases.

Figure 69A:
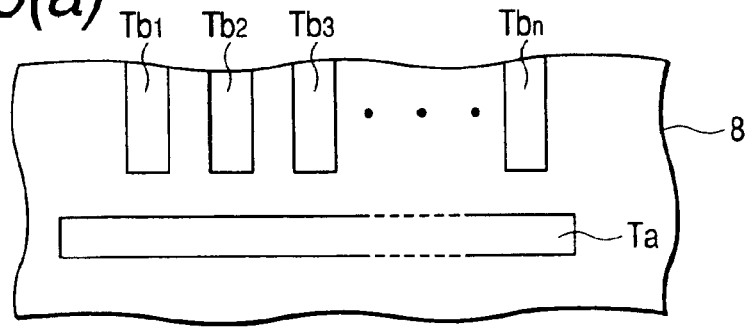
FIG. 69(a) is an explanatory view typically illustrating patterns for terminals in FIG. 67 or 68 over a semiconductor wafer.
Figure 69B:
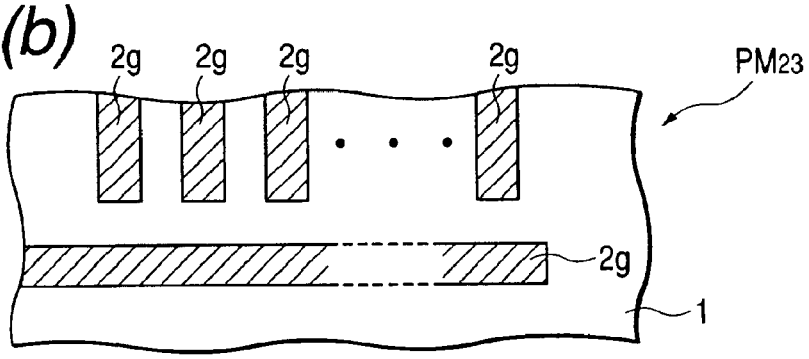
FIG. 69(b) is a fragmentary plan view of a photomask used for transfer of the patterns shown in FIG. 69(a)
Figure 70A:
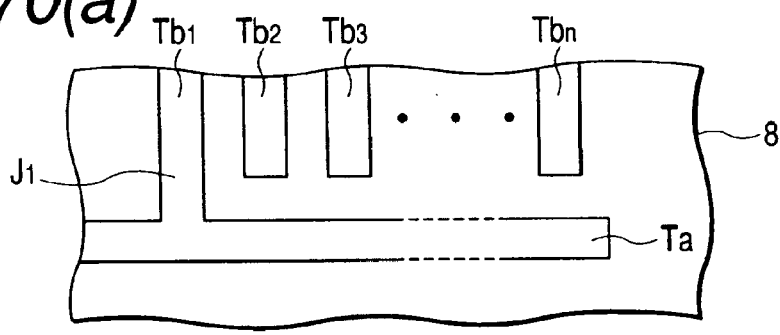
FIG. 70(a) is a view for describing the patterns for the terminals in FIG. 67 or 68 over the semiconductor wafer.
Figure 70B:
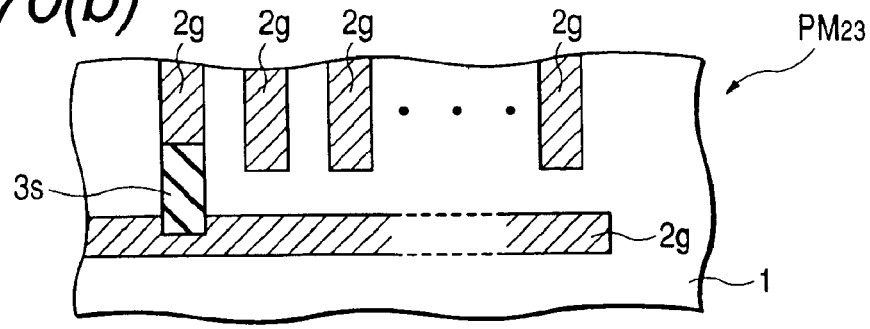
FIG. 70(b) is a fragmentary plan view of the photomask used for transfer of the patterns shown in FIG. 70(a)

Thus, in the present embodiment, a portion for transferring the connecting portion J1 is formed over a mask with a resist film as each light-shielding pattern. FIG. 69(a) is a plan view typically showing the terminals Ta and Tb1 through Tbn formed over a wafer. In the present drawing, the terminal Ta is not connected to any of the terminals Tb1 through Tbn. FIG. 69(b) shows light-shielding patterns 2g over a mask PM23 for transferring the terminals Ta and Tb1 through Tbn shown in FIG. 69(a). The light-shielding patterns 2g is comprised of the same metal as the light-shielding patterns 2a described in the embodiment 1 or the like. This will be defined as a data base. When it is now desired to connect terminals Ta and Tb1 as shown in FIG. 70(a) by way of example, a light-shielding pattern 3s formed of a resist film may be formed over a main surface (corresponding to a surface over which light-shielding patterns 2g formed of a metal are formed) of a mask substrate 1 of a mask PM23 at a position corresponding to a connecting portion J1 of the terminals Ta and Tb1 as shown in FIG. 70(b). A resist material for the light-shielding pattern 3s, a method of forming it and a method of changing it are identical to those described in the embodiment 1. It is therefore possible to perform a change in connection between the terminal Ta and each of the terminals Tb1 through Tbn with ease, in a short time and at low cost. Accordingly, the time required to develop the semiconductor integrated circuit device can greatly be shortened. Further, the cost of the semiconductor integrated circuit device can be reduced.

The present embodiment 23 referred to above can also obtain an effect similar to the embodiment 1 or the like.
(Embodiment 24)

In the present embodiment, a description will be made of the technology of making a logic circuit of a semiconductor integrated circuit device redundant by use of the mask with the resist film as each light-shielding pattern.

Figure 71:
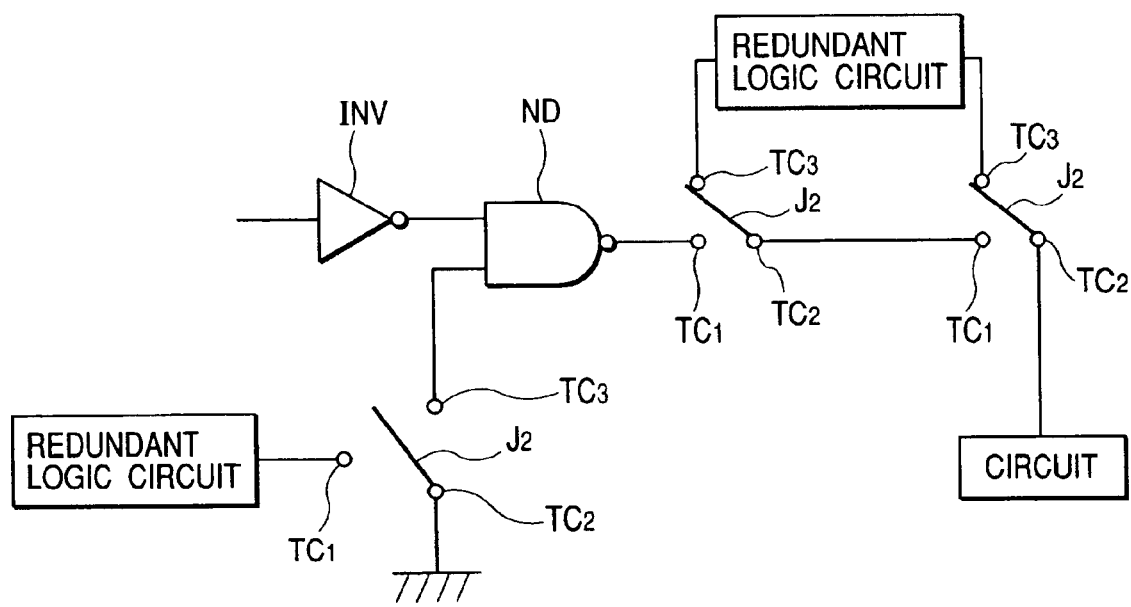
FIG. 71 is a view for describing a redundant configuration of a semiconductor integrated circuit device showing a still further embodiment of the present invention.

FIG. 71 illustrates a redundant circuit formed over a wafer as an example. The redundant circuit is intended to change the states of connections between terminals Tc1 to Tc3 according to how to connect connecting portions J2 to thereby perform redundancy. Incidentally, INV indicate inverter circuits respectively.

When a normal mask is used upon transfer of patterns even in the case of such a redundant circuit configuration, the mask must be re-fabricated for redundancy even though a change portion (connecting portion J2) per se is small. Therefore, the period required to develop and manufacture the semiconductor integrated circuit device becomes long because it takes time to manufacture the mask. Since waste grows and material and process costs increase, the cost of the semiconductor integrated circuit device also increases.

Figure 72A:
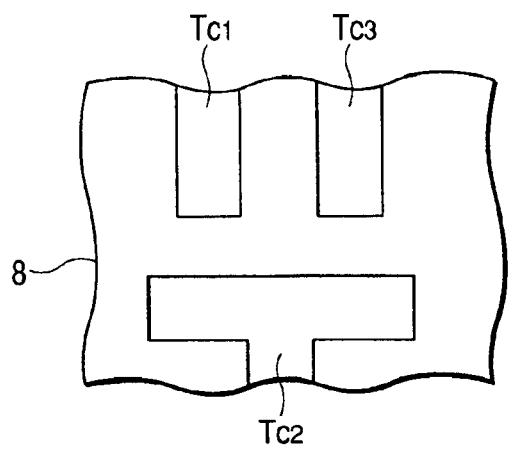
FIG. 72(a) is an explanatory view typically illustrating patterns for terminals in FIG. 71 over a semiconductor wafer.
Figure 72B:
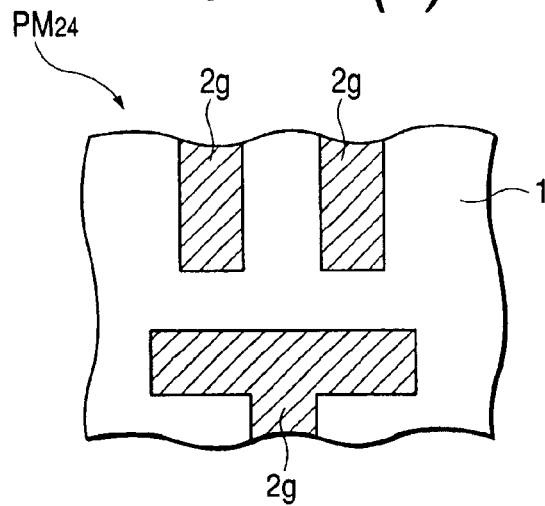
FIG. 72(b) is a fragmentary plan view of a photomask used for transfer of the patterns shown in FIG. 72(a)
Figure 73A:
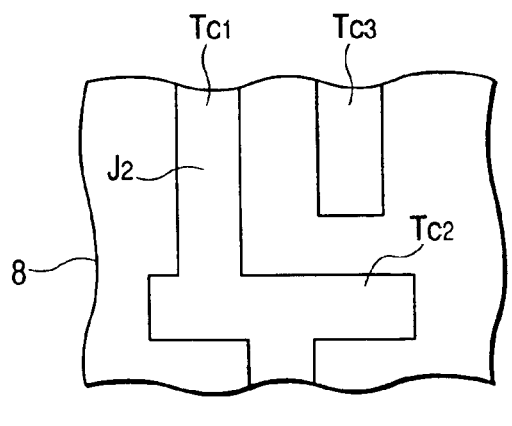
FIG. 73(a) is a view for describing the patterns for the terminals in FIG. 71 over the semiconductor wafer.
Figure 73B:
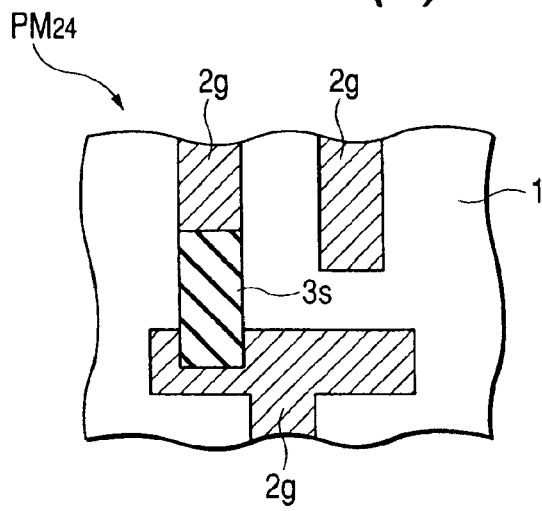
FIG. 73(b) is a fragmentary plan view of the photomask used for transfer of the patterns shown in FIG. 73(a)

Thus, in the present embodiment, a portion for transferring each of the connecting portion J2 is formed over a mask with a resist film as each light-shielding pattern. FIG. 72(a) is a plan view typically showing the terminals Tc1 through Tc3 formed over a wafer. In the present drawing, the terminal Tc2 is not connected to both of the terminals Tc1 and Tc3. FIG. 72(b) shows light-shielding patterns 2g formed of a metal over a mask PM24 for transferring the terminals Tc1 through Tc3 shown in FIG. 72(a). This will be defined as a data base. When it is now desired to connect terminals Tc1 and Tc2 as shown in FIG. 73(a) by way of example, a light-shielding pattern 3s formed of a resist film may be formed over a main surface (corresponding to a surface over which light-shielding patterns 2g formed of a metal are formed) of a mask substrate 1 of a mask PM24 at a position corresponding to a connecting portion J2 of the terminals Tc1 and Tc2 as shown in FIG. 73(b). A resist material for the light-shielding pattern 3s, a method of forming it and a method of changing it are identical to those described in the embodiment 1. It is therefore possible to perform a change in connection between the terminal Tc1 through Tc3 with ease, in a short time and at low cost. Accordingly, the time required to develop and manufacture the semiconductor integrated circuit device can greatly be shortened. Further, the cost of the semiconductor integrated circuit device can be reduced.

The present embodiment 23 referred to above can also obtain an effect similar to the embodiment 1 or the like.
(Embodiment 25)

In the present embodiment, a process for manufacturing the mask described in the above-described embodiment and a series of flows in a process for manufacturing a semiconductor integrated circuit device using the mask will be explained by way of example.

A normal mask manufacturing process can be divided into a process for manufacturing a substrate (mask blanks) in which a light-shielding film such as chromium or the like or the semitransparent film (halftone film) is formed over the whole main surface of a mask substrate, and a mask manufacturing process for forming patterns for the formation of a semiconductor integrated circuit in the mask blanks. Both referred to above are used upon manufacture at different departments on occasion.

The mask manufacturing process according to the present embodiment is divided into a process for manufacturing mask blanks, a process for forming common device patterns used for forming common light-shielding patterns and integrated circuit patterns for forming patterns commonly used between various projection exposure systems on the outer periphery of a mask substrate, and a resist pattern forming process. The respective processes might be used upon manufacture at another department and another company.

Figure 74A:
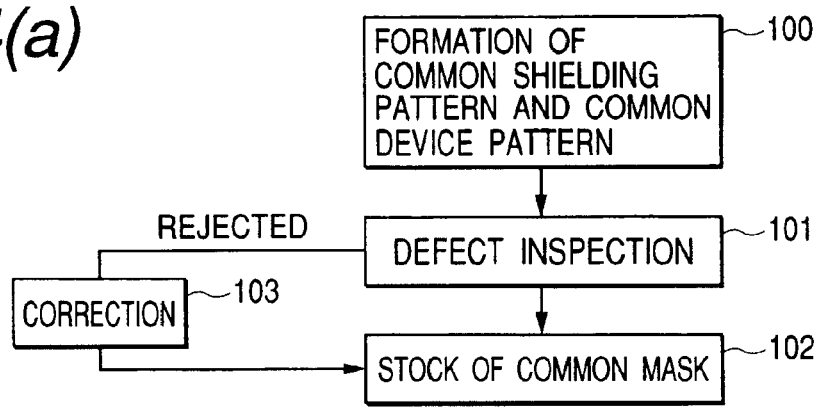
FIGS. 74(a) through 74(c) are respectively explanatory views showing one example of a series of flows for a photomask, which are employed in a manufacturing process of a semiconductor integrated circuit device showing a still further embodiment of the present invention.

For instance, FIG. 74(a) shows a process for forming the common light-shielding patterns and common device patterns. The common patterns can be prepared in various ways every manufactured semiconductor integrated circuit devices or according to projection exposure systems used upon exposure processing. First of all, common light-shielding patterns (corresponding to the light-shielding patterns 2a and 2b in the mask PM1 or the like in FIG. 1) are formed (Step 100). Subsequently, the presence or absence of a defect is inspected (Step 101). If the defect is found not to exist here, then the common light-shielding patterns and the common device patterns are stocked as common masks completed in the formed stage thereof (Step 102). On the other hand, if the defect is found to exist, then corrections or the like are effected on them (Step 103), and they are stocked after their corrections (Step 102).

Thus, since each mask substrate can be stocked during the mask manufacturing process in the mask manufacture according to the present embodiment, the time required to manufacture and develop the semiconductor integrated circuit device can greatly be shortened. Since the mask substrates cannot be stocked in a process in the course of their manufacture in the case of a normal mask, the deposition (mask blanks manufacturing process) of a light-shielding film or the like to the patterning of predetermined patterns must be carried out consistently. In the present embodiment on the other hand, the masks manufactured up to the process for manufacturing the common light-shielding patterns and common device patterns can be stocked. Therefore, since the manufacture of masks can be started from their stocked stage when specific integrated circuit patterns (device patterns) are formed, upon development and manufacture of the semiconductor integrated circuit device, the time required to manufacture each mask can be shortened. Therefore, the process of forming the integrated circuit patterns can be completed in a short time. Accordingly, the technical idea of the present invention is particularly suitable for use in the manufacture of masks for logic devices high in the frequency of kind or type development, for example, as described above. Since the metal film in the region RE is removed in the case of the mask in the stage of FIG. 74(a), no problem arises even if defects such as pinholes or the like occur in the region. It is therefore possible to relax the control of quality of the mask blanks and greatly improve the yield thereof.

Figure 74B:
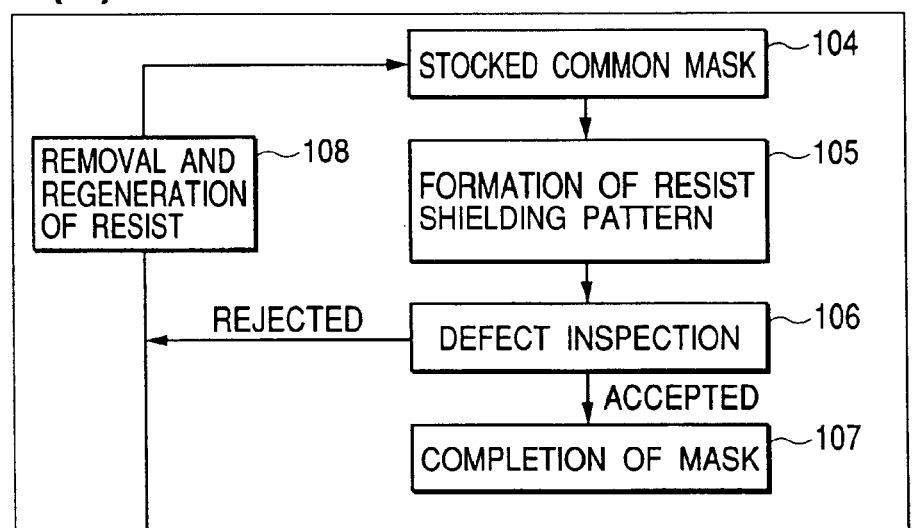

Next, FIG. 74(b) shows a process for forming light-shielding patterns each formed of a resist film over the common mask. The light-shielding patterns (corresponding to the light-shielding patterns 3a over the mask PM1 of FIG. 1 or the like) formed of the resist film for device manufacture are first formed in the integrated circuit pattern region for the common mask as described above (Step 104). Subsequently, inspections such as a defect inspection, a size inspection, etc. are effected on the mask substrate (Step 105). If it has passed the inspections, then a mask is brought into completion (Step 106). However, the light-shielding patterns formed of the resist film over each rejected photomask below the standard are removed as a result of the inspections (Step 107) and the photomask is reused (Step 108). Thus, the common mask can be reused in the present embodiment. Namely, when the light-shielding patterns for the device manufacture are formed of a metal film, the removal and reuse thereof are difficult from the viewpoint that the quality of the mask is ensured, for example. On the other hand, the removal of the resist film and the reuse thereof as in the present embodiment do not take time and are easily allowed without deterioration in the quality of the mask. It is thus possible to make effective use of resources.

Figure 74C:
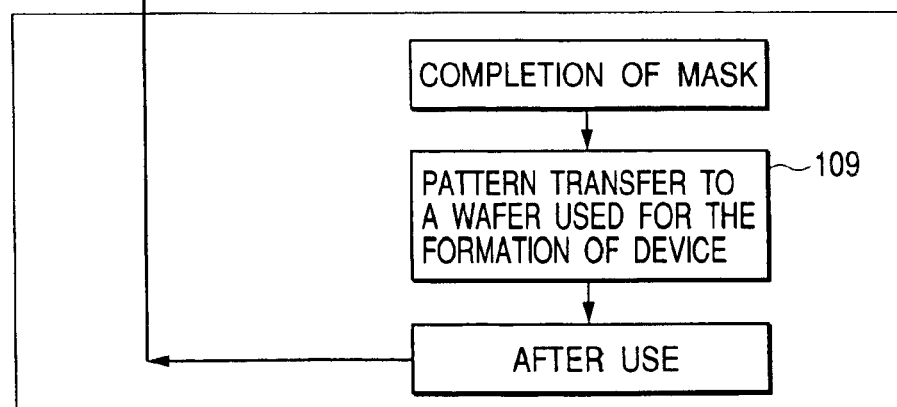

Next, FIG. 74(c) shows a process for using the completed mask in the manufacturing process of the semiconductor integrated circuit device and transferring patterns onto a wafer. In the present process, integrated circuit patterns are transferred onto the wafer by using the completed mask (Step 109). When the mask is deteriorated and unavailable and any changes are developed in part of the semiconductor integrated circuit device, for example, the mask is delivered to the resist removal/recycle step (Step 108), where it is reused as a common mask.

According to the present embodiment in this way, the mask can be reused from the manufacture thereof to the manufacturing process of the semiconductor integrated circuit device. It is thus possible to shorten the period required to develop and manufacture the semiconductor integrated circuit device. Since needless materials and process steps can be lessened, the cost of the semiconductor integrated circuit device can greatly be reduced.

(Embodiment 26)

In the present embodiment, a description will be made of an application in the process for manufacturing the semiconductor integrated circuit device using the mask.

A description will be made of the case where trimming is carried out for each lot. Namely, average characteristic variation information on the characteristics of semiconductor integrated circuit devices in many lots during mass production are fed back to a wiring layer forming step of a semiconductor integrated circuit device in a subsequent lot to correct wirings, whereby characteristic adjustments to each semiconductor integrated circuit device are made. The wiring correction is carried out by a mask having light-shielding patterns each formed of a resist film.

Figure 75:
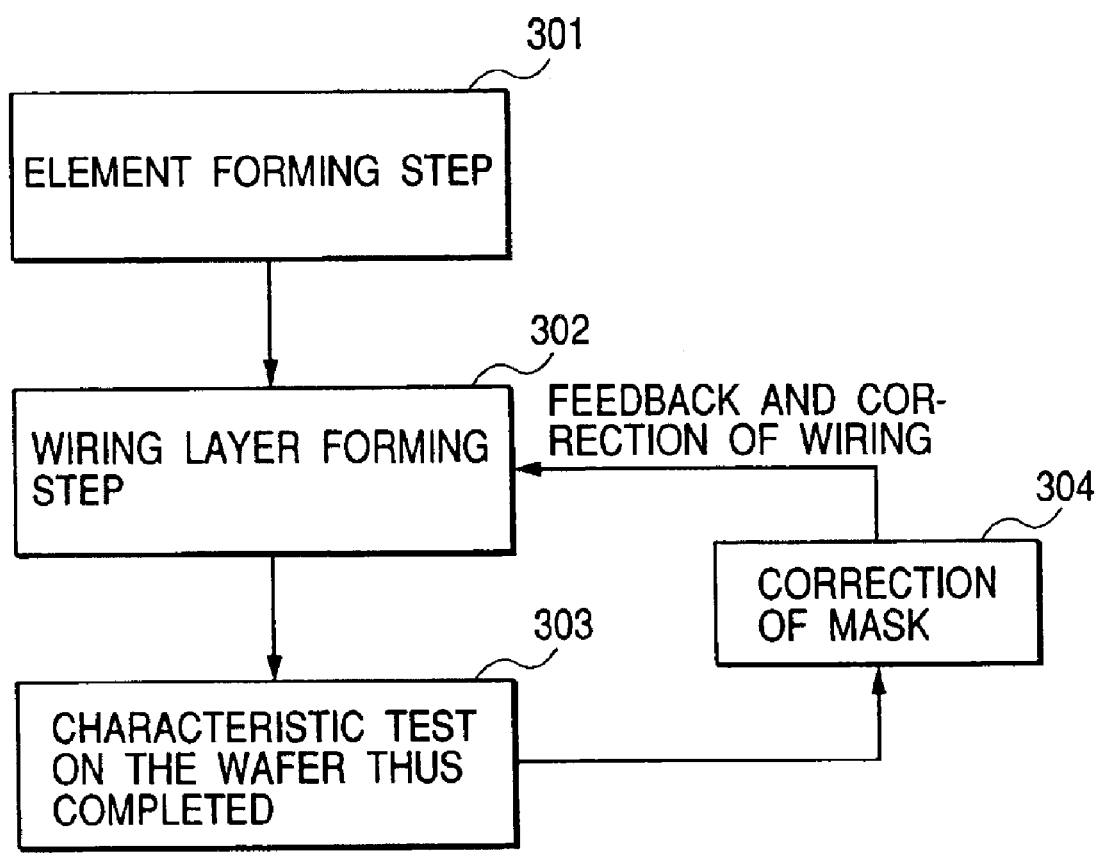
FIG. 75 is a view for describing a manufacturing process of a semiconductor integrated circuit device showing a still further embodiment of the present invention.

FIG. 75 illustrates a flow thereof as an example. In an element forming step 301, predetermined integrated circuit elements or devices are formed over a wafer. In a subsequent wiring layer forming step (Step 302), wirings are formed over the wafer to thereby form an integrated circuit. Here, all the wiring layers for the semiconductor integrated circuit device are formed. After the manufacture of the semiconductor integrated circuit device has been completed, electric characteristics of each individual semiconductor integrated circuit devices over the wafer are tested (Step 303). Average characteristic variation information on the characteristics of the semiconductor integrated circuit devices, which have been obtained at this time, are fed back to the process of forming wiring layers for a semiconductor integrated circuit device, which follows the tested lot. The size and shape or the like of each wiring forming pattern over the mask are changed (Step 304). As the mask, the mask with the resist film described in the embodiment as each light-shielding pattern is used. Further, each wiring layer for a semiconductor integrated circuit device in a subsequent lot is formed using the mask. Thus, the trimming of the semiconductor integrated circuit device for each lot is carried out.

In doing so, semiconductor integrated circuit devices uniform in electric characteristics and having high reliability can be provided in a short period of time. Since needless materials and process steps can be saved upon a change in pattern over a mask for trimming, a semiconductor integrated circuit device high in reliability can be provided or offered at low cost.

(Embodiment 27)

The present embodiment describes a modification of the embodiment 26. In the present embodiment, the characteristics of a semiconductor integrated circuit device are tested in a process placed in the course of a wiring layer forming step. Information obtained thereat is fed forward to the subsequent wiring layer forming step, whereby adjustments to the characteristics thereof are made.

Figure 76:
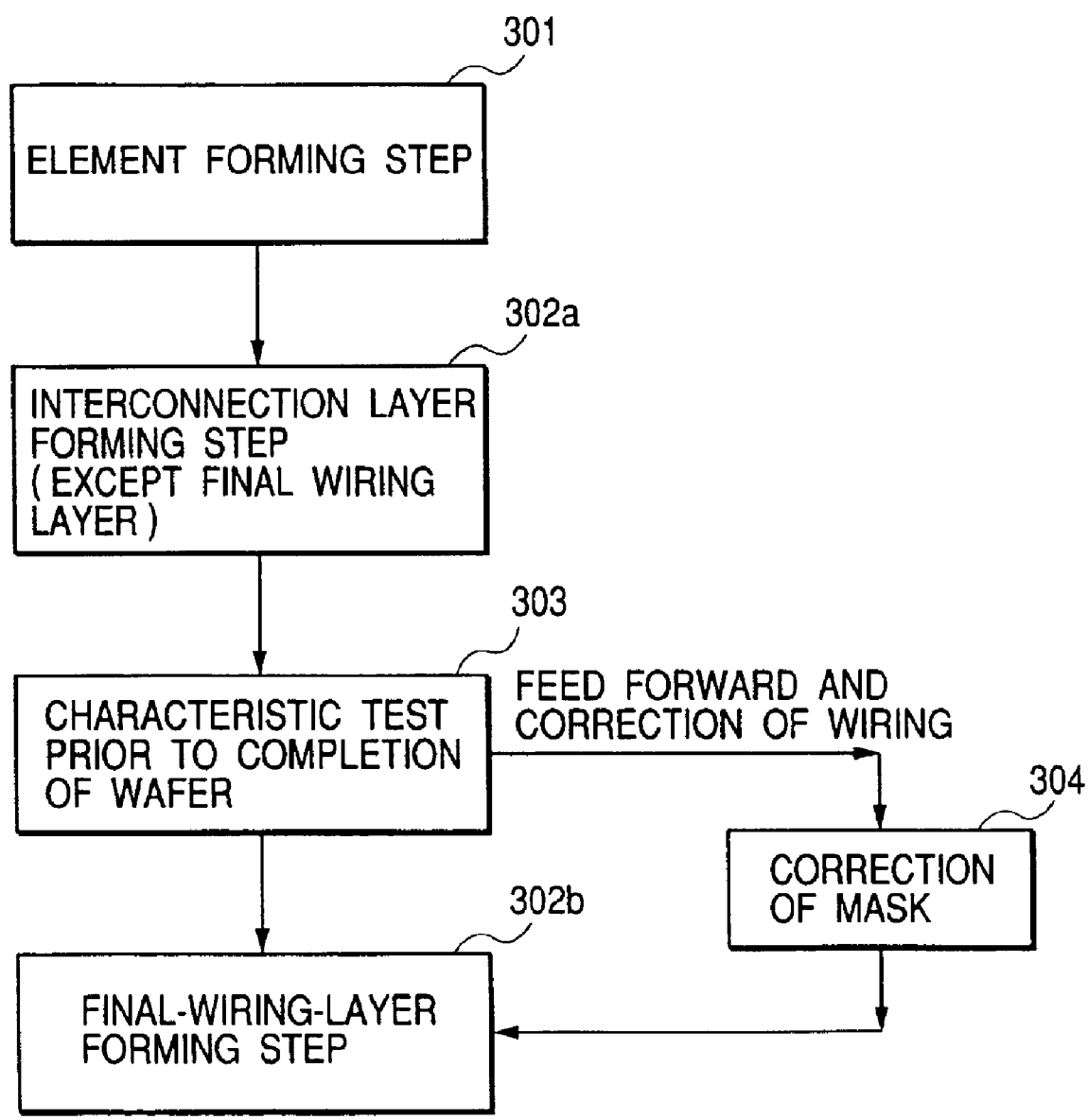
FIG. 76 is a view for describing a manufacturing process of a semiconductor integrated circuit device showing a still further embodiment of the present invention.

FIG. 76 illustrates a flow thereof as an example. A routine procedure first goes through a wiring layer forming step (Step 302*a*) after an element forming step (Step 301). In the illustrated example, an electric characteristic test is effected on a semiconductor integrated circuit device before the final wiring layer forming step is reached (in a stage in which a process for forming each wiring layer subsequently still exists) (Step 303). The size and shape or the like of each wiring forming pattern over a mask employed in the subsequent final wiring layer forming step (Step 302*b*) are changed based on characteristic information on the semiconductor integrated circuit device, which has been obtained at this time (Step 304). The final wiring layer is, for example, a layer for forming bonding pads serving as external terminals of a semiconductor chip, or the immediately preceding wiring layer. As its mask, the mask with the resist film described in the embodiment as each light-shielding pattern is used. A pattern for the final wiring layer over the wafer is formed by using the mask. Trimming the semiconductor integrated circuit device in this way makes it possible to obtain an effect similar to the embodiment 26.

The technical idea of the invention employed in the present embodiment is intended to test the characteristics of the semiconductor integrated circuit device in the wiring layer forming step, transmit the characteristic information measured thereat to the subsequent wiring layer forming step and perform trimming using the mask, based on the characteristic information. No limitation is imposed on the transmission of the information to the final wiring layer forming step. For example, the characteristic information may be transmitted to a wiring layer forming step other than the subsequent final wiring layer step or may be transmitted to a plurality of wiring layer forming steps. While there is known one having a structure wherein rewiring is carried out after the formation of bonding pads in a so-called wafer process package technology wherein a sealing step is carried out in a wafer stage, for example, the above-described characteristic information may be transmitted to its rewiring layer forming step so as to perform trimming using the mask in the rewiring layer forming step.

(Embodiment 28)

In the present embodiment 28, a description will be made of the case where customer information is formed over a wafer by light-shielding patterns each formed of a resist film over a mask.

It is desirable that in a process for manufacturing a semiconductor integrated circuit device, information like, for example, a customer's name, a number, a lot number, the date of manufacture, type, grade or version, etc. is written into a wafer or part of a semiconductor chip as practicable. In doing so, the electric characteristic of each manufactured product, the condition of a change in pattern, etc. can be recognized, and the characteristic test, selection, etc. of each semiconductor integrated circuit device are apt to be executed. Since, however, time and cost are taken for the manufacture of a normal mask in the case of the normal mask, up to detailed information cannot be written so much. Thus, in the present embodiment, customer's information was transferred by the mask using the light-shielding patterns each formed of the resist film. Consequently, the detailed customer's information can be transferred onto the wafer in a short period of time and at low cost.

FIG. 77 shows a flow of a process for manufacturing a semiconductor integrated circuit device. In a wiring layer forming step 302, customer information is transferred by a mask using light-shielding patterns each formed of a resist film. Upon wafer completion (Step 303), the customer information is optically read and managed. Thereafter, a final test is carried out via an assembly step 304 (Step 305). By automatically referring to the customer information at this time, a test program matched with the semiconductor integrated circuit device is automatically recognized to carry out a circuit's operation test. Thus, a more accurate test can be carried out.

Figure 78A:
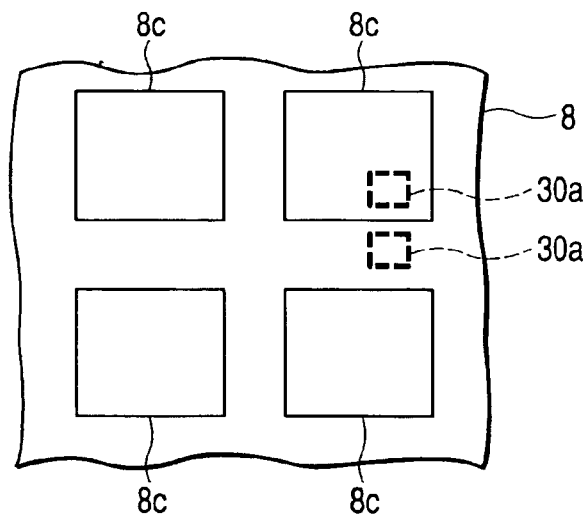
FIG. 78(a) is a fragmentary plan view of a semiconductor wafer placed during a manufacturing process of a semiconductor integrated circuit device showing a still further embodiment of the present invention.
Figure 78B:
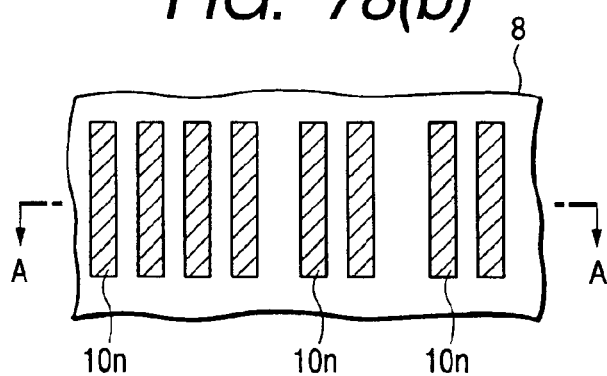
FIGS. 78(b) and 78(c) are respectively fragmentary plan views of the semiconductor wafer, each of which shows an described example of information transferred onto the semiconductor wafer.
Figure 78C:
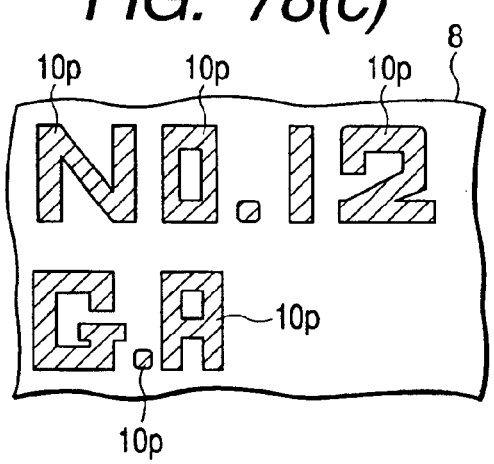
Figure 78D:
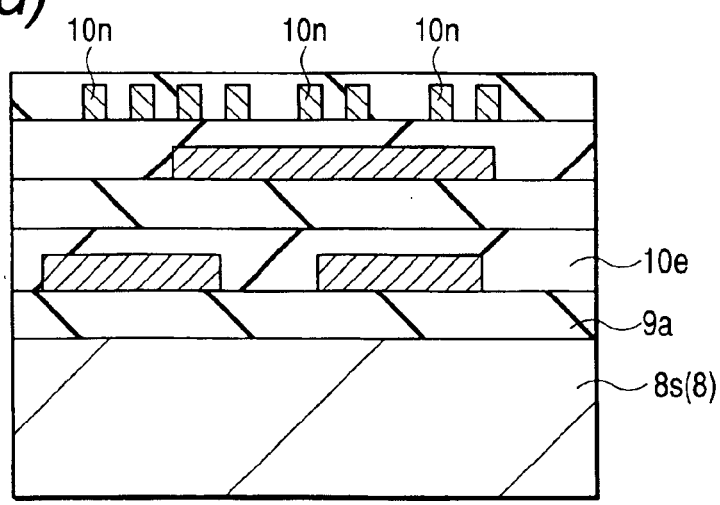
FIG. 78(d) is a cross-sectional view taken along line A—A of FIG. 78(b)

FIG. 78(a) is a fragmentary plan view of a wafer 8. Customer information is formed within each of semiconductor chips 8c (regions 30a) or a cutoff region (region 30b) placed between the respective adjacent semiconductor chips 8c. FIGS. 78(b) and 78(c) respectively illustrate customer information patterns formed in the region 30a or 30b. FIG. 78(d) illustrates a cross-section taken along line A—A of FIG. 78(b). FIG. 78(b) shows a case in which a plurality of conductor film patterns 10n are placed side by side in parallel to form bar codes. FIG. 78(c) shows a case in which characters and numerals or the like are formed of conductor film patterns 10p. The conductor film patterns 10n and 10p are formed simultaneously with wiring patterns.

Figure 79A:
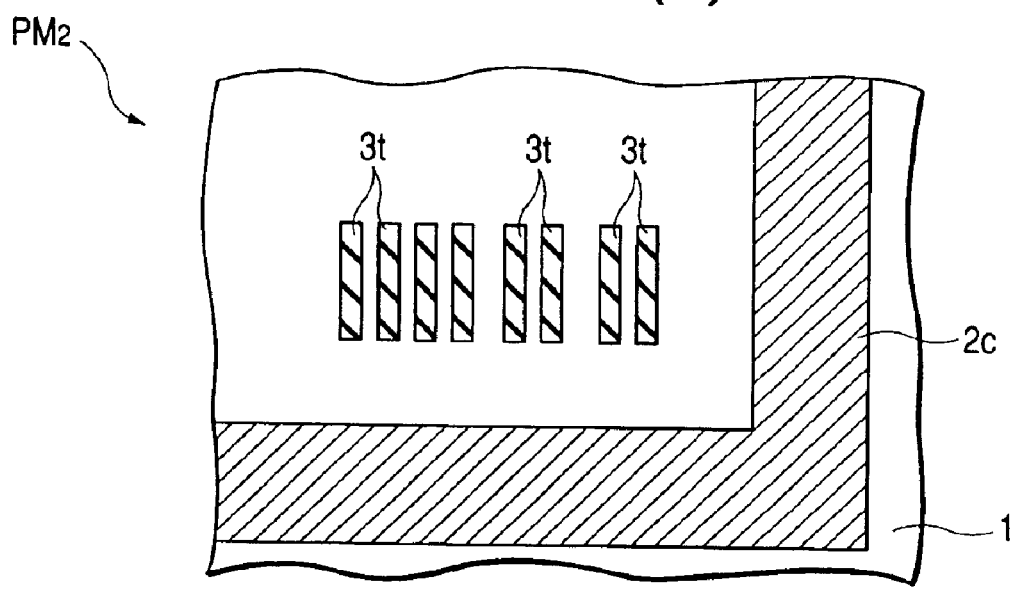
FIGS. 79(a) and 79(b) are respectively fragmentary plan views of a photomask showing a still further embodiment of the present invention and used upon transfer of the information in FIG. 78(b).
Figure 79B:
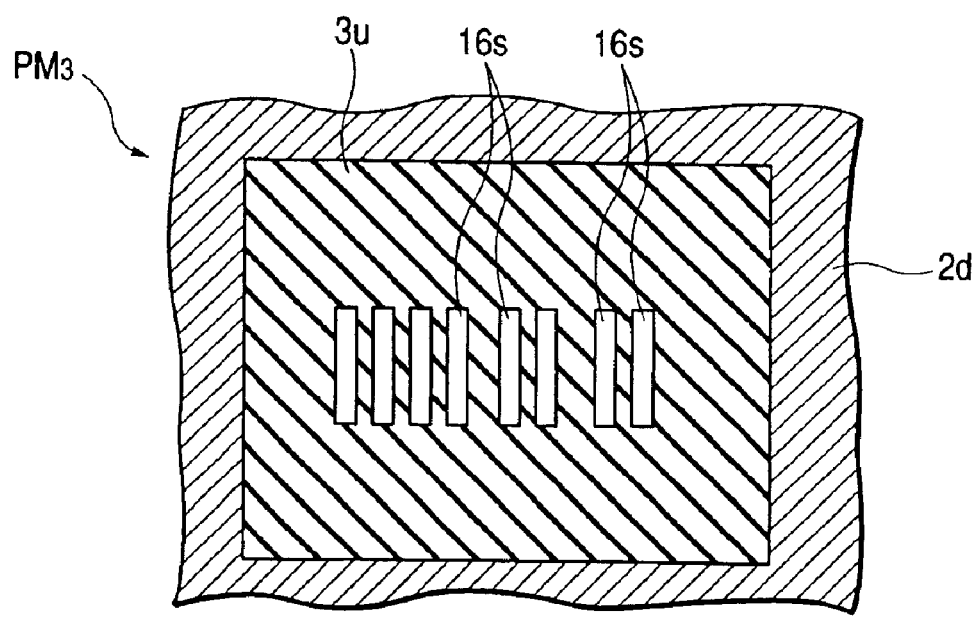

FIG. 79 shows one example of a mask used to form the conductor film patterns 10n shown in FIG. 78(b). FIG. 79(a) illustrates, as an example, a case in which customer information forming light-shielding patterns 3t are formed of a resist film at part of the mask PM2 according to the embodiment 2. The light-shielding patterns 3t are formed of the same material upon the same forming step as the light-shielding patterns 3a. FIG. 79(b) illustrates, as an example, a case in which light transmissive patterns 16s for the formation of customer information are formed in part of the mask PM3 according to the embodiment 3. Some of a light-shielding film 3u are removed to thereby form the light transmissive patterns 16s. The light-shielding film 3u is formed of the same material upon the same forming step as the light-shielding film 3b. The light transmissive patterns 16s formed of the light-shielding film 3u are formed simultaneously with the formation of light-shielding patterns 16b in a light-shielding film 3b.

Patterns for a simple circuit are formed by light-shielding patterns each formed of a resist, and a binary signal represented by "0" and "1" may be read from predetermined bonding pads (or post-packaging lead pins) of a semiconductor chip. Thus, upon the process of testing each semiconductor integrated circuit device subsequent to its assembly process, the customer information can electrically be read from the corresponding integrated circuit device. Therefore, a test program matched with the semiconductor integrated circuit device can automatically be recognized to carry out a circuit's operation test. As to the configuration of the circuit, "1" or "0" is assigned to its corresponding bonding pad (or lead) according to whether the bonding pad (or lead) and its corresponding power or source terminal (high potential or low potential (0V)) lying within a semiconductor chip should be connected, or it should be connected to either of high and low power or source terminals. Their connecting patterns are formed by the light-shielding patterns each formed of the resist film as described in the embodiments 23 and 24. It is thus possible to simply write or rewrite information over the mask. Of course, a simple circuit is configured within a semiconductor chip by light-shielding patterns formed of a resist film and the binary signal for the customer information may be outputted to its corresponding lead through the use of such a circuit.

While the invention made above by the present inventors has been described specifically by the embodiments, the present invention is not limited to the embodiments. It is needless to say that various changes can be made thereto within the scope not departing from the substance thereof.

While, for example, the above-described embodiment has described the case where the wirings are formed as the normal wiring structure, the present invention is not limited to it. The wirings may be formed by a so-called damascene method or dual damascene method for embedding a conductor film into trenches for wirings or holes formed in an insulating film, for example, to thereby form wirings.

While the above-described embodiment has described the case in which the semiconductor substrate comprised of the semiconductor single body is used as the semiconductor integrated circuit substrate or board, the present invention is not limited to it. As the semiconductor integrated circuit board, an SOI (Silicon On Insulator) substrate wherein, for example, a thin semiconductor layer is provided over an insulating layer, or an epitaxial substrate is provided over a semiconductor substrate, may be used.

When the mark patterns are formed of the resist film in the above-described embodiment, an absorbent material for absorbing mark detection light (e.g., probe light (corresponding to light having a wavelength longer than an exposure wavelength, e.g., a wavelength of 500 nm: information detection light)) may be added to the resist film.

While the above description has principally been made of the case in which the invention made by the present inventors is applied to the manufacture of the semiconductor integrated circuit device which belongs to the field of application corresponding to the background of the invention, the present invention is not limited to it. The present invention can be applied even to a method of manufacturing other electronic devices (electron circuit devices) or the like, like, for example, a liquid crystal substrate, a magnetic head, etc.

Advantageous effects obtained by typical ones of the inventions disclosed in the present application will be described in brief as follows:

(1) According to one embodiment of the present invention, light-shielding patterns each formed of a resist film for the transfer of each integrated circuit pattern are formed over part of a mask substrate, thereby making it possible to shorten the time required to change or correct each pattern over a mask.

(2) According to another embodiment of the present invention, a light-shielding portion formed of a metal is provided over a peripheral portion of a main surface of a mask substrate, and opening or aperture portions are defined in the light-shielding portion to form information detecting patterns, thereby making it possible to enhance information detection capability in a mask for causing a resist film to function as the light-shielding portion.

(3) According to a further embodiment of the present invention, a light-shielding portion formed of a metal is provided over a peripheral portion of a main surface of a mask substrate, thereby making it possible to restrain or prevent the occurrence of foreign materials upon exposure processing using a mask for causing a resist film to function as a light-shielding film.

What is claimed is:

1. A photomask comprising:
light-shielding patterns formed of a metal for integrated circuit pattern transfer; and
light-shielding patterns formed of a resist film for the integrated circuit pattern transfer,
both said light-shielding patterns formed of a metal and said light-shielding patterns formed of a resist film being provided over a mask substrate, and wherein an antistatic film is provided over the mask substrate.

* * * * *